(12) United States Patent
Chen et al.

(10) Patent No.: US 12,464,812 B2
(45) Date of Patent: Nov. 4, 2025

(54) SEMICONDUCTOR DEVICE STRUCTURE INCLUDING FORKSHEET TRANSISTORS AND METHODS OF FORMING THE SAME

(71) Applicant: TAIWAN SEMICONDUCTOR MANUFACTURING COMPANY, LTD., Hsinchu (TW)

(72) Inventors: Guan-Lin Chen, Hsinchu (TW); Kuo-Cheng Chiang, Hsinchu (TW); Shi Ning Ju, Hsinchu (TW); Jung-Chien Cheng, New Taipei (TW); Chih-Hao Wang, New Taipei (TW); Kuan-Lun Cheng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 893 days.

(21) Appl. No.: 17/225,859

(22) Filed: Apr. 8, 2021

(65) Prior Publication Data

US 2022/0328477 A1    Oct. 13, 2022

(51) Int. Cl.
*H10D 30/67*     (2025.01)
*H10B 10/00*     (2023.01)
(Continued)

(52) U.S. Cl.
CPC ........... *H10D 84/85* (2025.01); *H10B 10/125* (2023.02); *H10D 30/031* (2025.01);
(Continued)

(58) Field of Classification Search
CPC ............ B82Y 10/00; H01L 21/823456; H01L 21/823481; H01L 27/088; H01L 27/092; H01L 29/0665; H01L 29/165; H01L 29/401; H01L 29/42392; H01L 29/66439; H01L 29/66545; H01L 29/66742; H01L 29/775; H01L 29/7848; H01L 29/78696;
(Continued)

(56) References Cited

U.S. PATENT DOCUMENTS 9,209,247 B2    12/2015  Colinge et al.
9,236,267 B2    1/2016   De et al.
(Continued)

FOREIGN PATENT DOCUMENTS

CN    111092122 A  *  5/2020 ............. B82Y 10/00

*Primary Examiner* — Meiya Li
(74) *Attorney, Agent, or Firm* — NZ Carr Law Office

(57) ABSTRACT

A structure includes a first dielectric feature extending along a first direction, the first dielectric feature having a first side and a second side opposing the first side. The structure includes a first semiconductor layer disposed adjacent the first side of the first dielectric feature, the first semiconductor layer extending along a second direction perpendicular to the first direction. The structure includes a CESL in contact with the first dielectric feature and a portion of the first semiconductor layer, an ILD layer in contact with the CESL and a portion of the first semiconductor layer. The structure further includes a second dielectric feature extending along the first direction, the second dielectric feature including a first dielectric layer in contact with the CESL and a portion of the first semiconductor layer, and a second dielectric layer in contact with the first dielectric layer and a portion of the first semiconductor layer.

20 Claims, 63 Drawing Sheets

(51) Int. Cl.
*H10D 30/01* (2025.01)
*H10D 62/10* (2025.01)
*H10D 64/01* (2025.01)
*H10D 84/85* (2025.01)

(52) U.S. Cl.
CPC ..... *H10D 30/6735* (2025.01); *H10D 30/6757* (2025.01); *H10D 62/118* (2025.01); *H10D 64/01* (2025.01); *H10D 64/017* (2025.01)

(58) Field of Classification Search
CPC ............... H10B 10/125; H10D 30/031; H10D 30/6735; H10D 30/6757; H10D 62/118; H10D 64/01; H10D 64/017; H10D 84/85; H10D 30/014; H10D 30/43; H10D 30/797; H10D 62/822; H10D 84/0142; H10D 84/0151; H10D 84/038; H10D 84/83

See application file for complete search history.

(56) References Cited

U.S. PATENT DOCUMENTS

| | | |
|---|---|---|
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |

\* cited by examiner

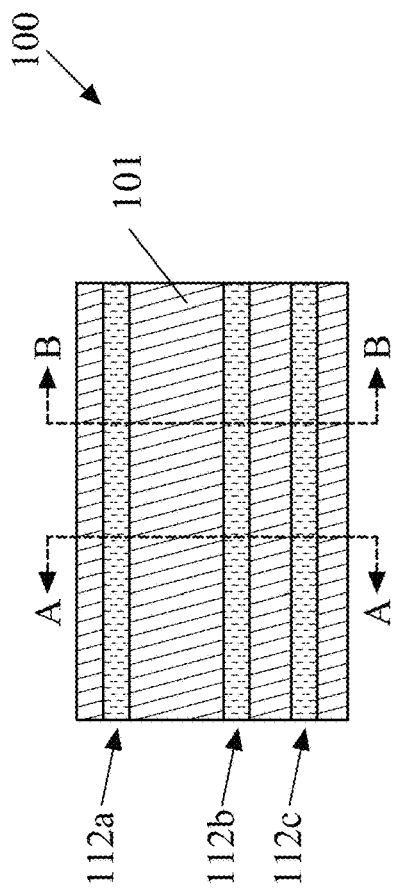
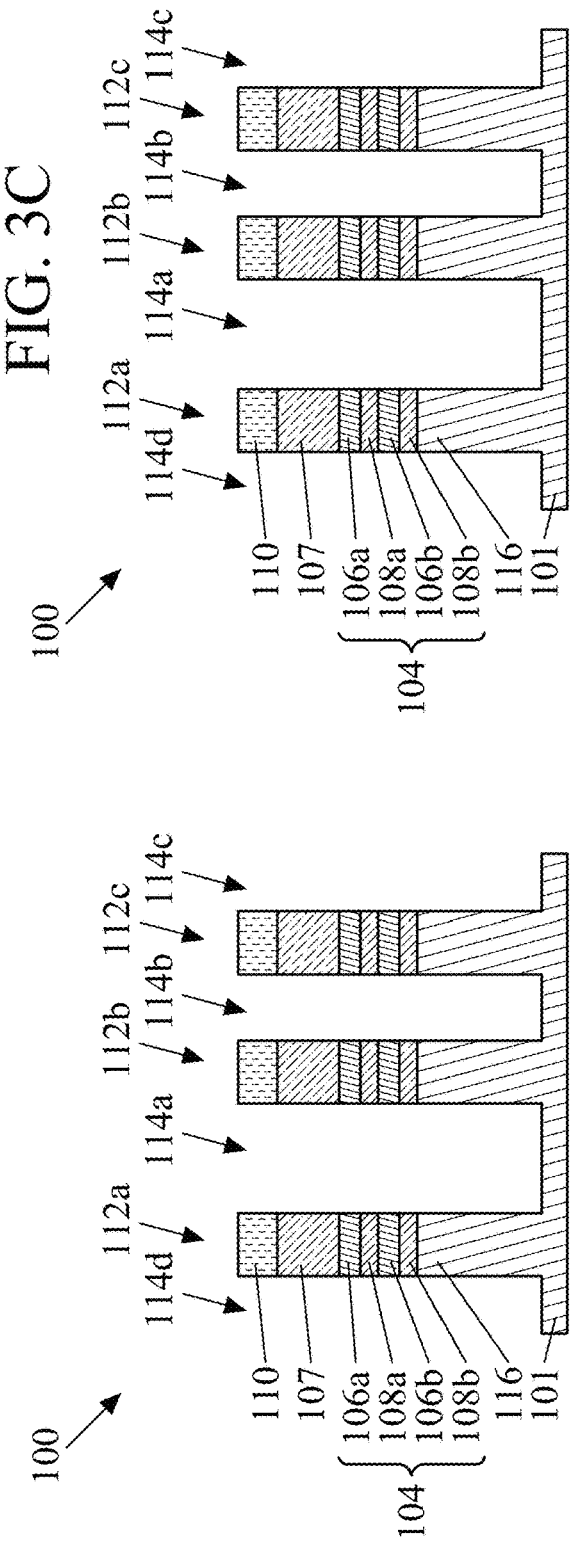
FIG. 3A
FIG. 3B
FIG. 3C

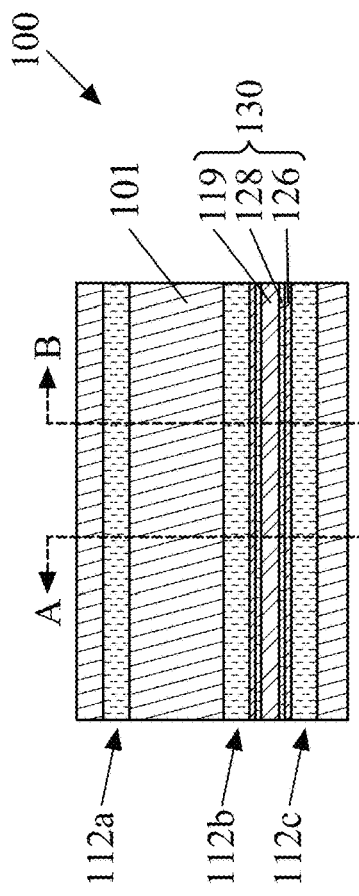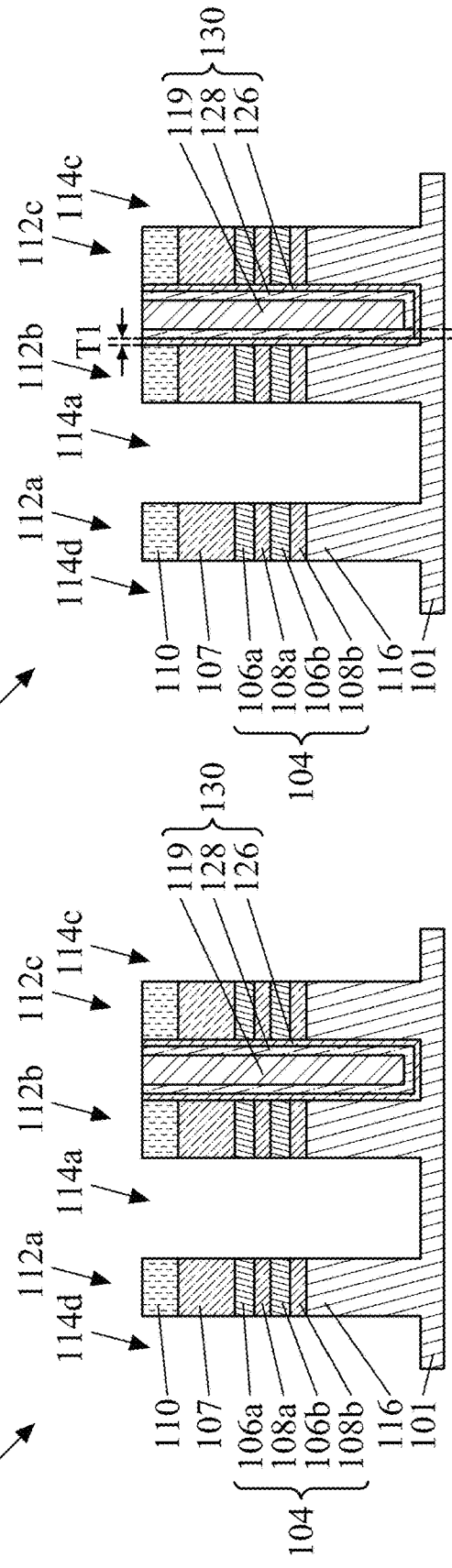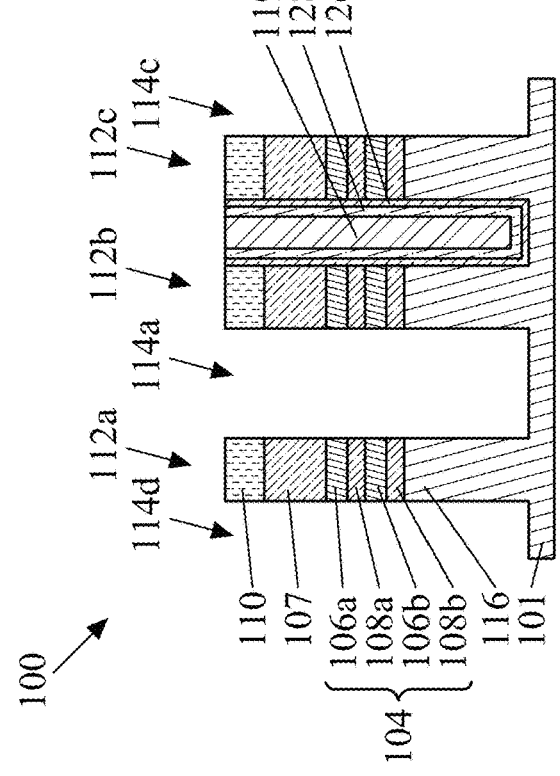

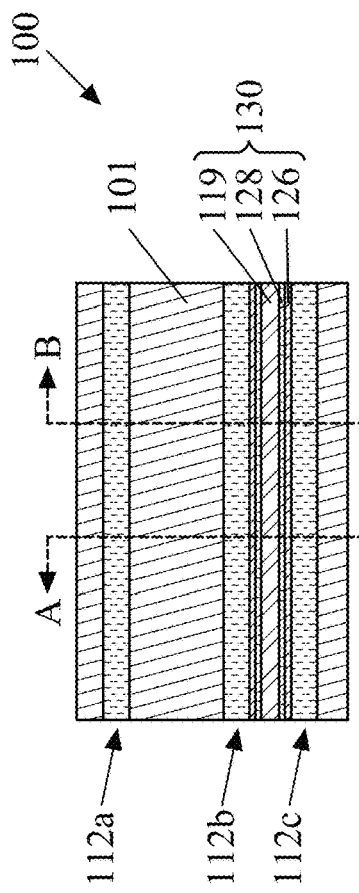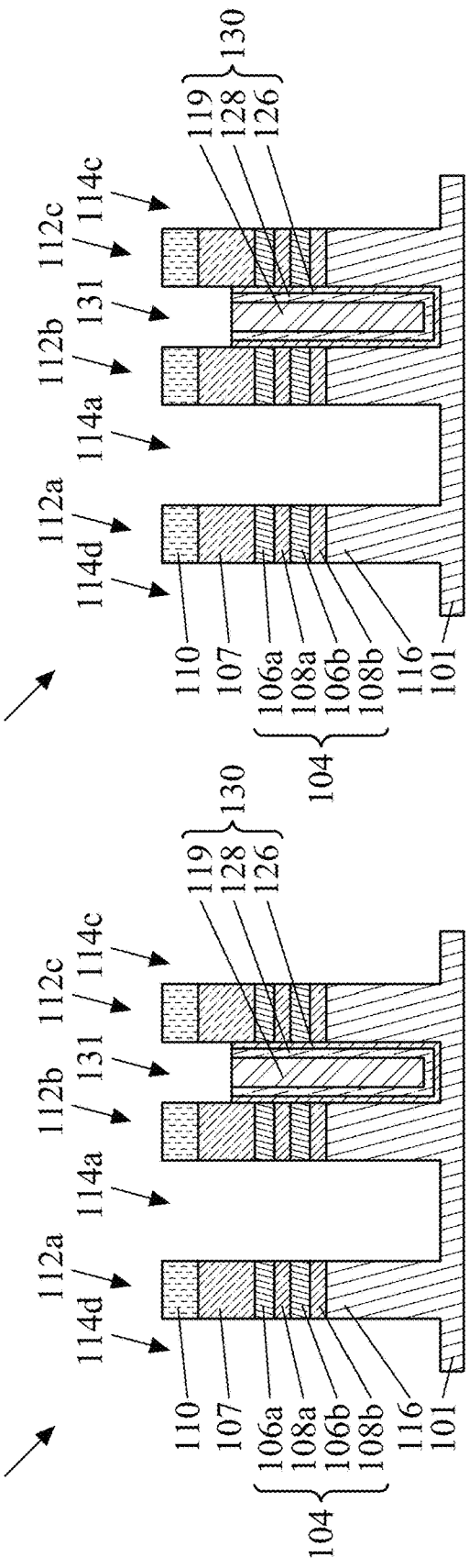

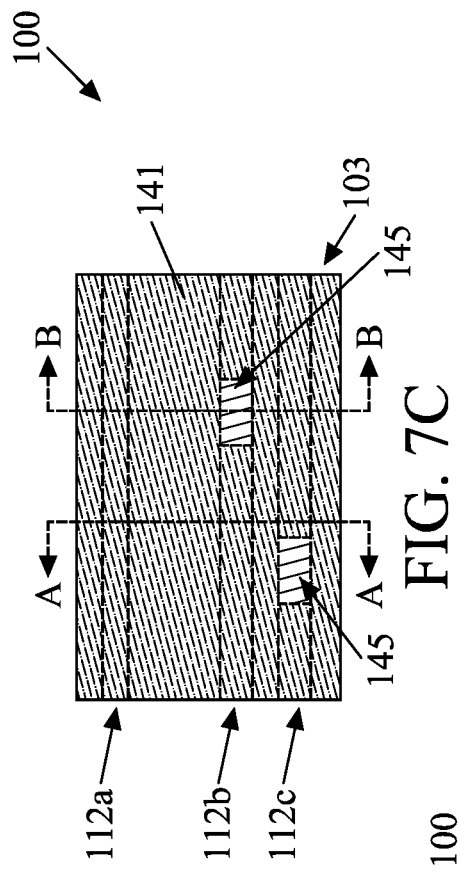
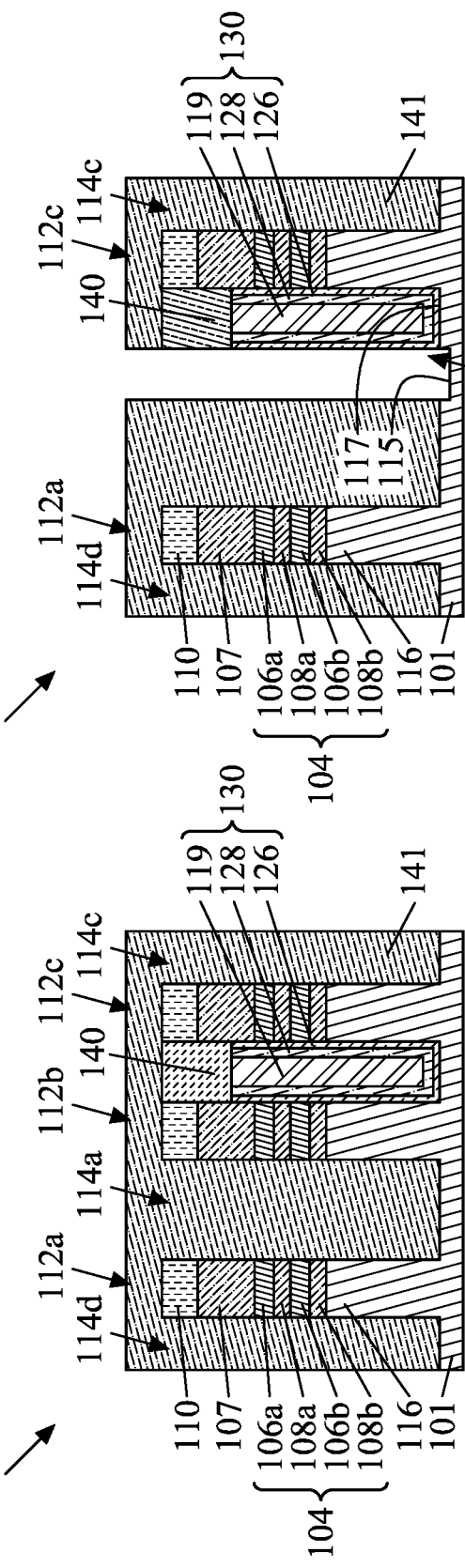
FIG. 7A
FIG. 7B
FIG. 7C

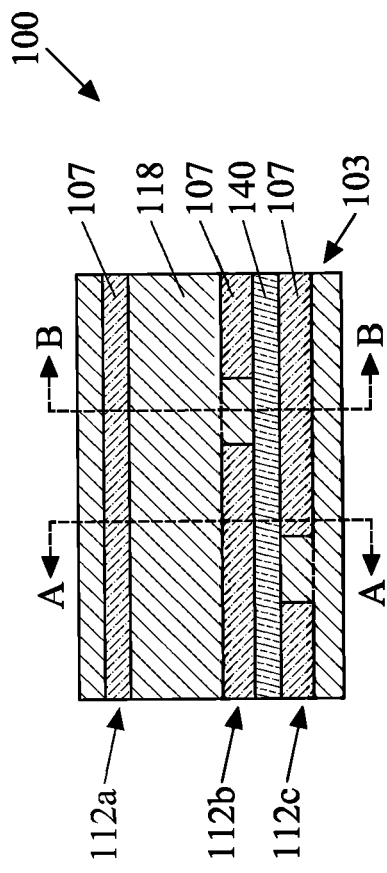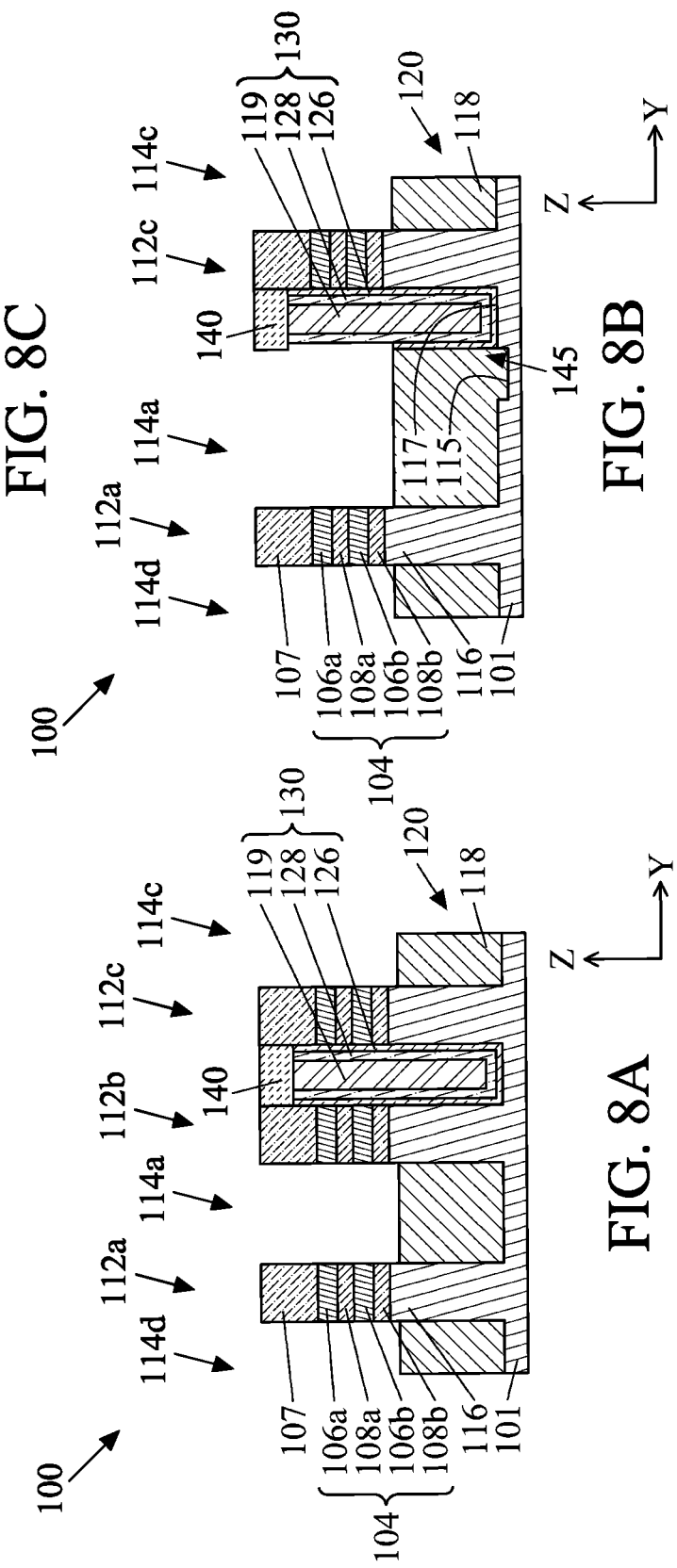
FIG. 8C
FIG. 8B
FIG. 8A

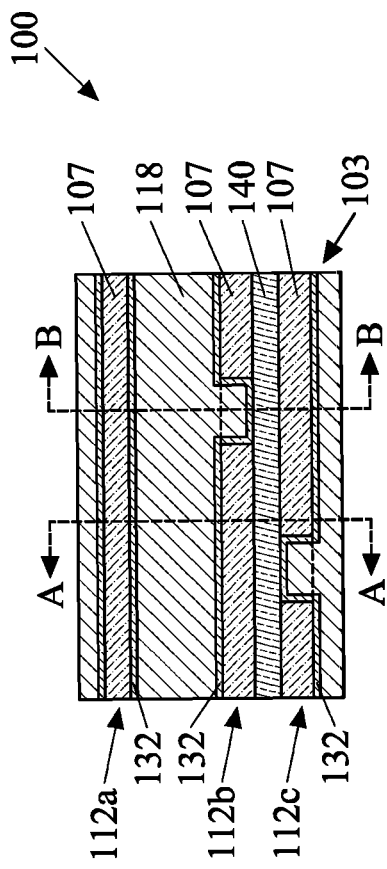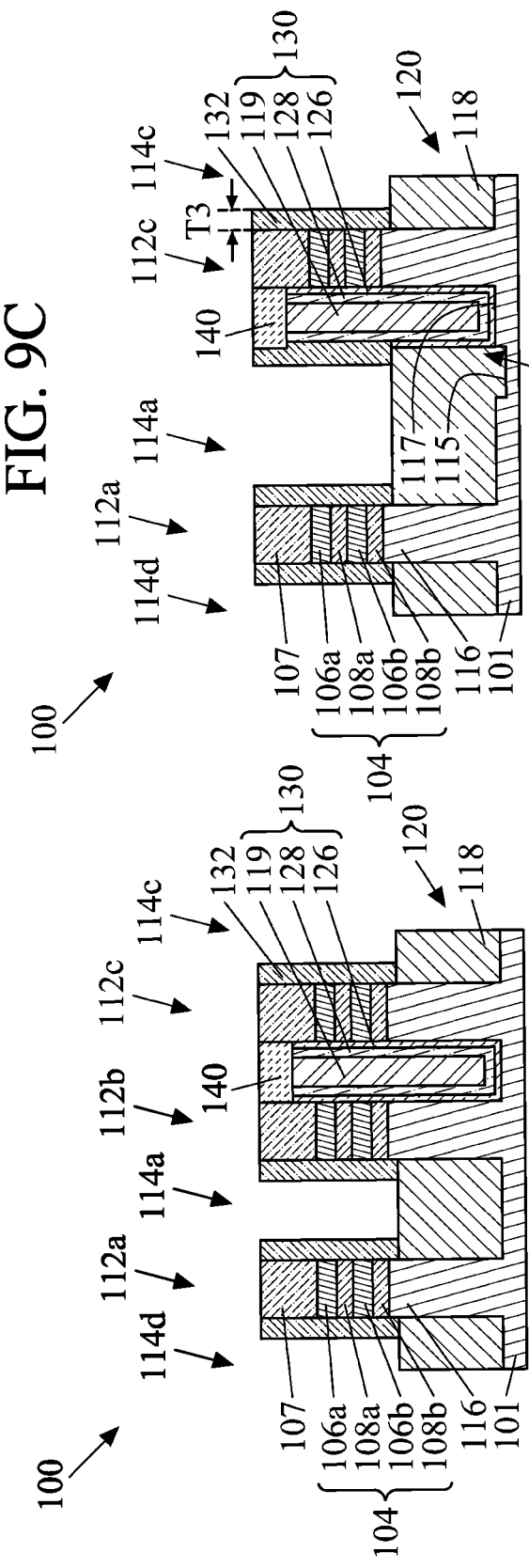

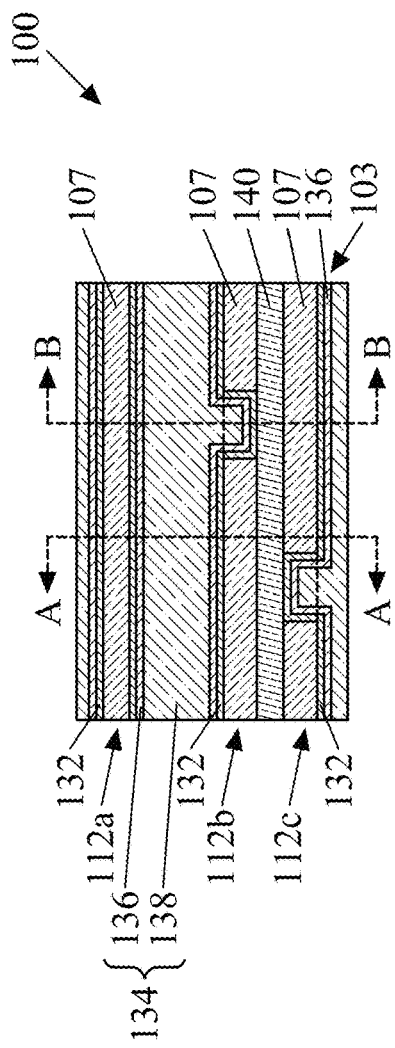
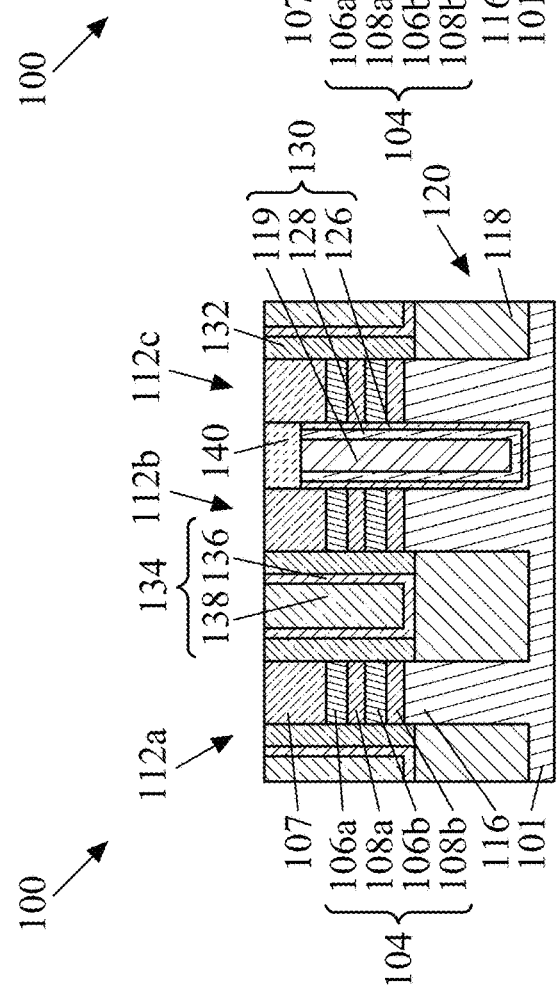
FIG. 10C
FIG. 10B
FIG. 10A

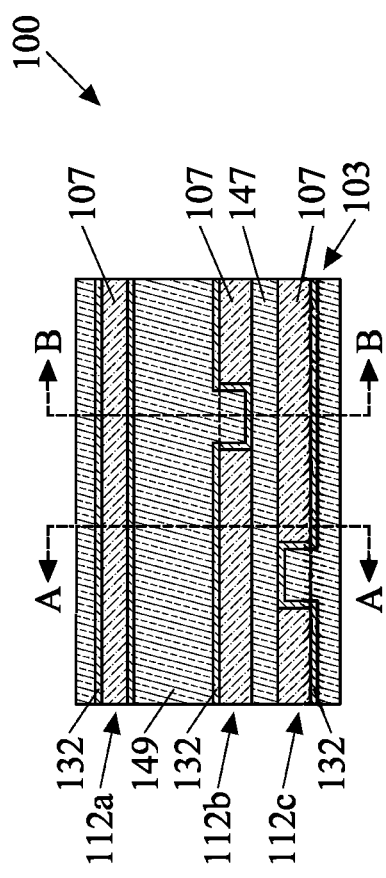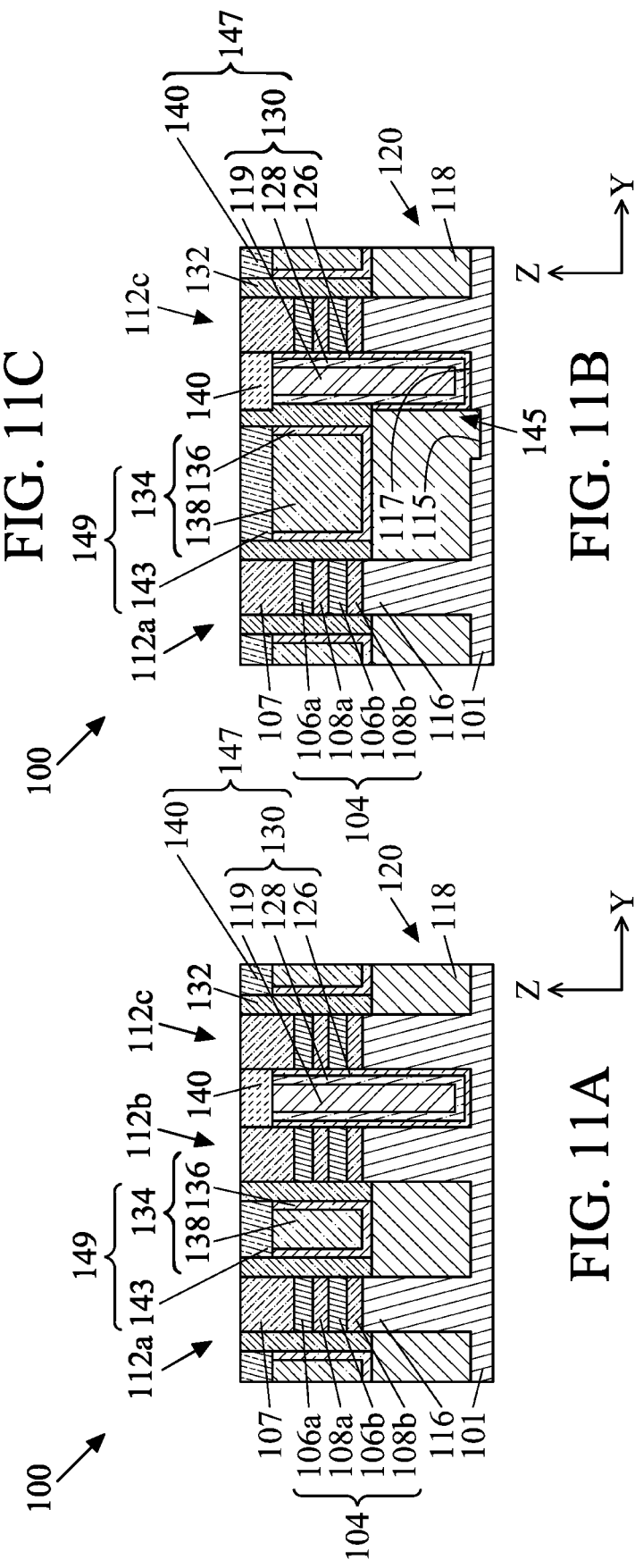
FIG. 11C
FIG. 11B
FIG. 11A

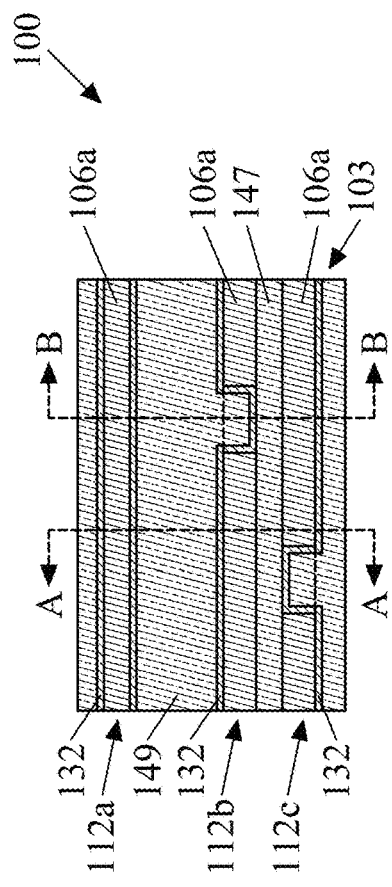
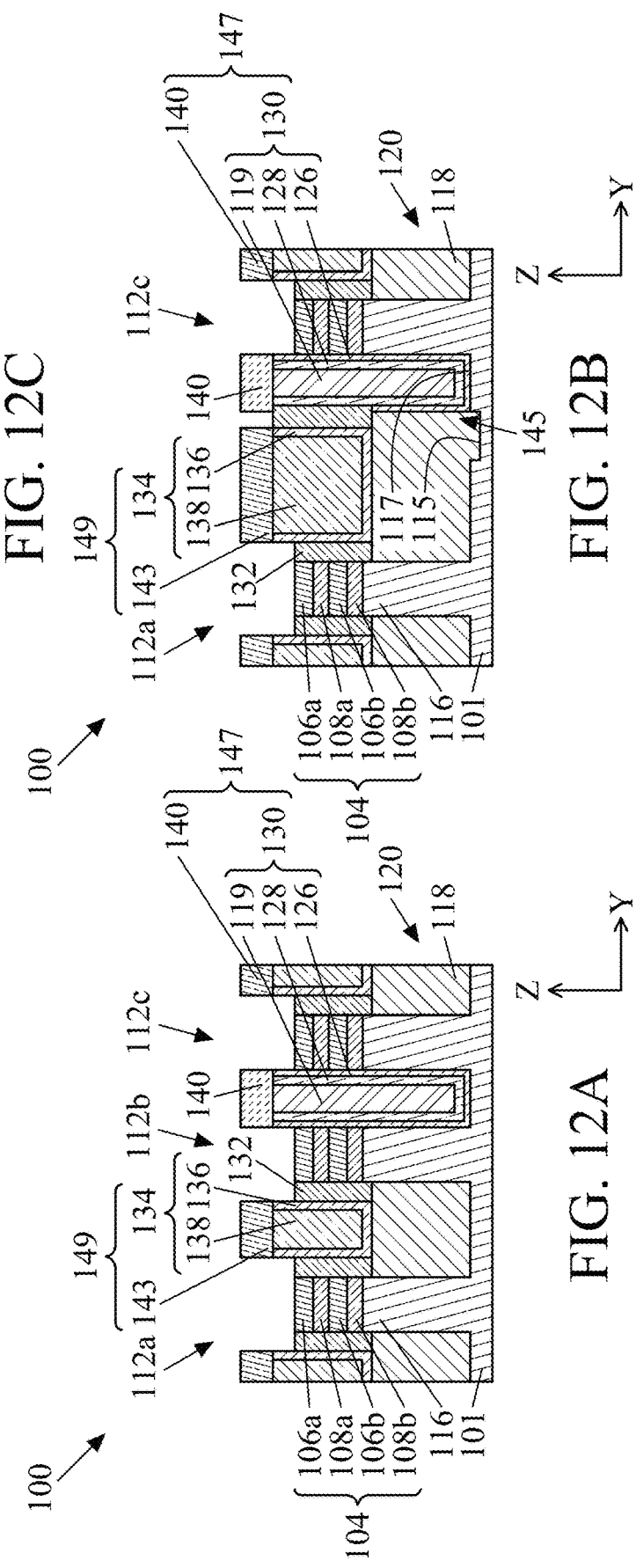
FIG. 12C
FIG. 12B
FIG. 12A

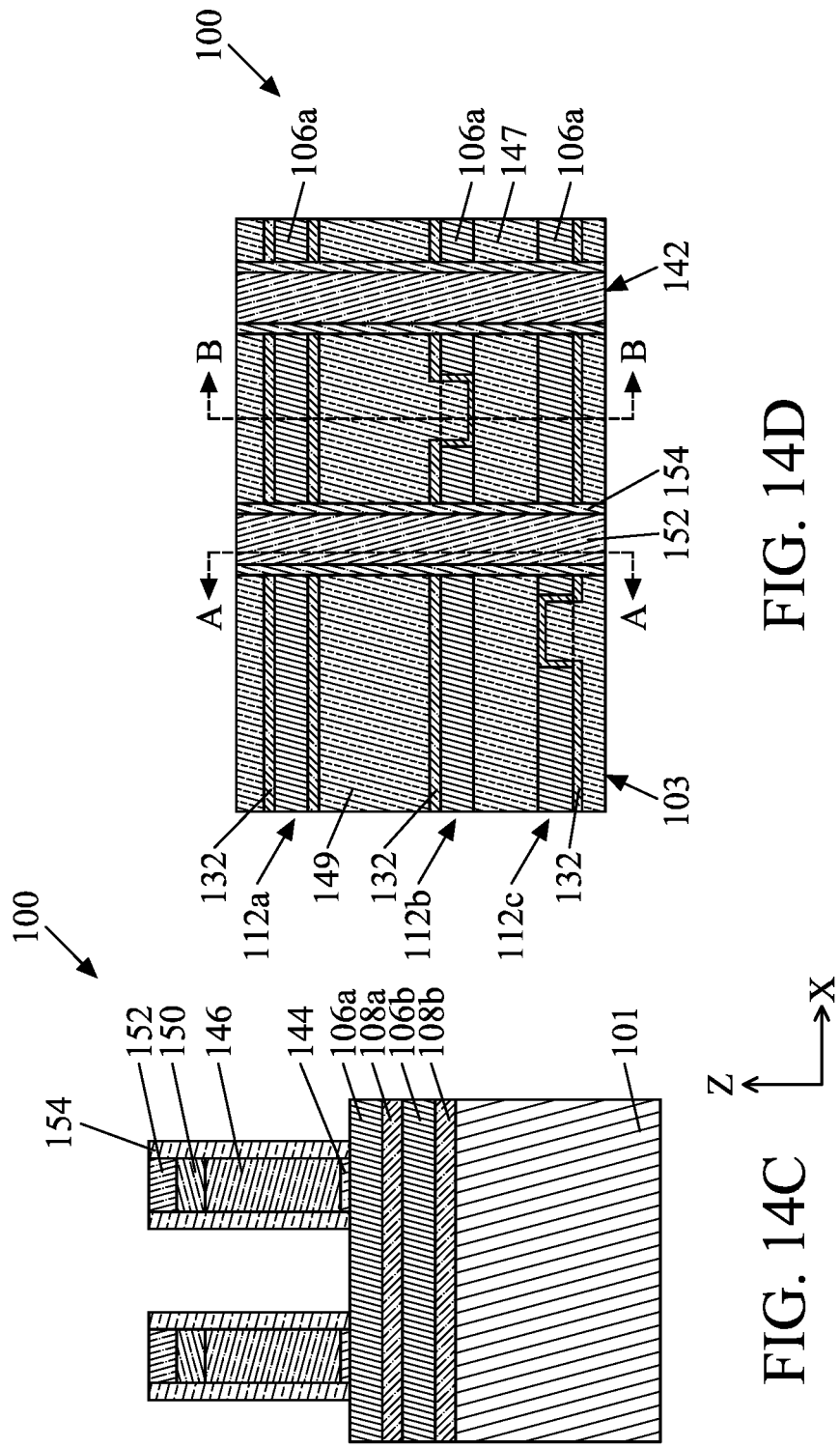

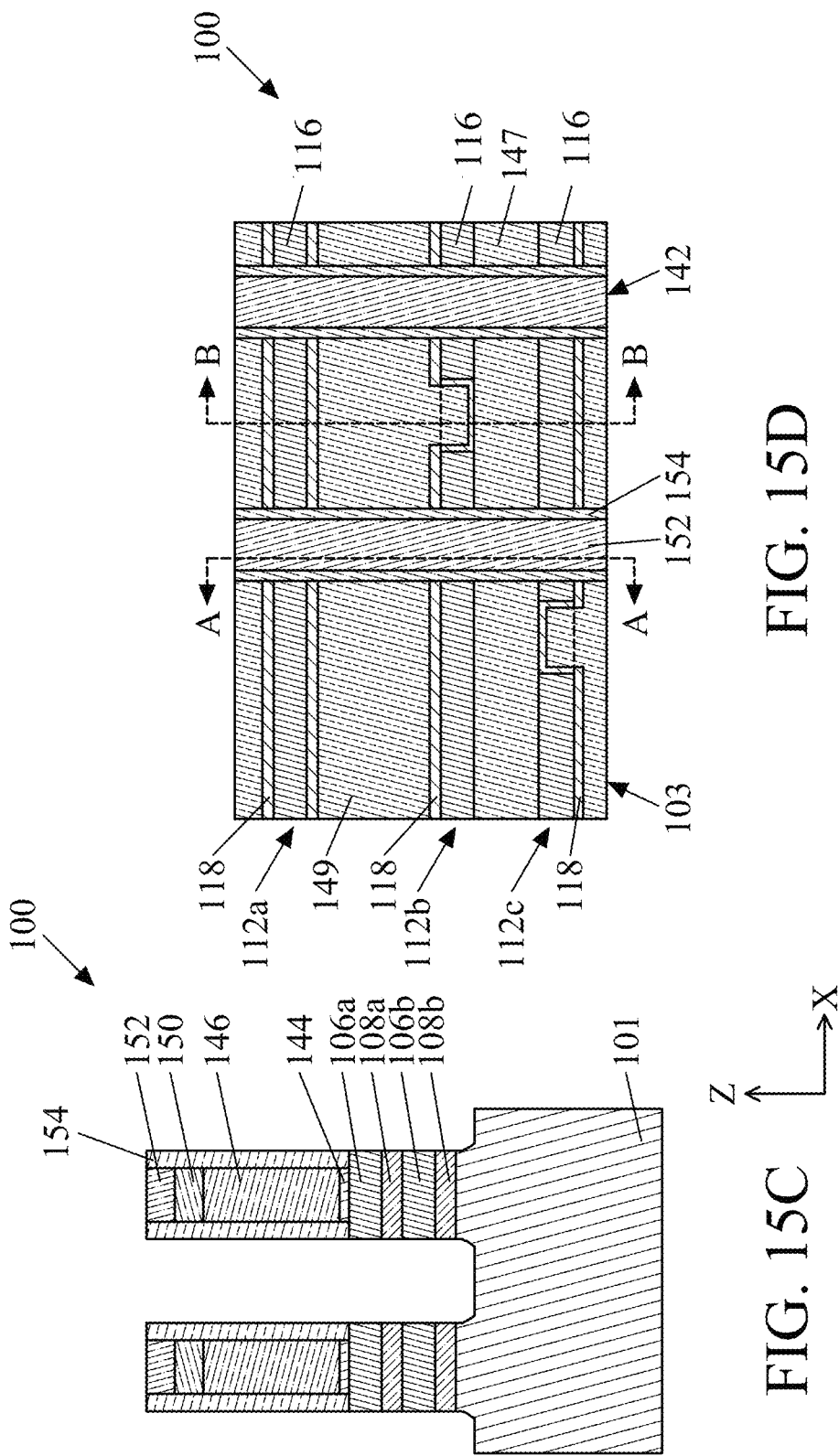

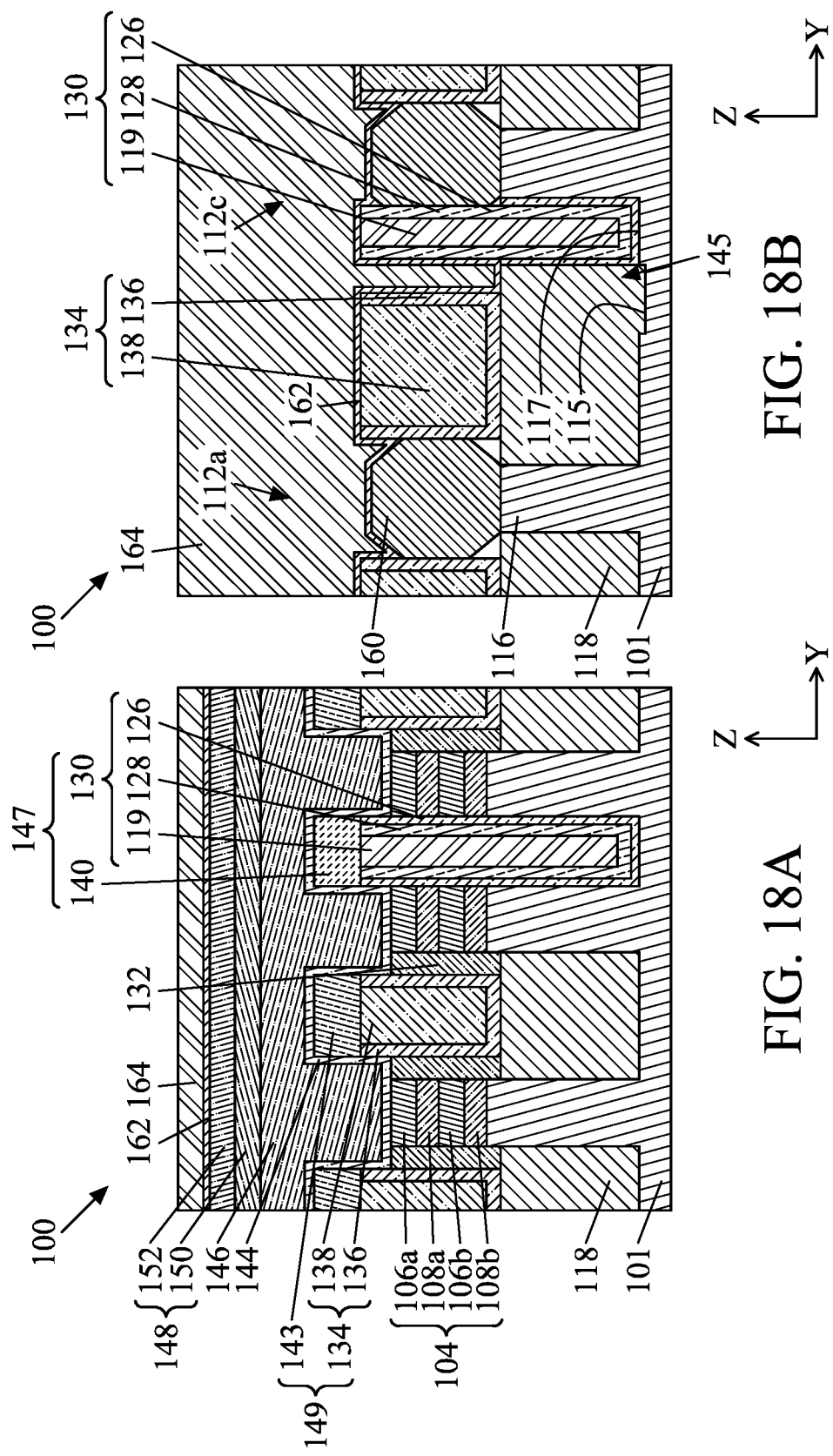

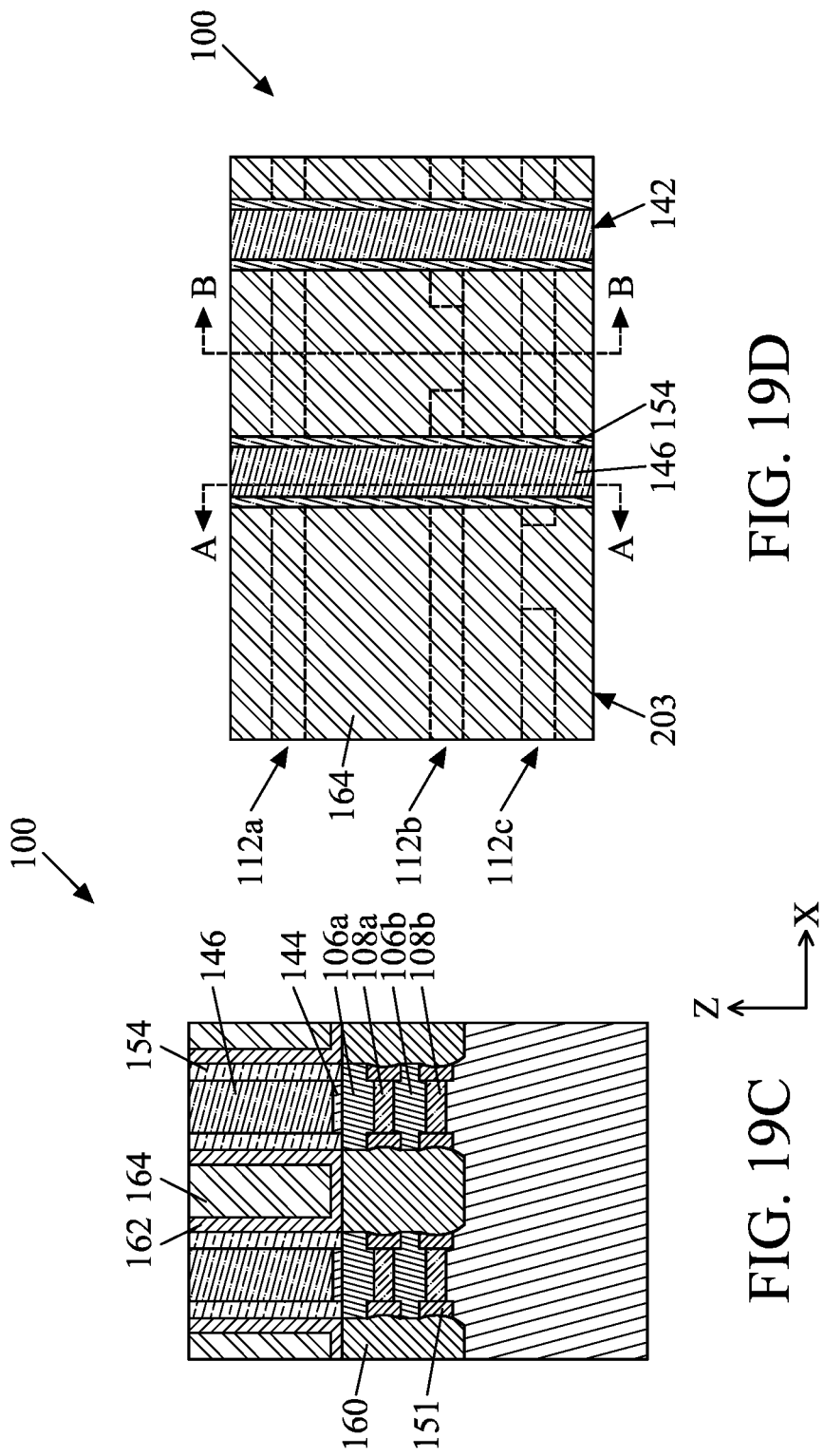

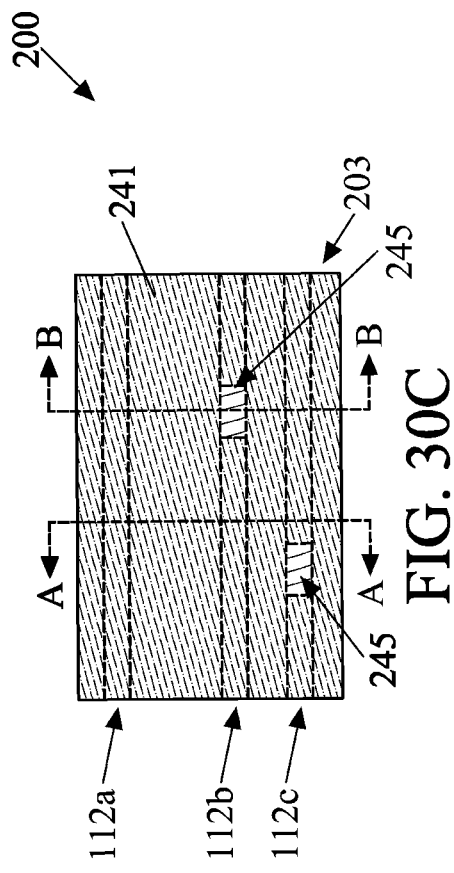
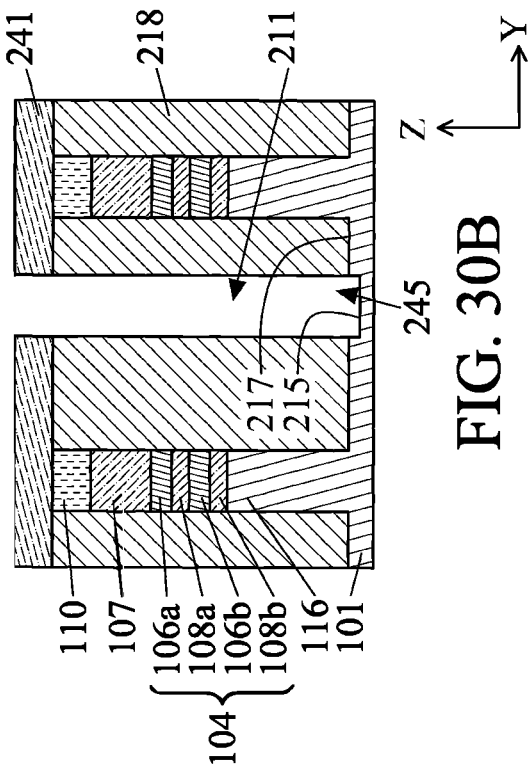
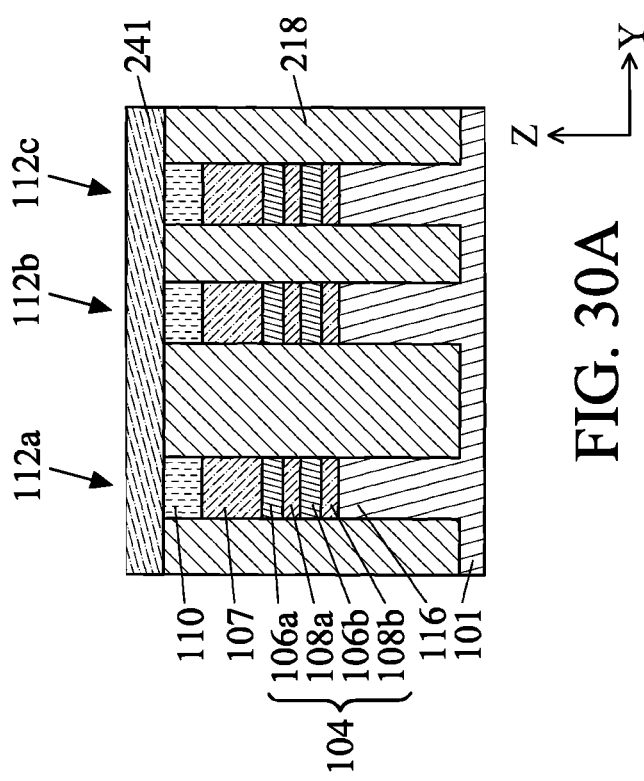
FIG. 30C
FIG. 30B
FIG. 30A

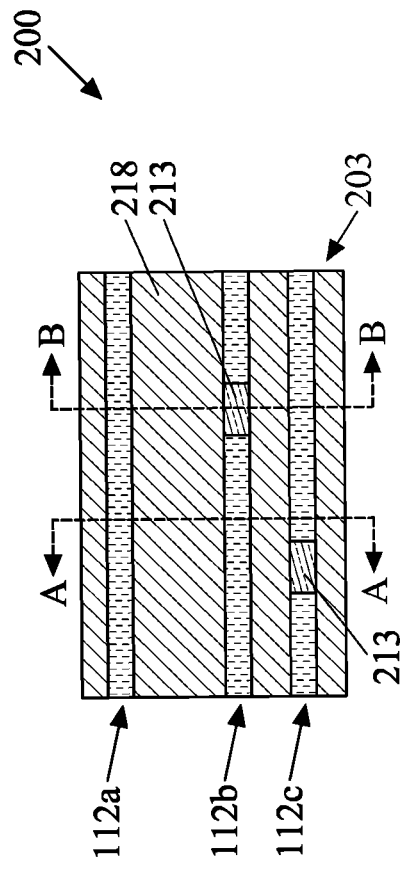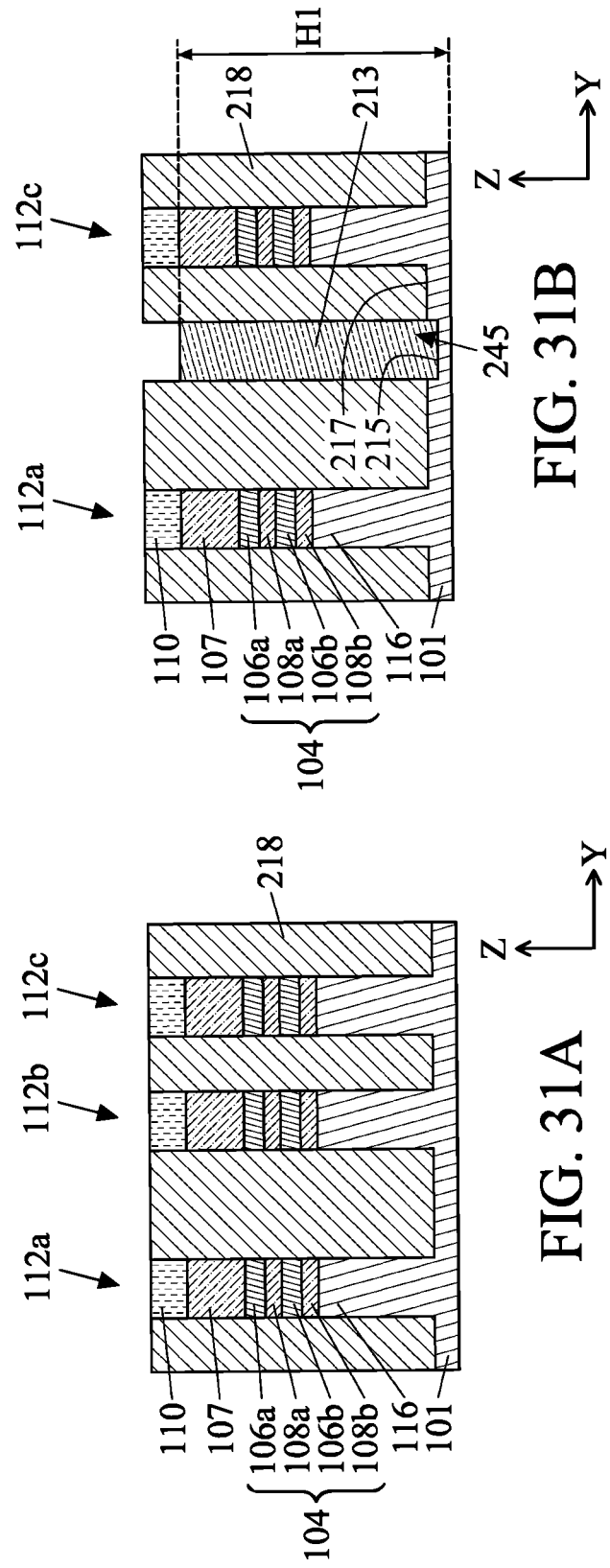

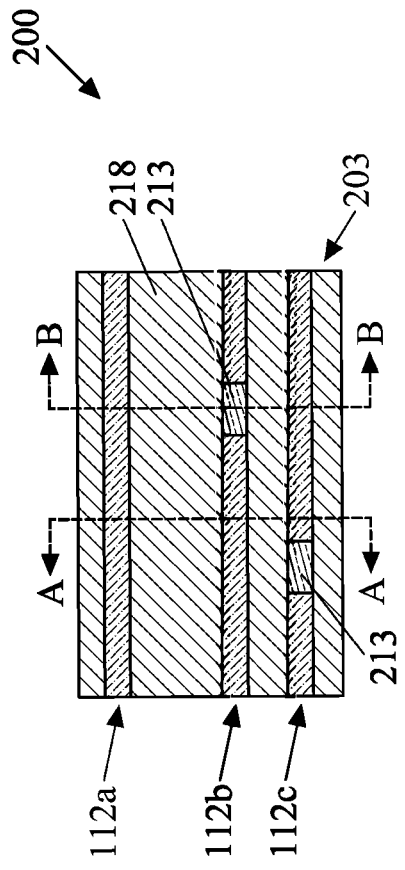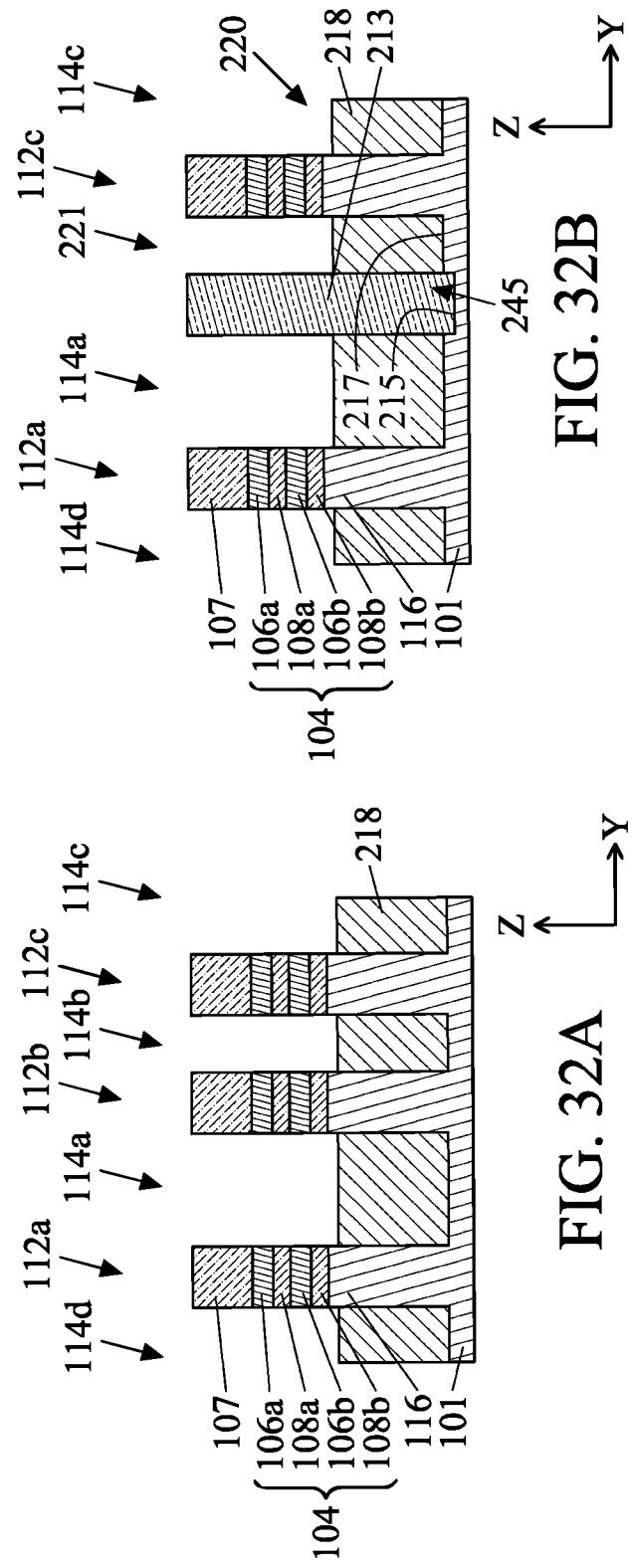

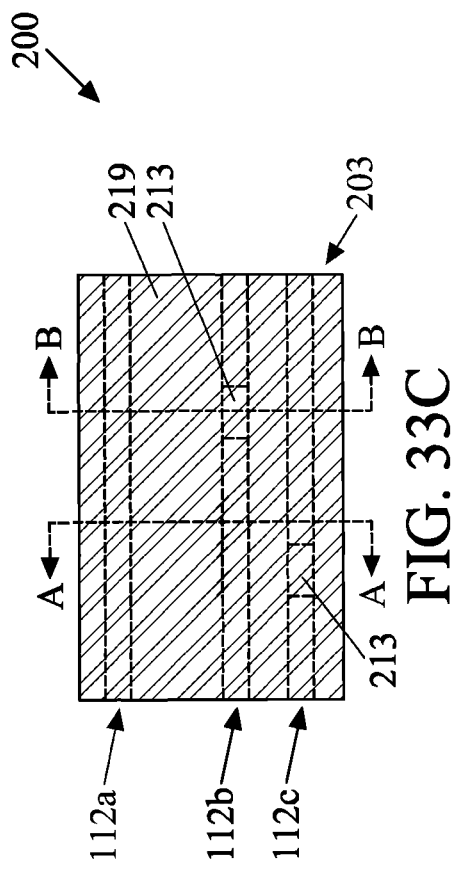
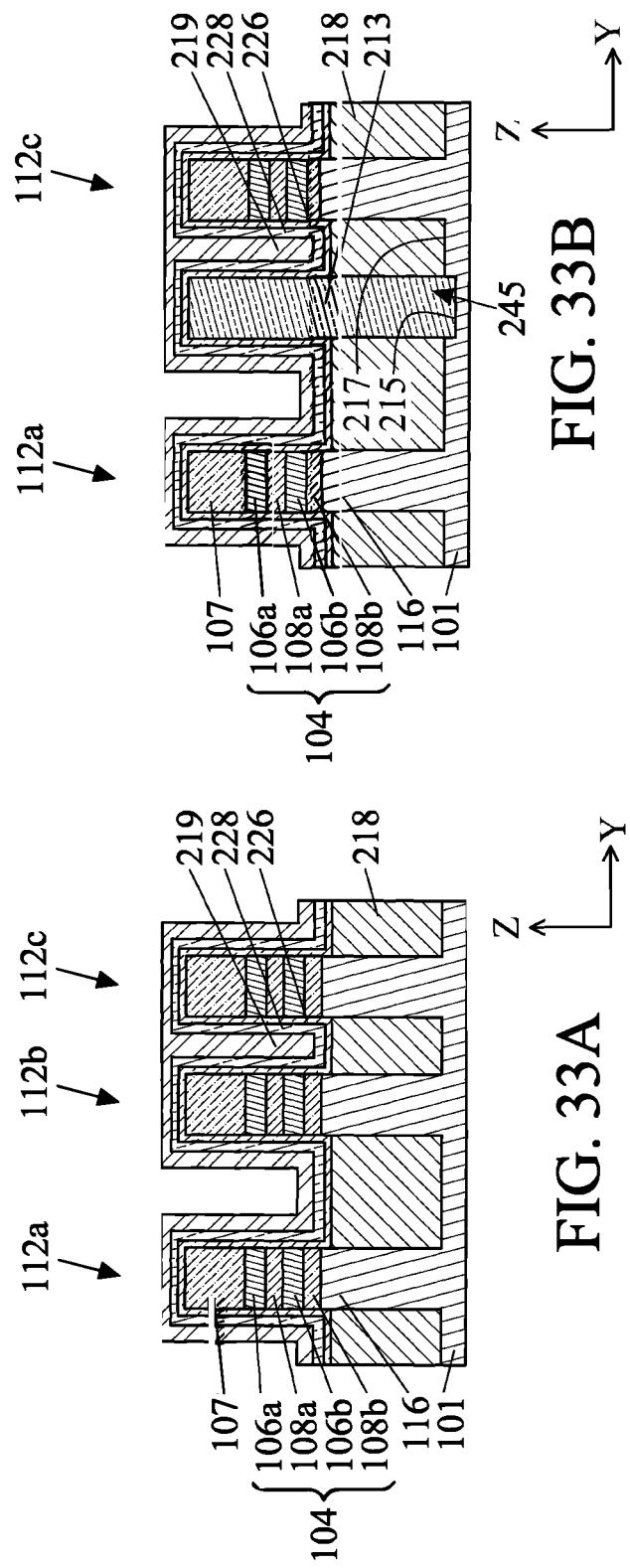
FIG. 33C
FIG. 33B
FIG. 33A

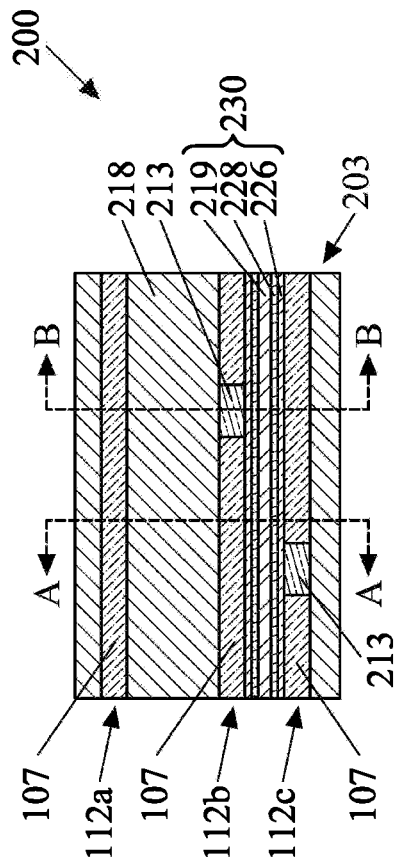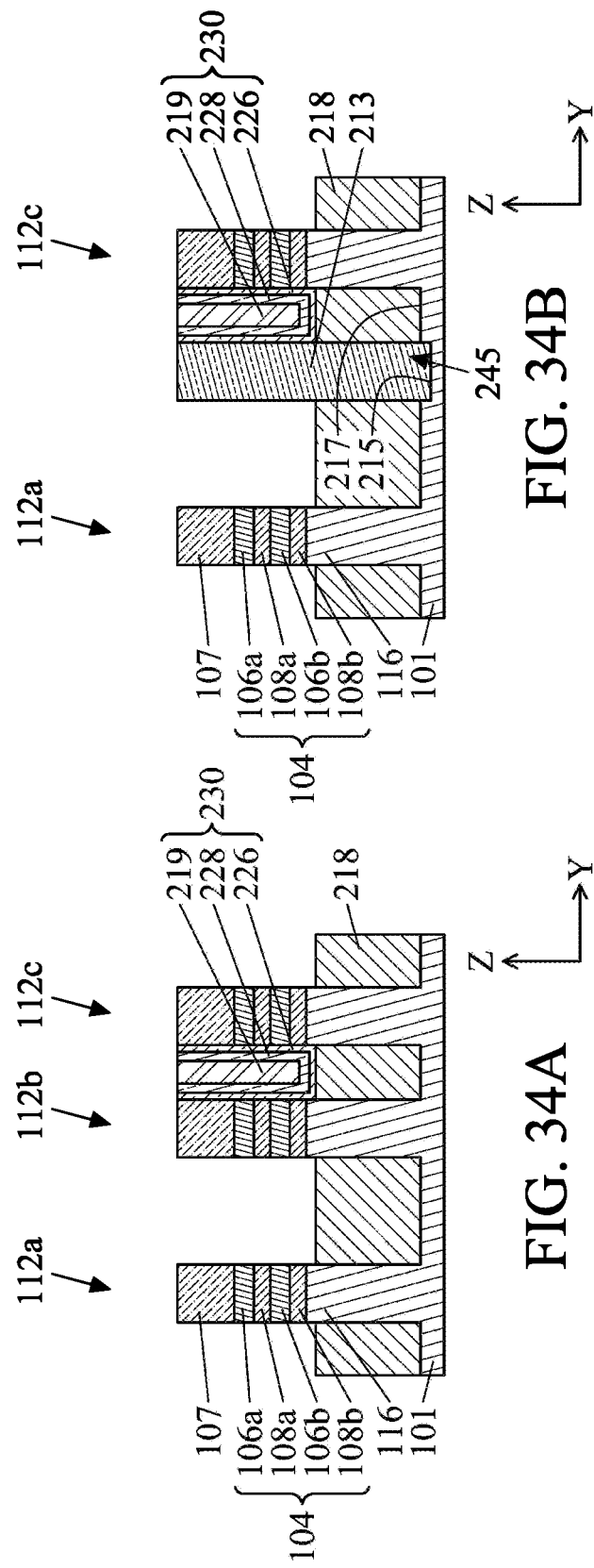
FIG. 34C
FIG. 34B
FIG. 34A

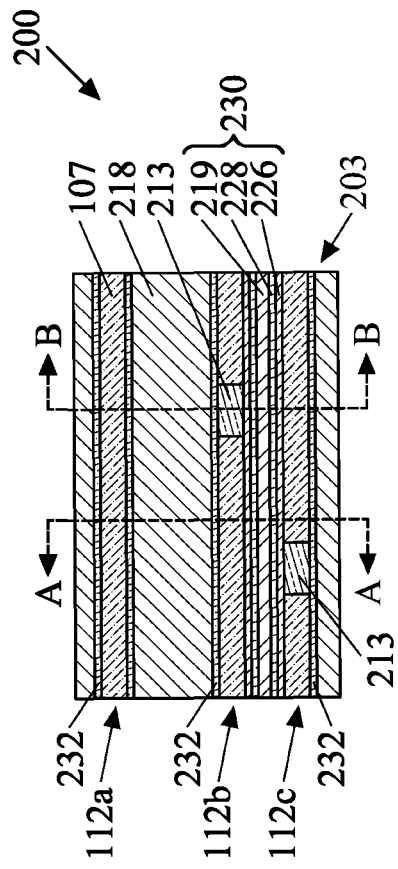
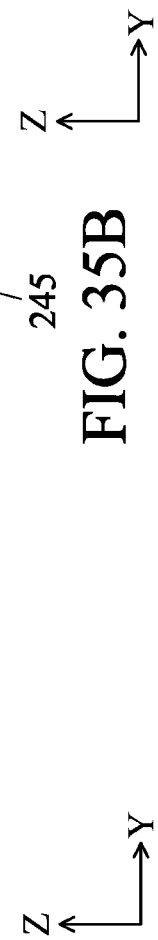
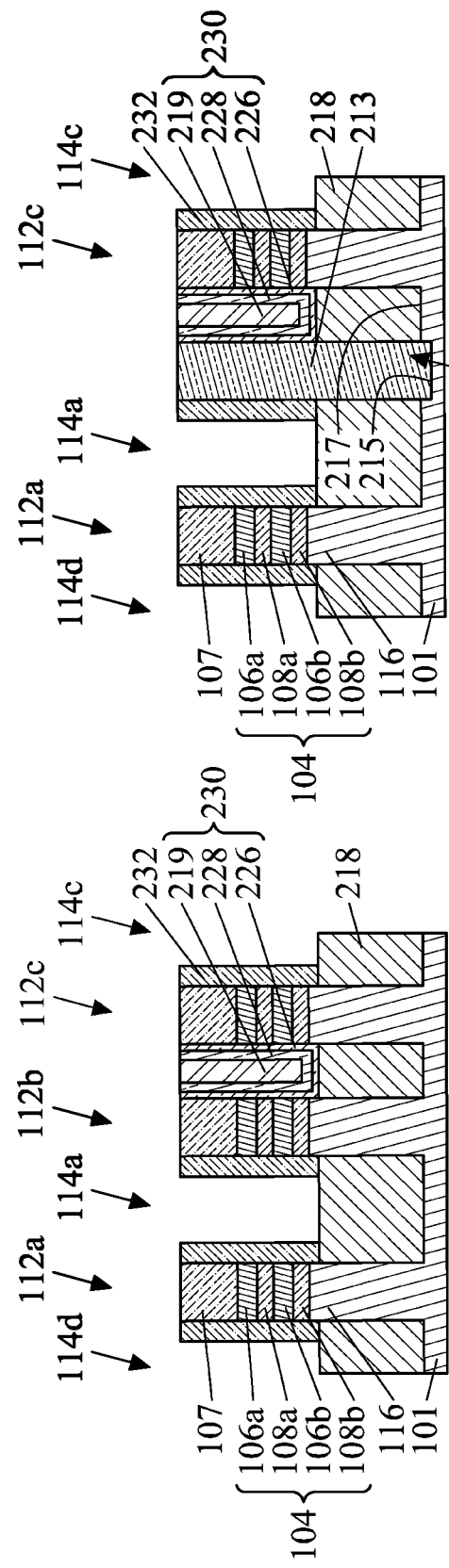
FIG. 35C
FIG. 35B
FIG. 35A

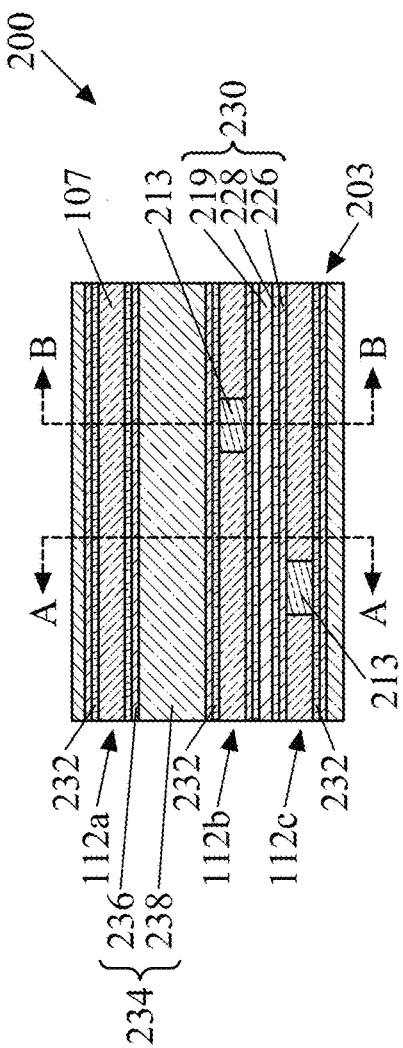
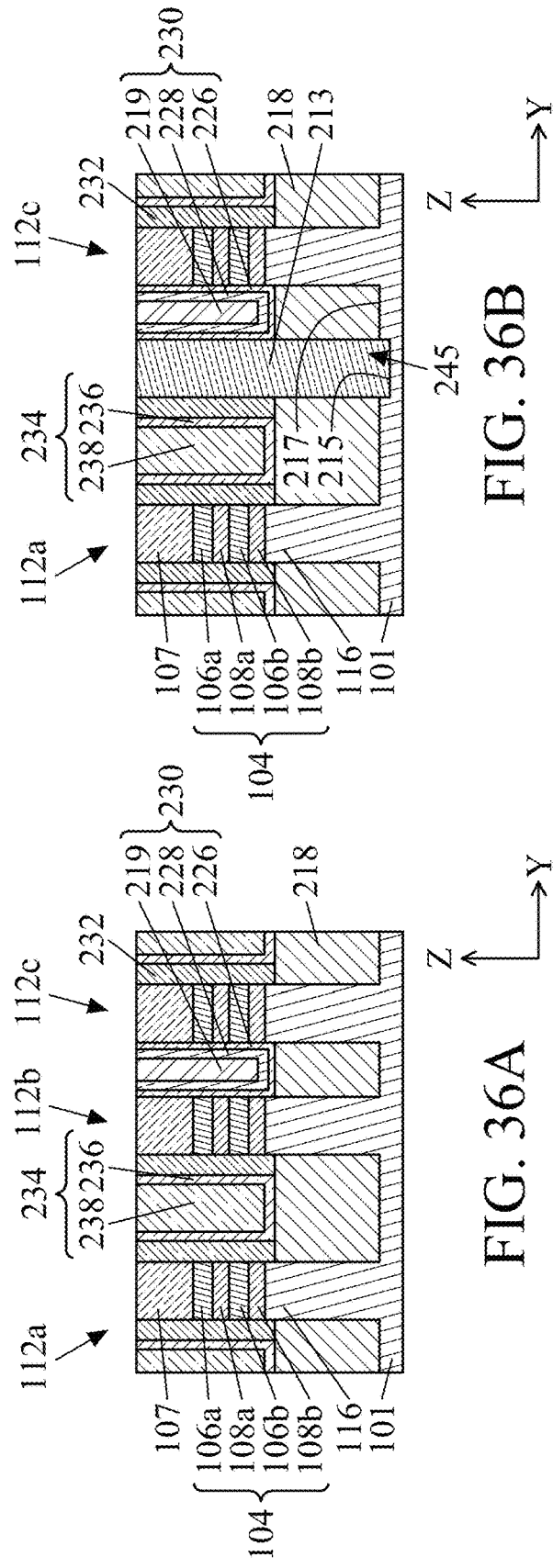
FIG. 36A
FIG. 36B
FIG. 36C

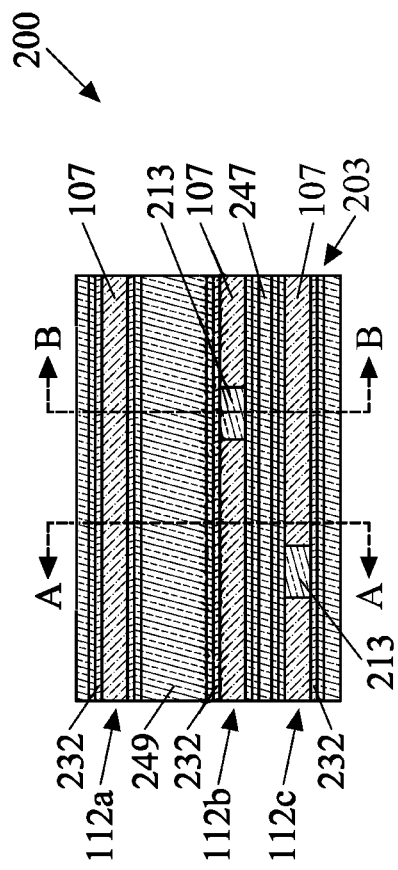
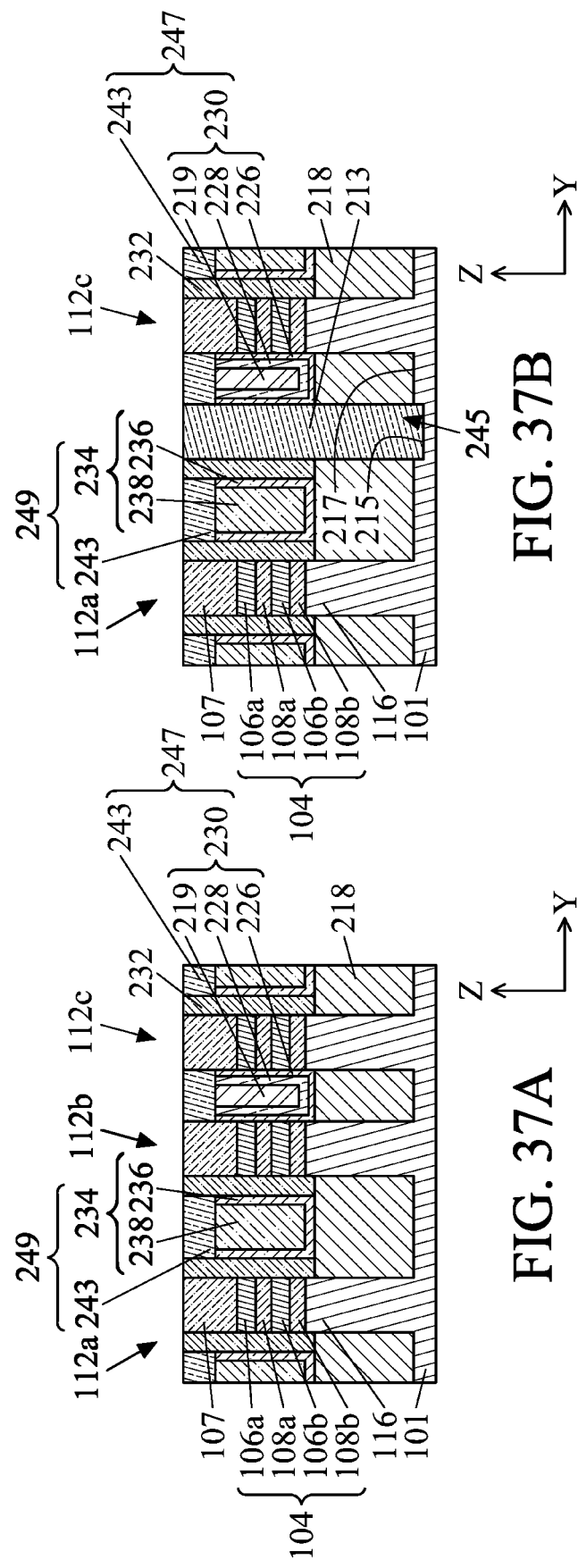
FIG. 37C
FIG. 37B
FIG. 37A

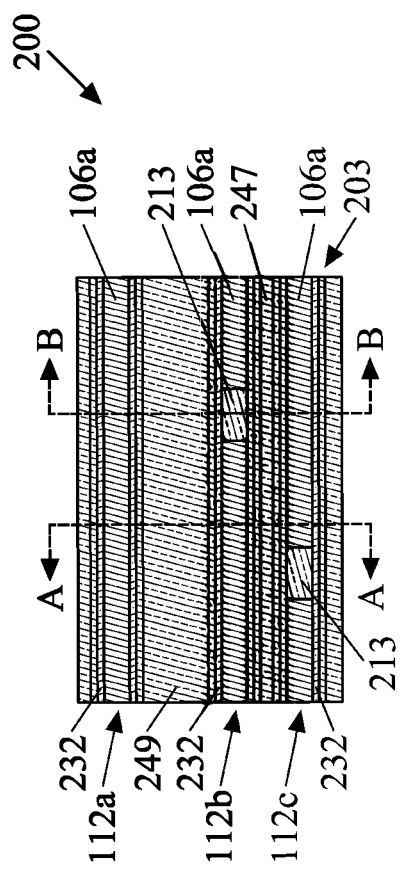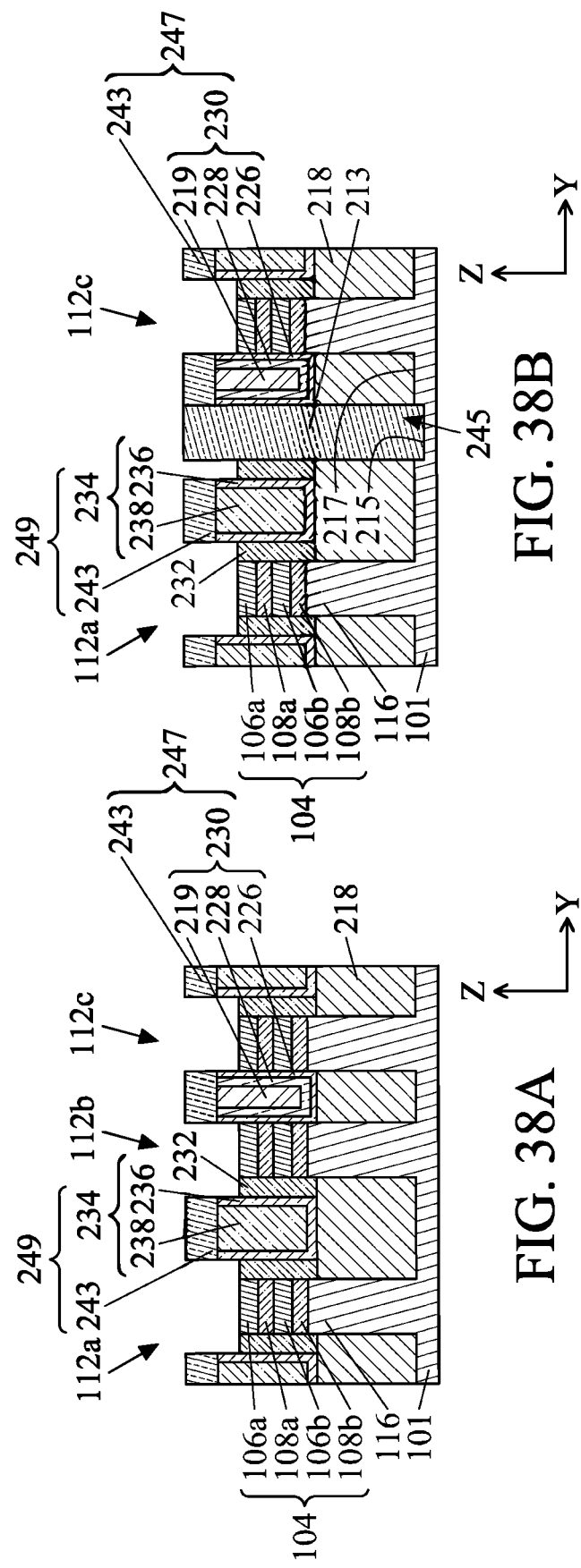
FIG. 38C
FIG. 38B
FIG. 38A

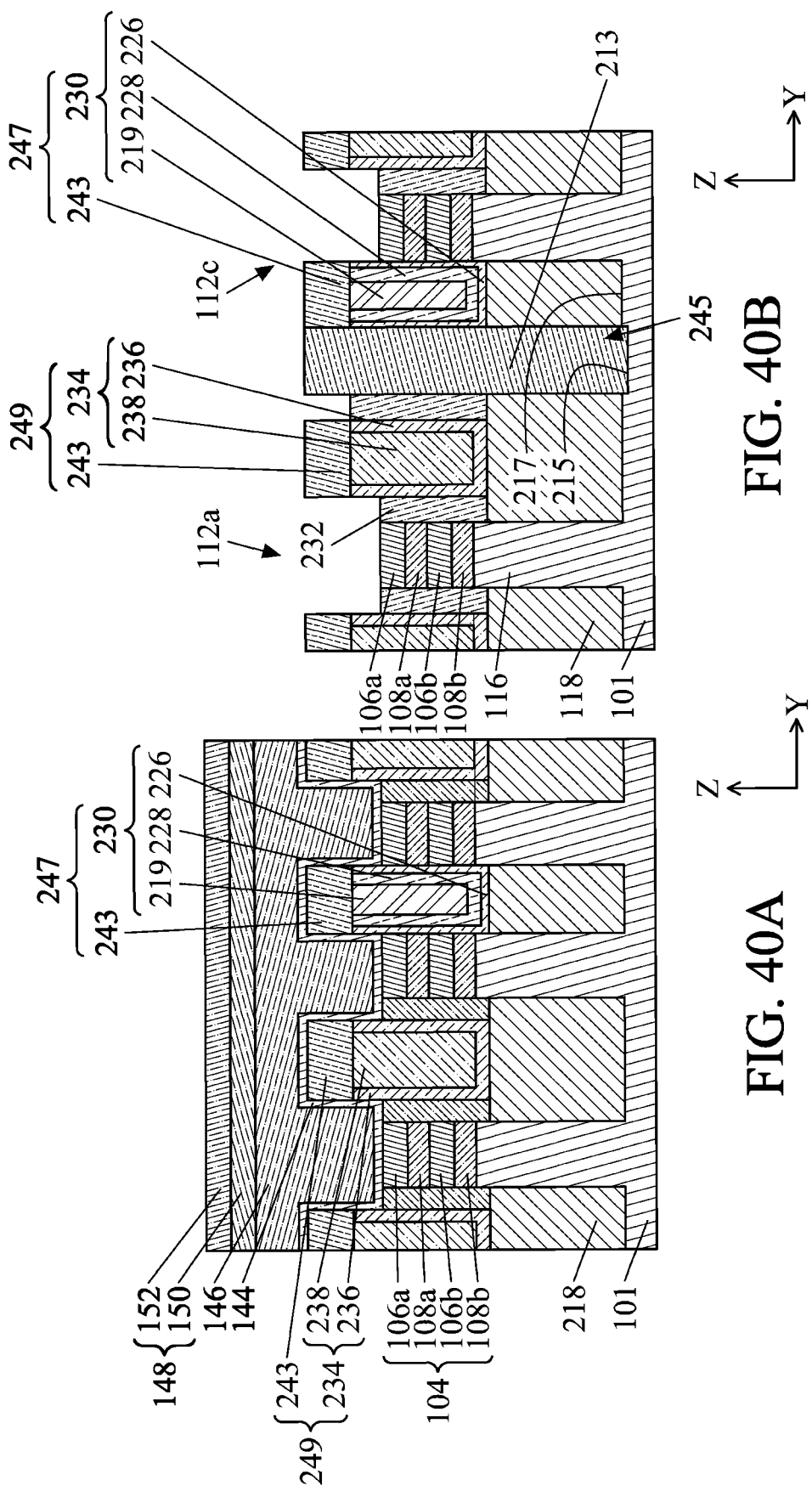

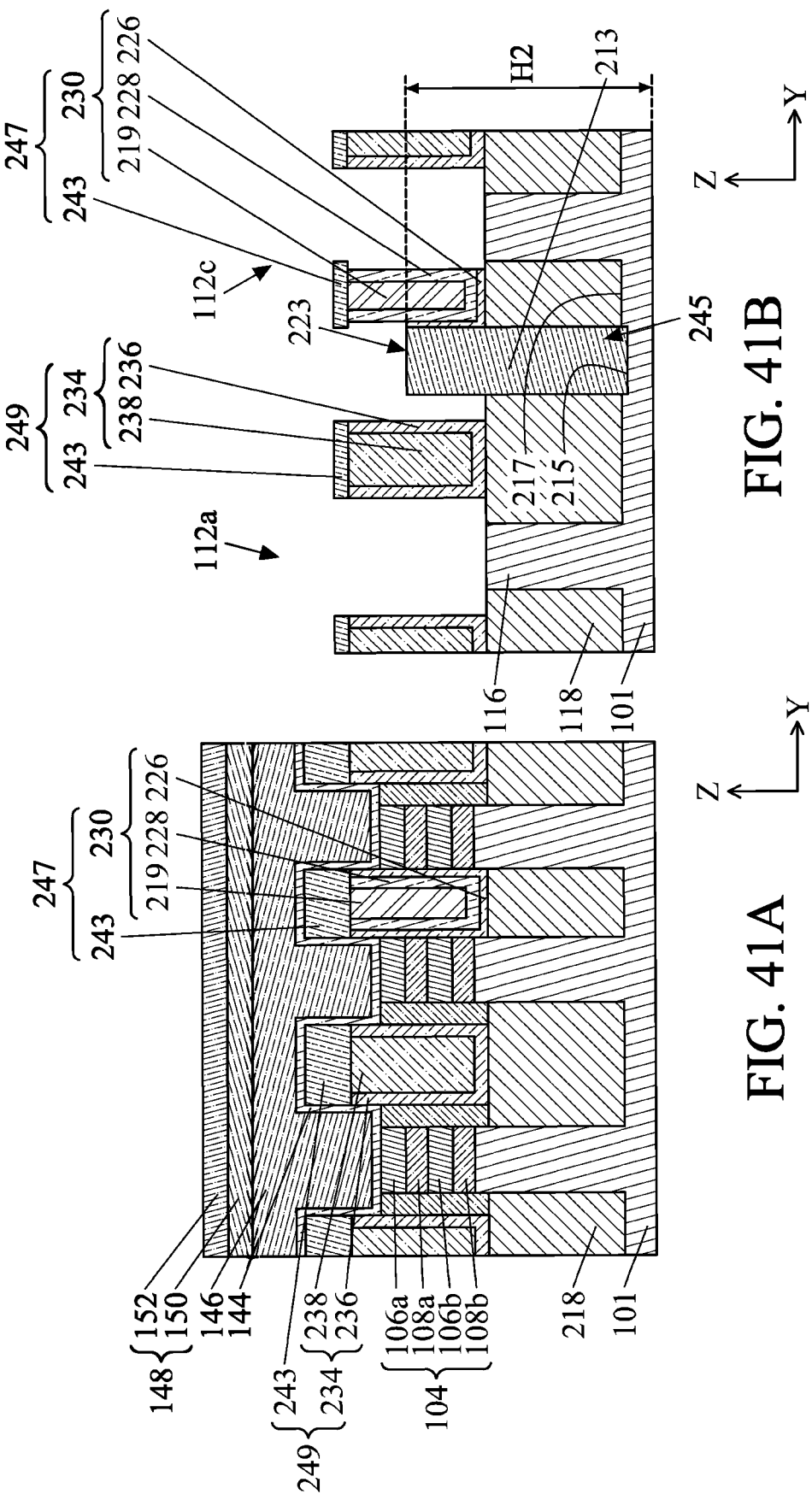

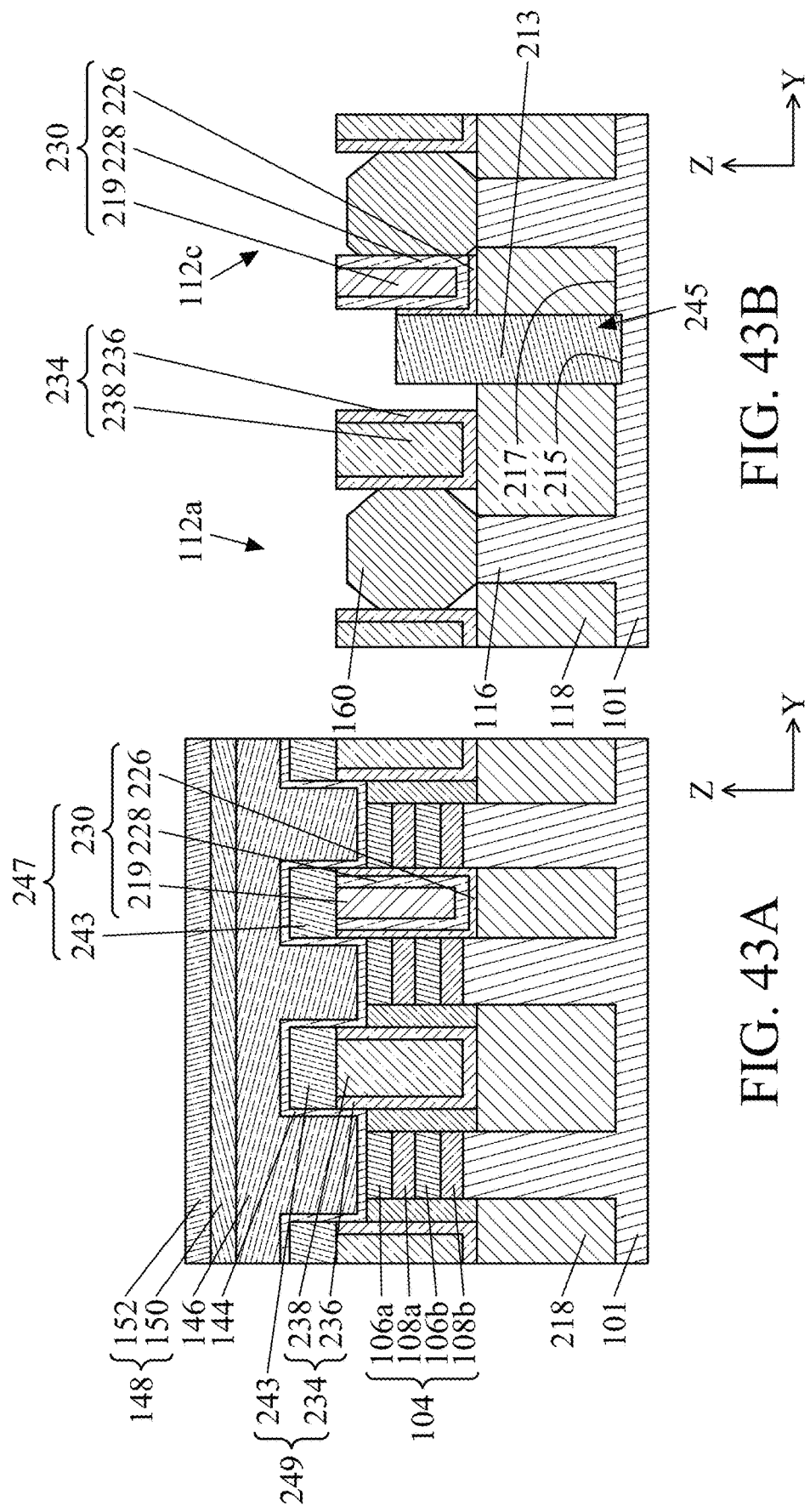

SEMICONDUCTOR DEVICE STRUCTURE INCLUDING FORKSHEET TRANSISTORS AND METHODS OF FORMING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down presents new challenge. For example, transistors using nanowire channels have been proposed to achieve increased device density, greater carrier mobility and drive current in a device. As device size reduces, there is a continuous need to improve processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-12A are cross-sectional side views of various stages of manufacturing the semiconductor device structure taken along line A-A of FIG. 3C, in accordance with some embodiments.

FIGS. 3B-12B are cross-sectional side views of various stages of manufacturing the semiconductor device structure taken along line B-B of FIG. 3C, in accordance with some embodiments.

FIGS. 3C-12C are top views of the semiconductor device structure of FIG. 2 in accordance with some embodiments.

FIGS. 14A-19A are cross-sectional side views of various stages of manufacturing the semiconductor device structure taken along line A-A of FIG. 14D and line A-A of FIG. 13, in accordance with some embodiments.

FIGS. 14B-19B are cross-sectional side views of various stages of manufacturing the semiconductor device structure taken along line B-B of FIG. 14D, in accordance with some embodiments.

FIGS. 14C-19C are cross-sectional side views of various stages of manufacturing the semiconductor device structure taken along line C-C of FIG. 13.

FIGS. 14D-19D are top views of the semiconductor device structure of FIG. 13, in accordance with some embodiments.

FIGS. 30A-38A are cross-sectional side views of various stages of manufacturing the semiconductor device structure taken along line A-A of FIG. 30C, in accordance with some embodiments.

FIGS. 30B-38B are cross-sectional side views of various stages of manufacturing the semiconductor device structure taken along line B-B of FIG. 30C, in accordance with some embodiments.

FIGS. 30C-38C are top views of various stages of manufacturing the semiconductor device structure of FIG. 29, in accordance with some embodiments.

FIGS. 40A-45A are cross-sectional side views of various stages of manufacturing the semiconductor device structure taken along line A-A of FIG. 40D and line A-A of FIG. 39, in accordance with some embodiments.

FIGS. 40B-45B are cross-sectional side views of various stages of manufacturing the semiconductor device structure taken along line B-B of FIG. 40D, in accordance with some embodiments.

FIGS. 40C-45C are cross-sectional side views of various stages of manufacturing the semiconductor device structure taken along line C-C of FIG. 39.

FIGS. 40D-45D are top views of the semiconductor device structure of FIG. 39 in accordance with some embodiments.

DETAILED DESCRIPTION

Figure 1:
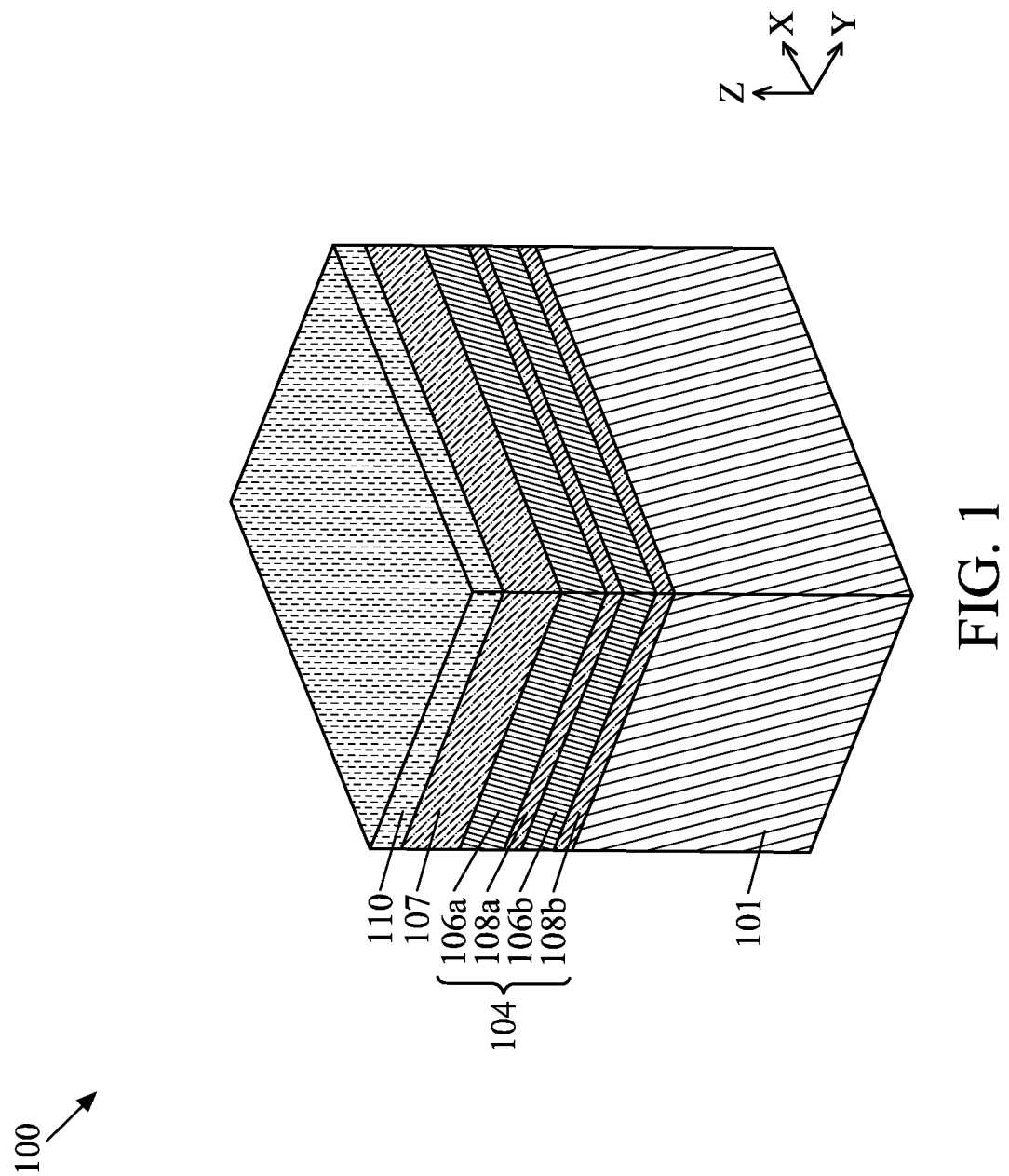
FIGS. 1-2 are perspective views of various stages of manufacturing a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

While the embodiments of this disclosure are discussed with respect to nanosheet channel FETs, implementations of some aspects of the present disclosure may be used in other processes and/or in other devices, such as planar FETs, Fin-FETs, Horizontal Gate All Around (HGAA) FETs, Vertical Gate All Around (VGAA) FETs, and other suitable devices. A person having ordinary skill in the art will readily understand other modifications that may be made are contemplated within the scope of this disclosure. In cases where gate all around (GAA) transistor structures are adapted, the GAA transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

FIGS. 1-28 show exemplary sequential processes for manufacturing a semiconductor device structure 100, in accordance with some embodiments. It is understood that additional operations can be provided before, during, and after processes shown by FIGS. 1-28, and some of the operations described below can be replaced or eliminated, for additional embodiments of the method. The order of the operations/processes may be interchangeable.

FIG. 1 is a perspective view of one of various stages of manufacturing the semiconductor device structure 100, in accordance with some embodiments. As shown in FIG. 1, a semiconductor device structure 100 includes a stack of semiconductor layers 104 formed over a front side of a substrate 101. The substrate 101 may be a semiconductor substrate. The substrate 101 may include a single crystalline semiconductor material such as, but not limited to silicon (Si), germanium (Ge), silicon germanium (SiGe), gallium arsenide (GaAs), indium antimonide (InSb), gallium phosphide (GaP), gallium antimonide (GaSb), indium aluminum arsenide (InAlAs), indium gallium arsenide (InGaAs), gallium antimony phosphide (GaSbP), gallium arsenic antimonide (GaAsSb) and indium phosphide (InP). In this embodiment, the substrate 101 is made of Si. In some embodiments, the substrate 101 is a silicon-on-insulator (SOI) substrate, which includes an insulating layer (not shown) disposed between two silicon layers. In one aspect, the insulating layer is an oxide.

The substrate 101 may include various regions that have been doped with impurities (e.g., dopants having p-type or n-type conductivity). Depending on circuit design, the dopants may be, for example boron for a p-type (or p-channel) field effect transistor (FET) and phosphorus for an n-type (or n-channel) FET.

The stack of semiconductor layers 104 includes alternating semiconductor layers made of different materials to facilitate formation of nanosheet channels in a multi-gate device, such as nanosheet channel FETs or forksheet FETs. In some embodiments, the stack of semiconductor layers 104 includes first semiconductor layers 106 (106a-106b) and second semiconductor layers 108 (108a-108b). In some embodiments, the stack of semiconductor layers 104 includes alternating first and second semiconductor layers 106, 108. The first semiconductor layers 106 are aligned with the second semiconductor layers 108. The first semiconductor layers 106 and the second semiconductor layers 108 are made of semiconductor materials having different etch selectivity and/or oxidation rates. For example, the first semiconductor layers 106 may be made of Si and the second semiconductor layers 108 may be made of SiGe. In some examples, the first semiconductor layers 106 may be made of SiGe and the second semiconductor layers 108 may be made of Si. In some cases, the SiGe in the first or second semiconductor layers 106, 108 can have a germanium composition percentage between about 10% and about 80%. Alternatively, in some embodiments, either of the semiconductor layers 106, 108 may be or include other materials such as Ge, SiC, GeAs, GaP, InP, InAs, InSb, GaAsP, AlInAs, AlGaAs, InGaAs, GaInP, GaInAsP, or any combinations thereof.

The first semiconductor layers 106 or portions thereof may form nanosheet channel(s) of the semiconductor device structure 100 in later fabrication stages. The term nanosheet is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including, for example, a cylindrical in shape or substantially rectangular cross-section. The nanosheet channel(s) of the semiconductor device structure 100 may be surrounded by a gate electrode. For example, the nanosheet channel(s) of a forksheet transistor may have at least three surfaces surrounded by the gate electrode. The semiconductor device structure 100 may include a nanosheet transistor and/or a forksheet transistor. The nanosheet transistors may be referred to as nanowire transistors, gate-all-around (GAA) transistors, multi-bridge channel (MBC) transistors, or any transistors having the gate electrode surrounding the channels.

It is noted that while two layers of the first semiconductor layers 106 and two layers of the second semiconductor layers 108 are alternately arranged as illustrated in FIG. 1, it can be appreciated that any number of first and second semiconductor layers 106, 108 can be formed in the stack of semiconductor layers 104, depending on the predetermined number of channels for the semiconductor device structure 100. In some embodiments, the number of first semiconductor layers 106, which is the number of channels, is between 3 and 8.

The first and second semiconductor layers 106, 108 are formed by any suitable deposition process, such as epitaxy. By way of example, epitaxial growth of the layers of the stack of semiconductor layers 104 may be performed by a molecular beam epitaxy (MBE) process, a metalorganic chemical vapor deposition (MOCVD) process, and/or other suitable epitaxial growth processes.

Figure 13:
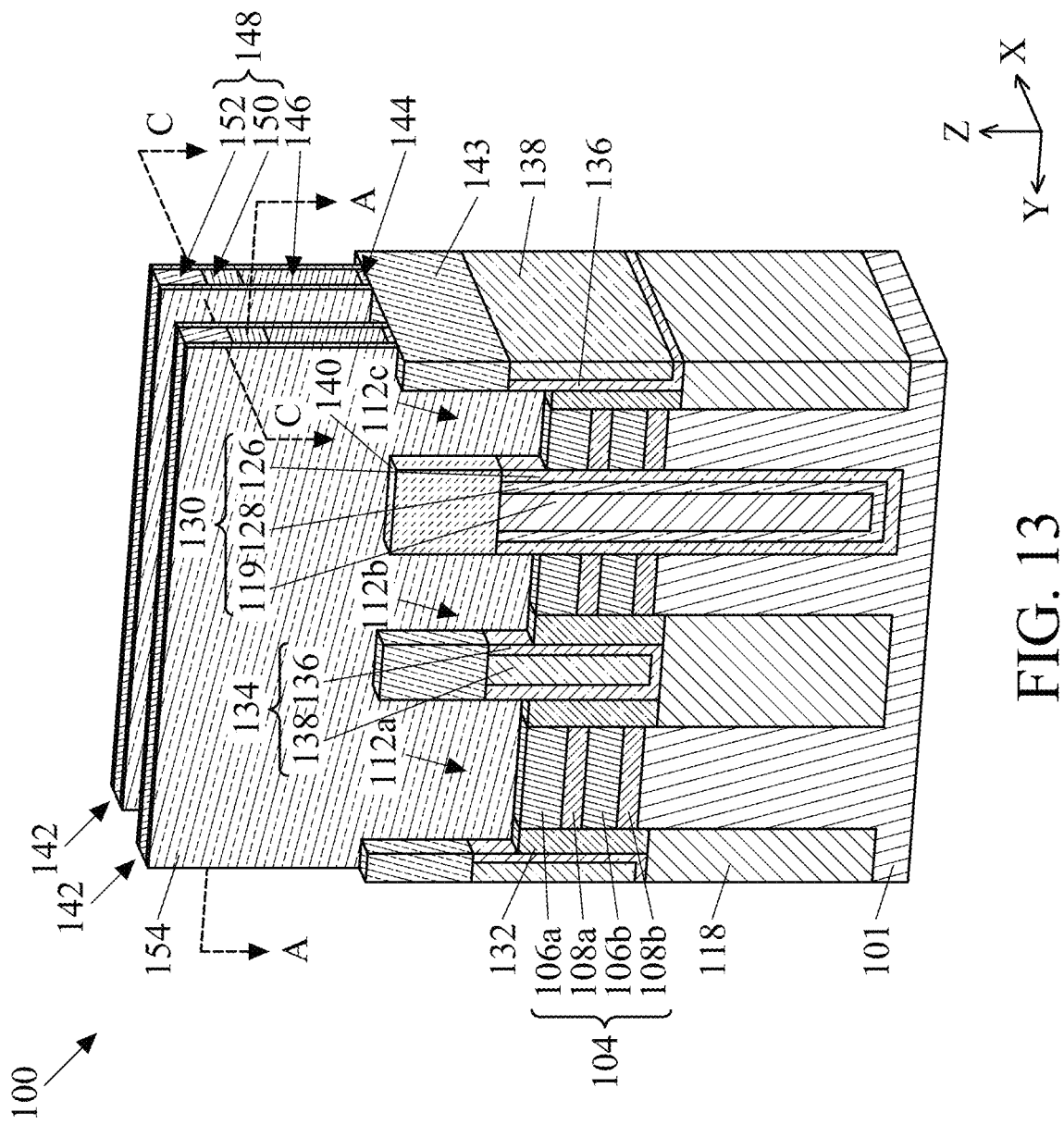
FIG. 13 is a perspective view of one of the various stages of manufacturing the semiconductor device structure, in accordance with some embodiments.

The substrate 101 may include a sacrificial layer 107 on the stack of semiconductor layers 104. The sacrificial layer 107 protects the stack of semiconductor layers 104 during the subsequent processes and is removed along with a portion of a cladding layer (FIG. 12A) prior to formation of the sacrificial gate stack (FIG. 13). In cases where the first semiconductor layer 106 of the stack of semiconductor layers 104 is Si, the sacrificial layer 107 includes SiGe epitaxially grown on the first semiconductor layer 106.

Each first semiconductor layer 106 may have a thickness in a range between about 5 nm and about 30 nm. Each second semiconductor layer 108 may have a thickness that is equal, less, or greater than the thickness of the first semiconductor layer 106. In some embodiments, each second semiconductor layer 108 has a thickness in a range between about 2 nm and about 50 nm. The second semiconductor layers 108 may eventually be removed and serve to define a vertical distance between adjacent channels for the semiconductor device structure 100. The sacrificial layer 107 may have a thickness that is equal, less, or greater than the thickness of the first semiconductor layer 106. The thickness of the sacrificial layer 107 may range from about 2 nm to 50 nm. The thickness of the first semiconductor layer 106, the second semiconductor layer 108, and the sacrificial layer 107 may vary depending on the application and/or device performance considerations.

A mask structure 110 is formed over the sacrificial layer 107. The mask structure 110 may include an oxygen-containing layer and a nitrogen-containing layer. The oxygen-containing layer may be a pad oxide layer, such as a Sift layer. The nitrogen-containing layer may be a pad nitride layer, such as $Si_3N_4$. The mask structure 110 may be formed by any suitable deposition process, such as chemical vapor deposition (CVD) process.

Figure 2:
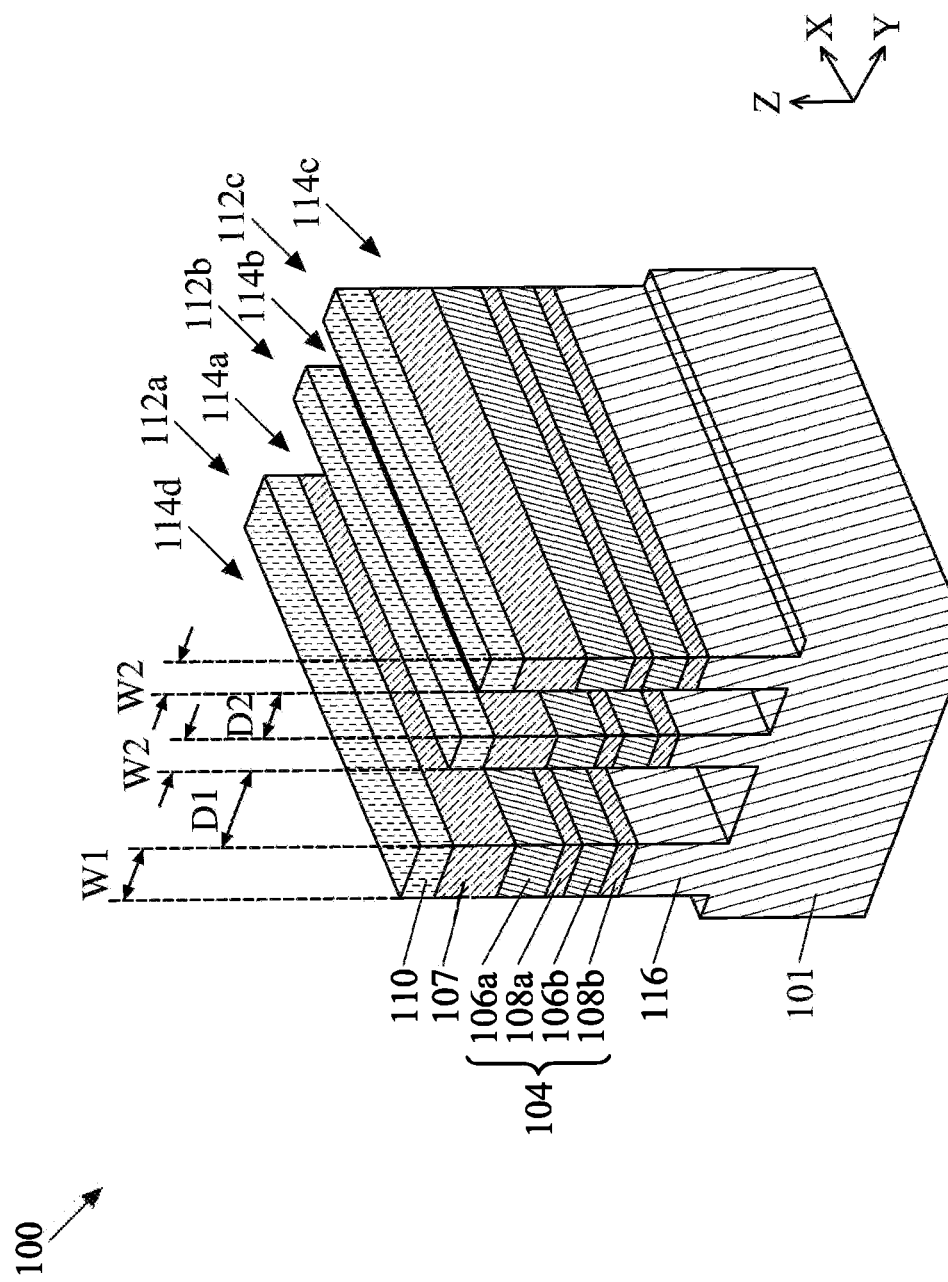

FIG. 2 is a perspective view of one of the various stages of manufacturing the semiconductor device structure 100, in accordance with some embodiments. Fin structures 112 (112a-112c) are formed from the stack of semiconductor layers 104. Each fin structure 112 has an upper portion including the semiconductor layers 106, 108 and a well portion 116 formed from the substrate 101. The fin structures 112 may be fabricated using multi-patterning operations including photo-lithography and etching processes. The etching process can include dry etching, wet etching, reactive ion etching (RIE), and/or other suitable processes. The etching process forms trenches 114 (e.g., 114a, 114b, 114c, 114d) in unprotected regions through the mask structure 110, through the stack of semiconductor layers 104, and into the substrate 101, thereby leaving the plurality of extending fin structures 112 (e.g., 112a, 112b, 112c). The trenches 114 extend along the X direction. The trenches 114 may be etched using a dry etch (e.g., RIE), a wet etch, and/or combination thereof.

As shown in FIG. 2, the fin structure 112a may have a first width W1, and the fin structures 112b, 112c may each has a second width W2. The second width W2 may be equal, less, or greater than the first width W1. In one embodiment shown in FIG. 2, the first width W1 is greater than the second width W2. The first and second widths W1, W2 may correspond to the device's channel width. In one embodiment, the second width W2 is in a range between 5 nm to about 120 nm, for example about 10 nm to about 100 nm.

The distance between adjacent fin structures may be defined by the distance between a first sidewall of one fin structure and a second sidewall of the adjacent fin structure facing the first sidewall. For example, the fin structure 112a and the fin structure 112b are separated by a first distance D1. The fin structure 112b and the fin structure 112c are separated by a second distance D2. The first and second distances D1, D2 may vary depending on the layouts of the fin structures in a SRAM cell. The width of the fin structures 112a, 112b, 112c may also vary depending on the channel width of the devices needed in the semiconductor device structure 100. The devices with a wider channel, such as the device fabricated from the fin structures 112a, 112b, may be more suitable for high-speed applications, such as a NAND device. The devices with a narrower channel, such as the device fabricated from the fin structures 112b, 112c, may be more suitable for low-power and low-leakage applications, such as an inverter device. Therefore, trenches with wider width (e.g., trench 114a) may be formed in regions where devices/transistors require higher voltage current and/or higher performance, while trenches with narrower width (e.g., trench 114b) may be formed in regions where greater density of devices/transistors is desired.

The first distance D1 and the second distance D2 define the width of the subsequent first and second dielectric features 130, 134 (FIGS. 12A-12C). In one embodiment shown in FIG. 2, the first distance D1 is greater than the second distance D2. The second distance D2 may be in a range from about 2 nm to about 40 nm, for example about 3 nm to about 30 nm. With the smaller distance D2 (i.e., reduced fin-to-fin spacing) between the fin structures 112b and 112c, layers of a first dielectric feature 130 (FIGS. 4A-4C) subsequently formed in the trench 114b may merge, while the trench 114a between the fin structures 112a and 112b remains open after the deposition of layers of the first dielectric feature 130 due to the wider distance D1. The merged layers of the first dielectric feature 130 allow the nanosheet channels to attach to both sides of the first dielectric feature 130 and form forksheet transistors at a later stage. The reduced fin-to-fin spacing and fork-like nanosheet transistors enable greater device density (even with greater channel width) and superior area and performance scalability.

Depending on the layouts of the SRAM cell, the trenches 114c and 114d may have a width corresponding to the first distance D1 or the second distance D2. In one embodiment shown in FIG. 2, the trenches 114c, 114d have a width corresponding to the first distance D1. In some embodiments, a fin structure (not shown) having a width corresponding to W1 may be disposed adjacent to and spaced apart the fin structure 112a by the trench 114d. Likewise, a fin structure (not shown) having a width corresponding to W2 may be disposed adjacent to and spaced apart the fin structure 112c by the trench 114c.

FIGS. 3C-12C are top views of the semiconductor device structure 100 of FIG. 2, which may represent a portion of the layout of active fin structures in a SRAM cell 103. For example, a 6T SRAM cell may include two pull-up (PU) transistors, two pass-gate (PG) transistors, and two pull-down (PD) transistors. In one embodiment shown in FIGS. 3C-12C, the fin structures 112b and 112c can be used to form PU transistors and the fin structure 112a can be used to form PD transistor or PG transistor in the 6T SRAM cell. FIGS. 3A-12A are cross-sectional side views of various stages of manufacturing the semiconductor device structure 100 taken along line A-A of FIG. 3C, in accordance with some embodiments. FIGS. 3B-12B are cross-sectional side views of various stages of manufacturing the semiconductor device structure 100 taken along line B-B of FIG. 3C, in accordance with some embodiments.

In FIGS. 4A-4C, a first dielectric feature 130 is formed in the trench 114b (FIGS. 3A and 3B) between the fin structures 112b and 112c. In some embodiments, the first dielectric feature 130 includes a first dielectric layer 126, a second dielectric layer 128, and a third dielectric layer 119. The first dielectric layer 126 is in contact with at least the stack of semiconductor layers 104 (e.g., first semiconductor layers 106a-b and second semiconductor layers 108a-b), the third dielectric layer 119 is formed over the first dielectric layer 126, and the second dielectric layer 128 is formed between and in contact with the first dielectric layer 126 and the third dielectric layer 119. In some embodiment, the first dielectric layer 126 may be omitted. That is, the second dielectric layer 128 is in contact with at least the stack of semiconductor layers 104 (e.g., first semiconductor layers 106a-b and second semiconductor layers 108a-b). The first dielectric layer 126 and the third dielectric layer 119 may be formed of the same material. In some embodiments, the first and third dielectric layers 126, 119 include an oxygen-containing dielectric material such as $SiO_2$. The second dielectric layer 128 may be a low-K dielectric material (e.g., a material having a K value lower than 7). In some embodiments, the second dielectric layer 128 includes a silicon-containing dielectric material, such as SiN, SiCN, SiOC, or SiOCN. The first, second, and third dielectric layers 126, 128, 129 may be formed by any suitable deposition process, such as an ALD process or any conformal deposition process.

The first dielectric feature 130 may be formed by sequentially depositing the first and second dielectric layers 126, 128 on the exposed surfaces of the semiconductor device structure 100 and in the trenches 114a, 114b, 114c, 114d and over the fin structures 112a, 112b, 112c. The third dielectric layer 119 is then formed on the second dielectric layer 128. The third dielectric layer 119 deposits in the trench 114b at a faster rate than the trenches 114a, 114c, 114d due to the small distance D2. Therefore, the third dielectric feature 119 may completely fill the trench 114b before the trenches 114a, 114c, 114d are filled with the third dielectric layer 119. Next, the first, second, and third dielectric layer 126, 128, 119 are recessed using any suitable removal process, such as dry etch, wet, etch, or a combination thereof. The removal process may be selective etch processes that remove portions of the first, second, and third dielectric layer 126, 128, 119 but not the mask structure 110, the sacrificial layers 107, the first semiconductor layers 106, and the second semiconductor layers 108. Because the trenches 114a, 114c, 114d are not completely filled and has a larger dimension (i.e., first distance D1) in the Y direction compared to that of the trench 114b (FIG. 2), the etchant removes more of the first, second, and third dielectric layer 126, 128, 119 in the trenches 114a, 114c, 114d than the first, second, and third dielectric layer 126, 128, 119 in the trench 114b. As a result, the first, second, and third dielectric layer 126, 128, 119 in the trenches 114a, 114c, 114d are etched at a faster rate than the etch rate of the first, second, and third dielectric layer 126, 128, 119 in the trench 114b. The removal process is performed until the first, second, and third dielectric layer 126, 128, 119 in the trenches 114a, 114c, 114d are completely etched away. As a result of the removal process, the first, second, and third dielectric layer 126, 128, 119 on exposed surfaces of the semiconductor device structure 100 are removed except for the first, second, and third dielectric layer 126, 128, 119 filled in the trench 114b, as shown in FIGS. 4A and 4B. While not shown, the top of the first dielectric feature 130 may have a concave profile due to etching effects from the removal process on the first, second, and third dielectric layer 126, 128, 119.

In cases where the first dielectric feature 130 includes the first dielectric layer 126, the first dielectric layer 126 may have a thickness T1 ranging from 0.5 nm to about 5 nm. The second dielectric layer 128 may be formed with a thickness T2 greater, equal, or less than the thickness T1 of the first dielectric layer 126. In some embodiments, the second thickness T2 is greater than the thickness T1 and may be in a range from 1 nm to about 10 nm. As will be discussed in more detail below with respect to FIG. 21, exposed portions of the first dielectric layer 126 not in contact with the first semiconductor layers 106 are removed to allow a subsequent gate electrode layer to extend towards the second dielectric layer 128, which provides greater surface coverage around the first semiconductor layers 106 for a better electrical control over the nanosheet channels. If the thickness of the first dielectric layer 126 is less than about 0.5 nm, the extension of the gate electrode layer 182 might not be sufficient to provide desired electrical control over the nanosheet channels. On the other hand, if the thickness of the first dielectric layer 126 is greater than about 5 nm, the thickness of the second and third dielectric layers 128, 119 can be reduced and the manufacturing cost is increased without significant advantage.

In FIGS. 5A-5C, portions of the first, second, and third dielectric layer 126, 128, 119 are recessed by a removal process. The recess of the first, second, and third dielectric layer 126, 128, 119 may be performed by any suitable process, such as dry etch, wet etch, or a combination thereof. The removal process may be a selective process so that portions of the first, second, and third dielectric layer 126, 128, 119 are removed and the mask structures 110 and the sacrificial layers 107 are not substantially affected. The recess process may be controlled so that the tops of the first, second, and third dielectric layer 126, 128, 119 are substantially at a level below a top surface of the sacrificial layers 107 but above a top surface of the topmost first semiconductor layer 106a in the stack of semiconductor layers 104. After the removal process, recesses 131 are formed above the first, second, and third dielectric layer 126, 128, 119 and between the adjacent fin structures 112b, 112c.

Figure 6A:
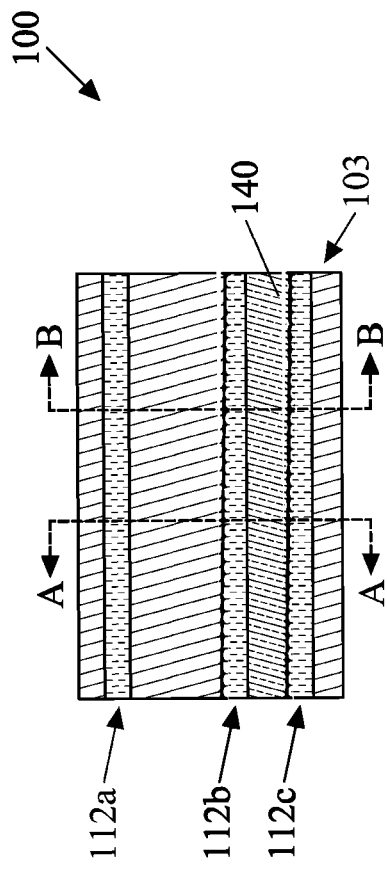
Figure 6B:
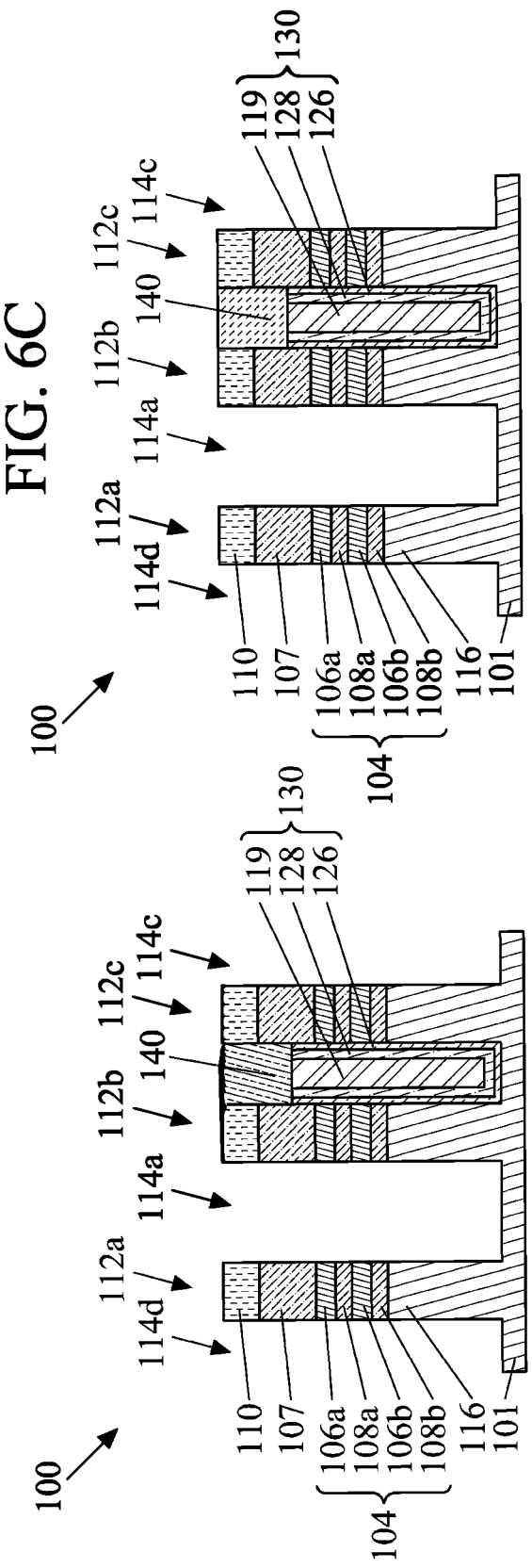
Figure 6C:

In FIGS. 6A-6C, a first high-k dielectric layer 140 is formed in each recess 131 (FIGS. 5A and 5B) formed as a result of removal of the portions of the first, second, and third dielectric layer 126, 128, 119. The first high-k dielectric layer 140 may be initially formed in the recess 131, the trenches 114a, 114c, 114d, and over the mask structure 110. Due to the small distance D2 (FIG. 2), the first high-k dielectric layer 140 fully fills the recesses 131 at a faster rate than that in the trenches 114a, 114c, 114d. Next, the first high-k dielectric layer 140 are etched back using any suitable removal process, such as dry etch, wet, etch, or a combination thereof. Because the trenches 114a, 114c, 114d are not completely filled and has a larger dimension (i.e., first distance D1) in the Y direction compared to that of the recess 131, the etchant removes the first high-k dielectric layer 140 in the trenches 114a, 114c, 114d at a faster rate than the first high-k dielectric layer 140 in the recesses 131. The removal process is performed until the high-k dielectric in the trenches 114a, 114c, 114d are completely etched away, as shown in FIGS. 6A and 6B.

The dielectric layer 140 may include a material having a k value greater than that of silicon oxide. In some embodiments, the first high-k dielectric layer 140 includes a material having a k value greater than 7. Suitable materials for the first high-k dielectric layer 140 may include, but are not limited to, SiN, SiON, SiCN, SiOCN, $AlSi_xO_y$, $Al_2O_3$, or the like. Other suitable high-k materials, such as hafnium oxide (HfO$_2$), hafnium silicate (HfSiO), hafnium silicon oxynitride (HfSiON), hafnium aluminum oxide (HfAlO), hafnium lanthanum oxide (HfLaO), hafnium zirconium oxide (HfZrO), hafnium tantalum oxide (HfTaO), hafnium titanium oxide (HfTiO), lanthanum oxide (LaO), zirconium oxide (ZrO), zirconium silicon oxide (ZrSiO), titanium oxide (TiO), tantalum oxide (Ta$_2$O$_5$), yttrium oxide (Y$_2$O$_3$), may also be used. The first high-k dielectric layer 140 may be formed by any suitable process, such as a CVD, PECVD, FCVD, or ALD process. The first high-k dielectric layer 140 may have a height along the Z direction ranging from about 10 nm to about 30 nm.

In FIGS. 7A-7C, a resist layer 141 is formed on the exposed surfaces of the semiconductor device structure 100. The resist layer 141 may be any suitable masking material, such as a photoresist layer, a BARC (bottom anti-reflective coating) layer, a SOG (spin-on-glass) layer, or a SOC (spin-on-carbon) layer, and may be deposited by spin coating or any suitable deposition technique. The resist layer 141 is patterned to expose certain regions of the semiconductor device structure 100, such as regions that has an end cut 145. The end cut 145 is formed by removing a portion of the fin structure (e.g., fin structure 112b shown in FIG. 7C) so that the remaining fin structure 112b is segmented. The segmentation isolates some of the transistors from another. The end cut 145 may be performed by protecting portions of the fin structures by the resist layer 141. The exposed portions of fin structure not covered by the resist layer 141 are removed in one or more etch processes. In one embodiment shown in FIG. 7B, the etch processes remove the fin structure 112b (e.g., the stack of semiconductor layers 104 and the well portion 116) to expose the sidewalls of the first high-k dielectric layer 140 and the first dielectric layer 126. The etch processes are performed until the top portion of the substrate 101 is exposed. In one embodiment, the top portion of the substrate 101 is removed so that an exposed top surface 115 of the substrate 101 is at a level below or slightly below an interface 117 between the first dielectric layer 126 and the substrate 101.

In FIGS. 8A-8C, after formation of the end cut 145 in the fin structure 112b, the resist layer 141 is removed using any suitable removal process, such as ashing, dry etch, wet etch, or a combination thereof. Then, an insulating material 118 is formed on the substrate 101. The insulating material 118 fills the trenches 114a, 114c, 114d, and the end cut 145 between neighboring fin structures 112 until the fin structures 112 are embedded in the insulating material 118. Then, a planarization operation, such as a chemical mechanical polishing (CMP) method and/or an etch-back method, is performed to remove the insulating material 118 and the mask structures 110 until the top of the fin structures 112 is exposed. Next, the insulating material 118 is recessed to form an isolation region (or shallow trench isolation (STI) region) 120. The recess of the insulating material 118 exposes portions of the fin structures 112, such as the stack of semiconductor layers 104. In some embodiments where the first dielectric layer 126 and the insulating material 118 are formed of the same material, a portion of the first dielectric layer 126 is also removed during the recess of the insulating material 118. As a result, sidewalls of the second dielectric layer 128 and the first high-k dielectric layer 140 are exposed. A top surface of the insulating material 118 may be level with or slightly below a surface defined between the second semiconductor layer 108b and the well portion 116 formed from the substrate 101. The insulating material 118 may be made of silicon oxide, silicon nitride, silicon oxynitride (SiON), SiOCN, SiCN, fluorine-doped silicate glass (FSG), a low-k dielectric material, or any suitable dielectric material. The insulating material 118 may be formed by any suitable method, such as low-pressure chemical vapor deposition (LPCVD), plasma enhanced CVD (PECVD) or flowable CVD (FCVD).

In FIGS. 9A-9C, a cladding layer 132 is formed on the sidewalls of the stack of semiconductor layers 104. The cladding layer 132 may be formed on the exposed surfaces of the stack of semiconductor layers 104, the sacrificial layer 107, the first high-k dielectric layer 140, and the isolation region 120. The cladding layer 132 also forms on the sidewalls of the second dielectric layer 128 and the first high-k dielectric layer 140. The cladding layer 132 may be formed by a conformal process, such as an ALD process. Next, portions of the cladding layer 132 are removed by an anisotropic etch process so that the cladding layer 132 on horizontal surfaces of the fin structures 112a, 112b, 112c (e.g., top surfaces of the sacrificial layer 107), the first high-k dielectric layer 140, and the insulating material 118 is removed. The removal process does not remove the cladding layer 132 formed on the vertical surfaces (e.g., the sidewalls) of the fin structures 112a, 112b, 112c, the second dielectric layer 128, and the first high-k dielectric layer 140. The cladding layer 132 may have a thickness ranging from about 2 nm to about 20 nm, for example about 5 nm to about 13 nm. In some embodiments, the cladding layer 132 includes a semiconductor material. In some embodiments, the cladding layer 132 and the second semiconductor layers 108 are made of the same material having the same etch selectivity. For example, the cladding layer 132 and the second semiconductor layers 108 include SiGe. The cladding layer 132 and the second semiconductor layer 108 may be removed subsequently to create space for the gate electrode layer.

In FIGS. 10A-10C, a second dielectric feature 134 is formed in the trenches 114a, 114c, 114d (FIGS. 9A and 9B) and the region above the end cut 145 (FIG. 9B). The second dielectric feature 134 includes a fourth dielectric layer 136 and a fifth dielectric layer 138 formed on the fourth dielectric layer 136. The fourth dielectric layer 136 may include the same material and have substantially the same thickness as the second dielectric layer 128. The fifth dielectric layer 138 may include the same material as the third dielectric layer 119. The fourth dielectric layer 136 may be formed on the isolation region 120, the cladding layer 132, the sacrificial layer 107, and the first high-k dielectric layer 140, by a conformal process, such as an ALD process. The fifth dielectric layer 138 is then formed on the fourth dielectric layer 136 in the trenches 114a, 114c, 114d, and over the fin structures 112a, 112b, 112c and the first dielectric feature 130, by a flowable process, such as an FCVD process. Next, a planarization process, such as a CMP process, is performed until the sacrificial layer 107 is exposed.

In FIGS. 11A-11C, portions of the second dielectric feature 134 are removed using any suitable etch-back process, such as a dry etch, wet etch, or a combination thereof. The etch-back process may be one or more selective etch processes that remove the fourth and fifth dielectric layers 136, 138 but not the cladding layers 132, the sacrificial layers 107, and the first high-k dielectric layer 140. The etch-back process is performed so that the tops of the fourth and fifth dielectric layers 136, 138 are at substantially the same level as the tops of the first dielectric feature 130. The etch-back process forms a recess above the fourth and fifth dielectric layers 136, 138 and between the adjacent cladding layers 132. Next, a second high-k dielectric layer 143 is formed in each recess formed as a result of removal of the portions of the fourth and fifth dielectric layers 136, 138.

Portions of the second high-k dielectric layer 143 formed over the sacrificial layers 107, the cladding layers 132, and the first high-k dielectric layer 140 are then removed by a planarization process so that the top surfaces of the sacrificial layers 107, the cladding layers 132, and the first high-k dielectric layer 140 are substantially co-planar with the top surfaces of the second high-k dielectric layer 143. The second high-k dielectric layer 143 may include or be formed of the same material as the first high-k dielectric layer 140. The first high-k dielectric layer 140 and the first dielectric feature 130 together may be referred to as a first dielectric structure 147. Likewise, the second high-k dielectric layer 143 and the second dielectric feature 134 together may be referred to as a second dielectric structure 149.

In FIGS. 12A-12C, the sacrificial layers 107 and portions of the cladding layers 132 are removed. The removal of the sacrificial layers 107 and the recess of the cladding layers 132 may be performed by any suitable etch-back process, such as dry etch, wet etch, or a combination thereof. The etch process may be controlled so that the remaining cladding layers 132 are substantially at the same level as the top surface of the topmost first semiconductor layer 106a in the stack of semiconductor layers 104. The top of the cladding layer 132 above the end cuts 145 and between the first and second dielectric structures 147, 149 may be at a level higher than the tops of the remaining cladding layers 132 due to the narrower spacing. In cases where the cladding layers 132 and the sacrificial layers 107 are made of SiGe, the etch-back process may be a selective etch process that removes the cladding layers 132 and the sacrificial layers 107, but does not remove the layers of the first and second dielectric structures 147, 149. The removal of the sacrificial layers 107 and the cladding layer 132 exposes the top surfaces of the fin structures 112a, 112b, 112c, and a portion of the first and fourth dielectric layers 126, 136.

FIG. 13 is a perspective view of one of various stages of manufacturing the semiconductor device structure 100, in accordance with some embodiments. FIGS. 14D-19D are top views of the semiconductor device structure 100 of FIG. 13, which may represent a portion of the layout of fin structures in the SRAM cell 103. FIGS. 14A-19A are cross-sectional side views of various stages of manufacturing the semiconductor device structure 100 taken along line A-A of FIG. 14D and line A-A of FIG. 13, in accordance with some embodiments. FIGS. 14B-19B are cross-sectional side views of various stages of manufacturing the semiconductor device structure 100 taken along line B-B of FIG. 14D, in accordance with some embodiments. FIGS. 14C-19C are cross-sectional side views of various stages of manufacturing the semiconductor device structure 100 taken along line C-C of FIG. 13.

Figures 14A, 14B:
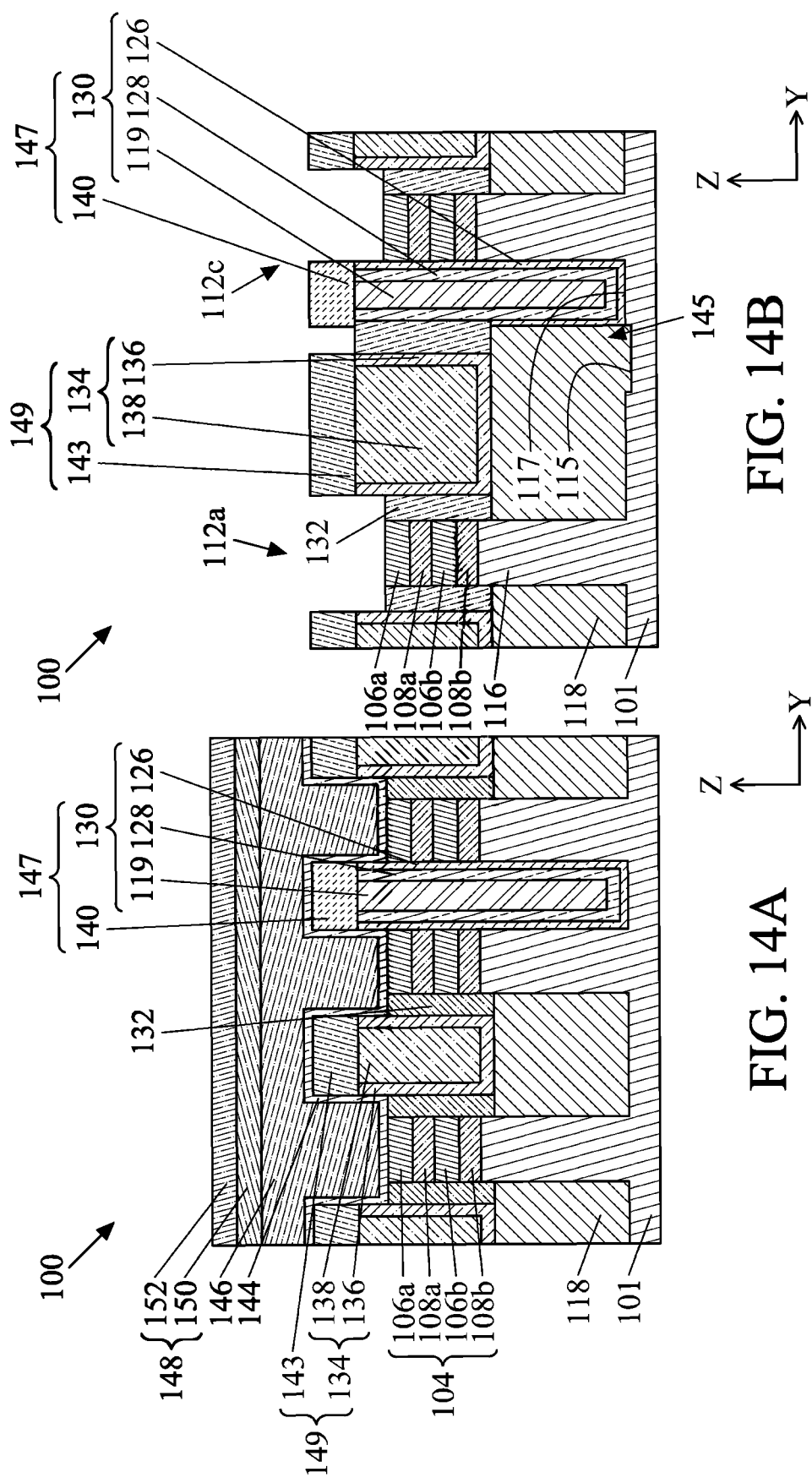

As shown in FIGS. 13 and 14A, one or more sacrificial gate stacks 142 are formed on the semiconductor device structure 100. The sacrificial gate stacks 142 may each include a sacrificial gate dielectric layer 144, a sacrificial gate electrode layer 146, and a mask structure 148. The sacrificial gate dielectric layer 144 may include one or more layers of dielectric material, such as $SiO_2$, SiN, a high-k dielectric material, and/or other suitable dielectric material. In some embodiments, the sacrificial gate dielectric layer 144 may be deposited by a CVD process, a sub-atmospheric CVD (SACVD) process, a FCVD process, an ALD process, a PVD process, or other suitable process. The sacrificial gate electrode layer 146 may include polycrystalline silicon (polysilicon). The mask structure 148 may include an oxygen-containing layer 150 and a nitrogen-containing layer 152. The sacrificial gate electrode layer 146 and the mask structure 148 may be formed by various processes such as layer deposition, for example, CVD (including both LPCVD and PECVD), PVD, ALD, thermal oxidation, e-beam evaporation, or other suitable deposition techniques, or combinations thereof.

The sacrificial gate stacks 142 may be formed by first depositing blanket layers of the sacrificial gate dielectric layer 144, the sacrificial gate electrode layer 146, and the mask structure 148, followed by pattern and etch processes. By patterning the sacrificial gate stack 142, the stacks of semiconductor layers 104 of the fins 112a, 112b, 112c are partially exposed on opposite sides of the sacrificial gate stack 142. While two sacrificial gate stacks 142 are shown, the number of the sacrificial gate stacks 142 is not limited to two. More than two sacrificial gate stacks 142 may be arranged along the X direction in some embodiments. Next, a spacer 154 is formed on sidewalls of the sacrificial gate stacks 142, as shown in FIGS. 13, 14C, and 14D. The spacer 154 may be formed by first depositing a conformal layer (e.g., by an ALD process) that is subsequently etched back (e.g., by RIE) to form sidewall spacers 154. During the anisotropic etch process, most of the spacer 154 is removed from horizontal surfaces, such as the tops of the fin structures 112a, 112b, 112c, the cladding layers 132, the first and second dielectric structures 147, 149, leaving the spacers 154 on the vertical surfaces, such as the sidewalls of sacrificial gate stacks 142. The spacer 154 may be made of a dielectric material such as silicon oxide, silicon nitride, silicon carbide, silicon oxynitride, SiCN, silicon oxycarbide, SiOCN, and/or combinations thereof.

Figures 15A, 15B:
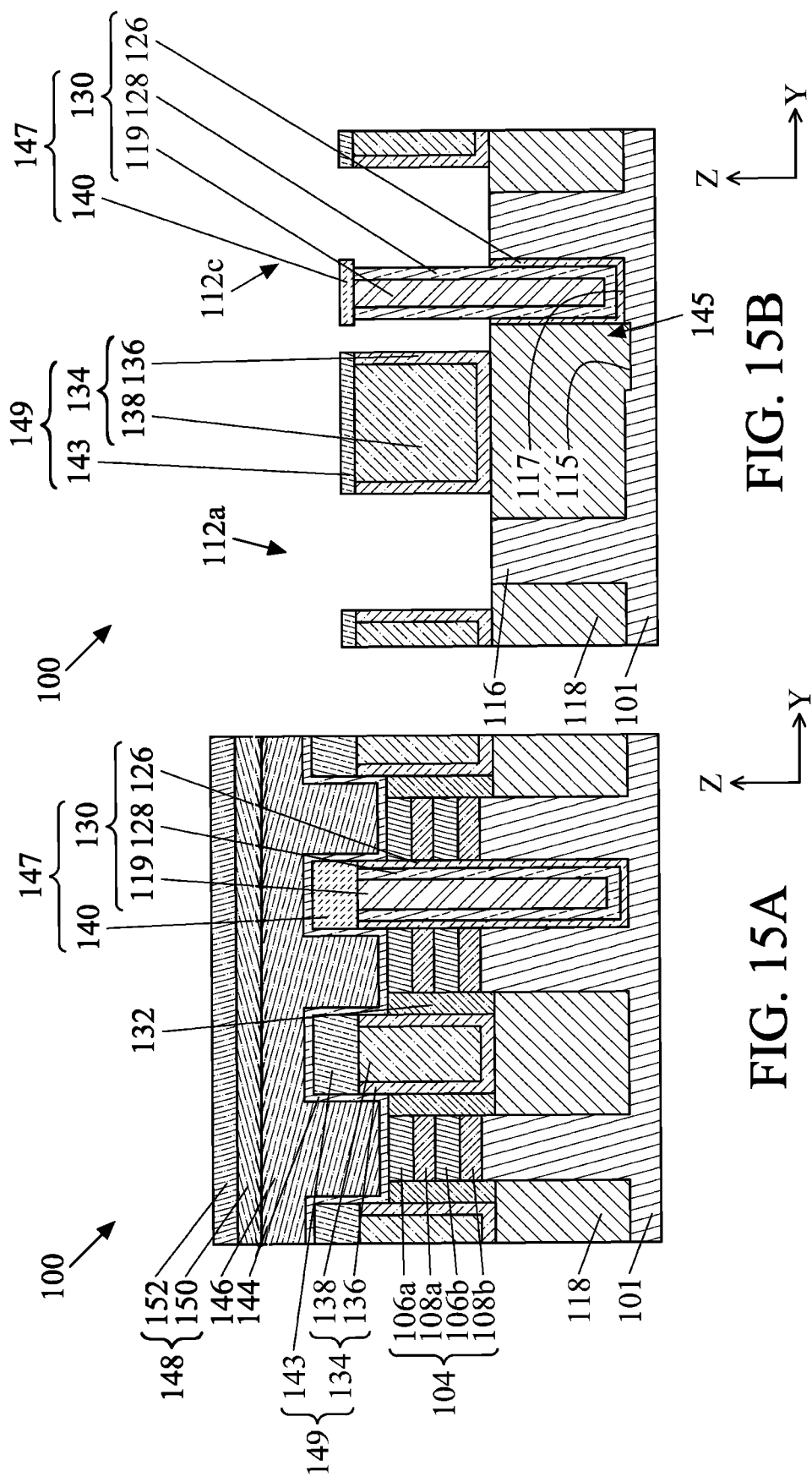
Figures 16A, 16B:
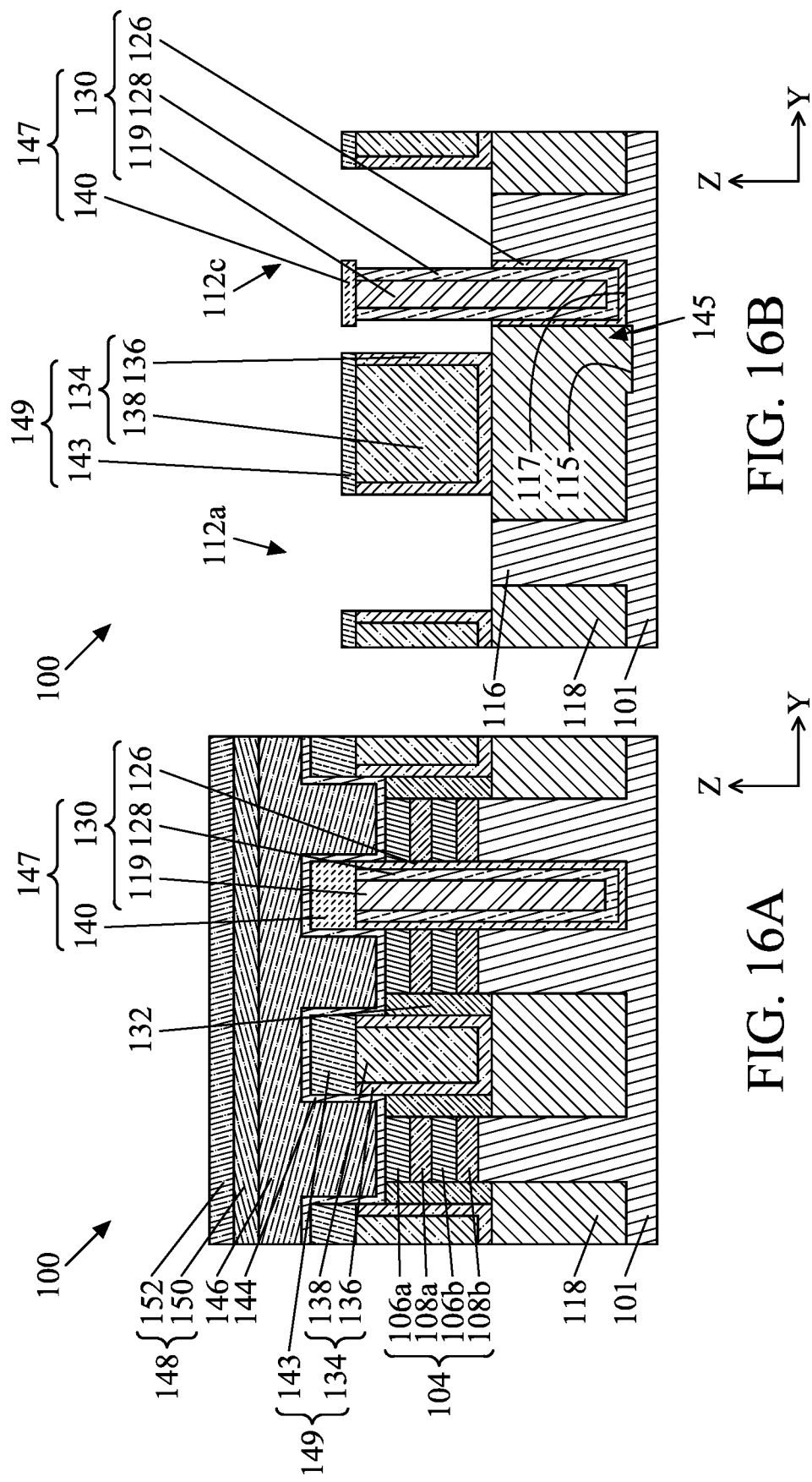
Figures 16C, 16D:
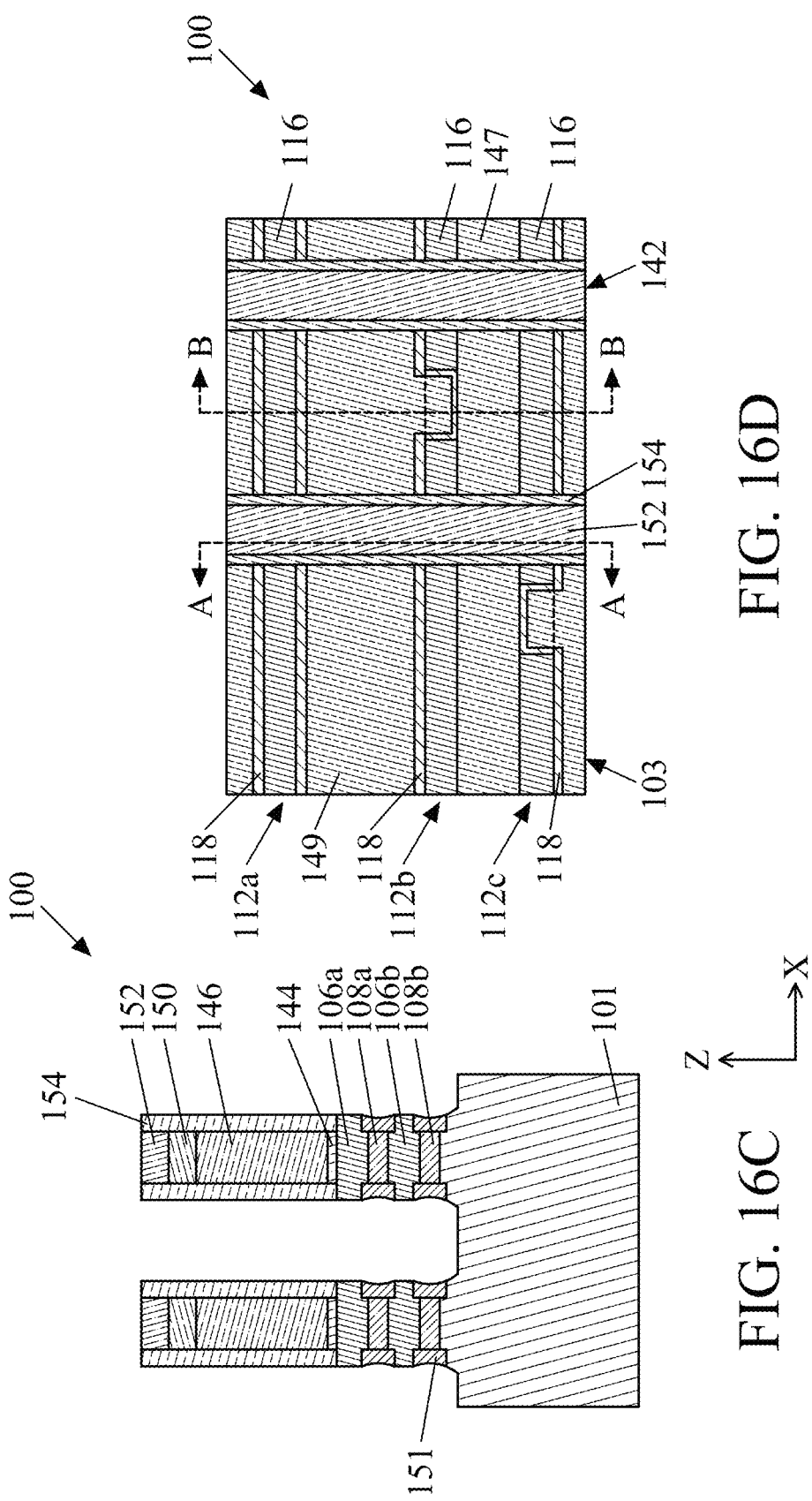
Figures 17A, 17B:
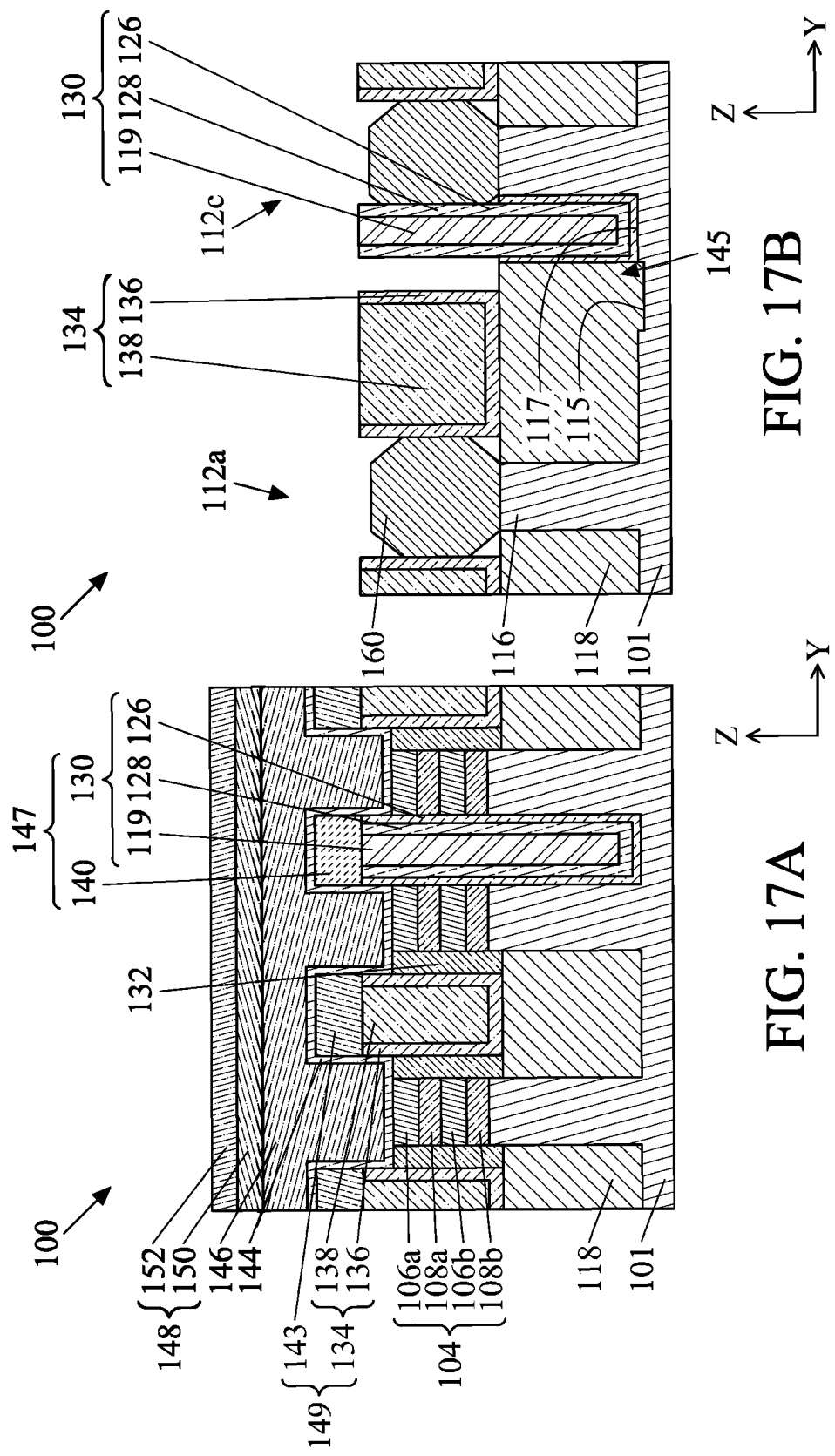
Figures 17C, 17D:
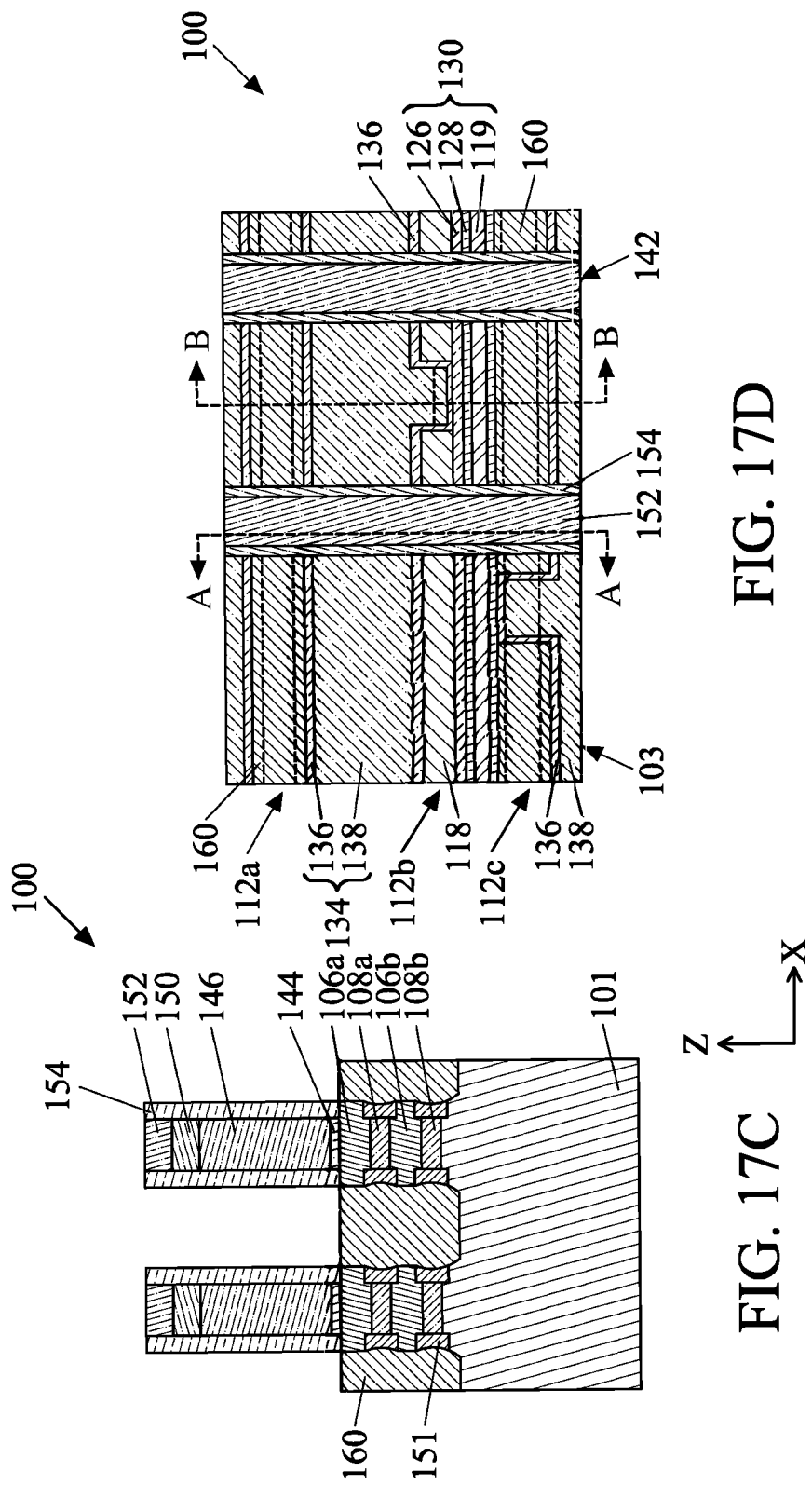
Figures 18C, 18D:
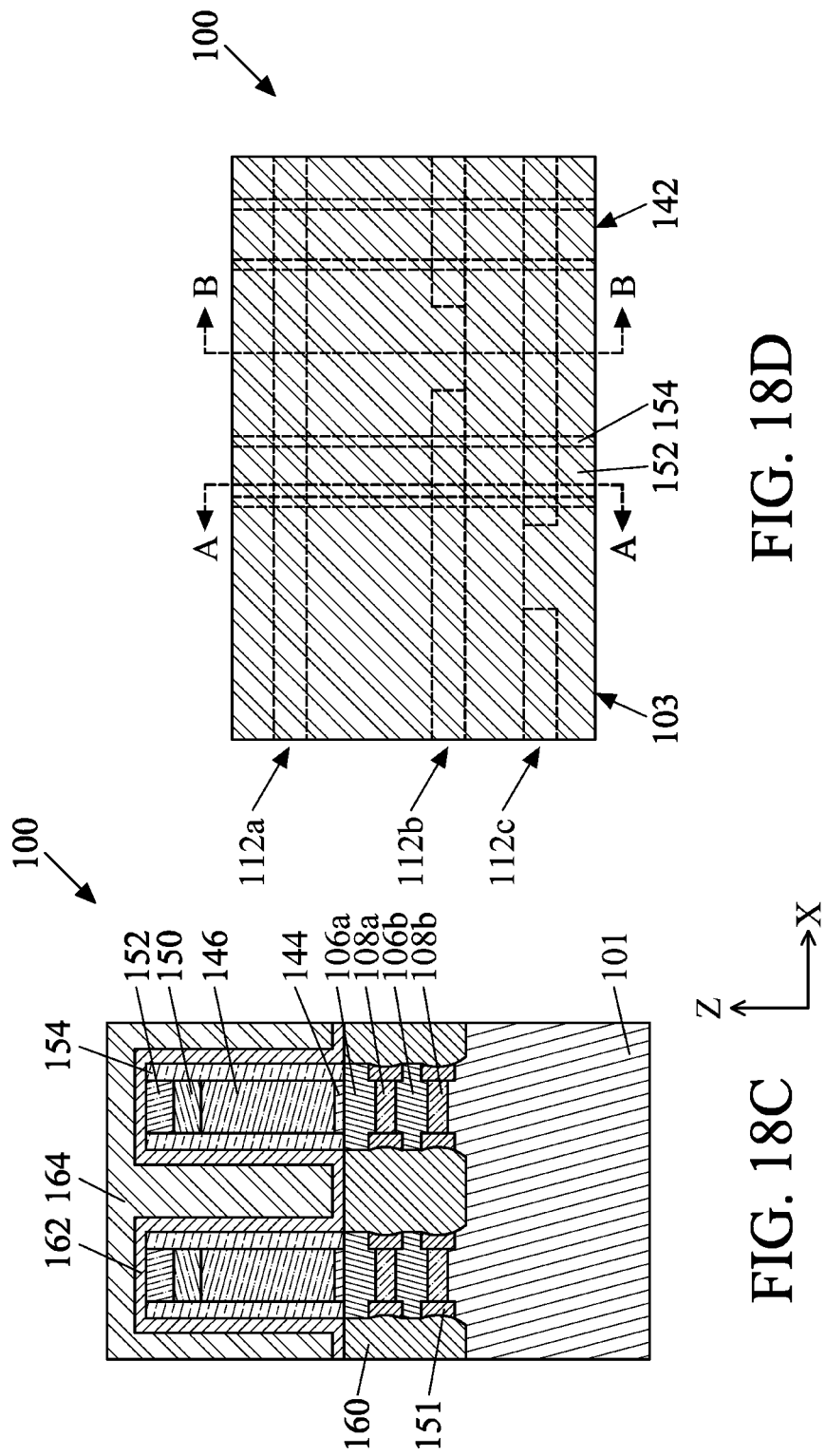

In FIGS. 15A-15D, exposed portions of the fin structures 112, exposed portions of the cladding layers 132, and exposed portions of the first and second dielectric structures 147, 149 not covered by the sacrificial gate stacks 142 and the spacers 154 are selectively recessed by using one or more suitable etch processes, such as dry etch, wet etch, or a combination thereof. In some embodiments, exposed portions of the stacks of semiconductor layers 104 of the fin structures 112 are removed, exposing portions of the well portions 116, as shown in FIG. 15B. In some embodiments, the exposed portions of the fin structures 112 are recessed to a level at or slightly below the top surface of the insulating material 118.

In FIGS. 16A-16D, edge portions of each second semiconductor layer 108 (e.g., 108a, 108b) of the stack of semiconductor layers 104 are removed horizontally along the X direction. The removal of the edge portions of the second semiconductor layers 108 forms cavities. In some embodiments, the portions of the second semiconductor layers 108 are removed by a selective wet etching process. In cases where the second semiconductor layers 108 are made of SiGe and the first semiconductor layers 106 are made of silicon, the second semiconductor layer 108 can be selectively etched using a wet etchant such as, but not limited to, ammonium hydroxide ($NH_4OH$), tetramethylammonium hydroxide (TMAH), ethylenediamine pyrocatechol (EDP), or potassium hydroxide (KOH) solutions.

After removing edge portions of each second semiconductor layers 108, a dielectric layer is deposited in the cavities to form dielectric spacers 151. The dielectric spacers 151 may be made of a low-K dielectric material, such as SiON, SiCN, SiOC, SiOCN, or SiN. The dielectric spacers 151 may be formed by first forming a conformal dielectric layer using a conformal deposition process, such as ALD, followed by an anisotropic etching to remove portions of the conformal dielectric layer other than the dielectric spacers 151. The dielectric spacers 151 are protected by the first semiconductor layers 106 during the anisotropic etching process. The remaining second semiconductor layers 108 (e.g., 108a, 108b) are capped between the dielectric spacers 151 along the X direction.

In FIGS. 17A-17D, epitaxial S/D features 160 are formed on the well portions 116 of the fin structures 112a, 112b, 112c. The epitaxial S/D features 160 may be the S/D regions. For example, one of a pair of epitaxial S/D features 160 located on one side of the stack of semiconductor layers 104 can be a source region, and the other of the pair of epitaxial S/D features 160 located on the other side of the stack of semiconductor layers 104 can be a drain region. A pair of epitaxial S/D features 160 includes a source epitaxial feature 160 and a drain epitaxial feature 160 connected by the nanosheet channels (i.e., the first semiconductor layers 106). In this disclosure, a source and a drain are interchangeably used, and the structures thereof are substantially the same.

For n-channel FETs, the epitaxial S/D features 160 may include one or more layers of Si, SiP, SiC, SiCP, or a group III-V material (InP, GaAs, AlAs, InAs, InAlAs, InGaAs). In some embodiments, the epitaxial S/D features 160 may be doped with n-type dopants, such as phosphorus (P), arsenic (As), etc., for n-type devices. For p-channel FETs, the epitaxial S/D features 160 may include one or more layers of Si, SiGe, SiGeB, Ge, or a group III-V material (InSb, GaSb, InGaSb). In some embodiments, the epitaxial S/D features 160 may be doped with p-type dopants, such as boron (B). The epitaxial S/D features 160 may grow both vertically and horizontally to form facets, which may correspond to crystalline planes of the material used for the substrate 101. The epitaxial S/D features 160 may be formed by an epitaxial growth method using CVD, ALD or MBE.

After the formation of the epitaxial S/D features 160, the first and second high-k dielectric layers 140, 143 are removed to reduce the overall k value of the semiconductor device structure 100. The first and second high-k dielectric layers 140, 143 may be removed using any suitable removal process, such as dry etch, wet etch, or a combination thereof. The removal process may be a selective etch process that removes the first and second high-k dielectric layers 140, 143 but not the first, second, fourth dielectric layer 126, 128, 136, the insulating material 118, and the well portion 116 of the substrate 101. The removal of the first and second high-k dielectric layers 140, 143 exposes the tops of the second, third, fourth, and fifth dielectric layers 128, 119, 136, 138.

In FIGS. 18A-18D, a contact etch stop layer (CESL) 162 is formed on the epitaxial S/D features 160, the tops of the second, third, fourth, and fifth dielectric layers 128, 119, 136, 138, and the nitrogen-containing layer 152 of the mask structure 148. The CESL 162 is also formed on a portion of the insulating material 118 and the first dielectric layer 126 adjacent the end cuts 145. The CESL 162 may include an oxygen-containing material or a nitrogen-containing material, such as silicon nitride, silicon carbon nitride, silicon oxynitride, carbon nitride, silicon oxide, silicon carbon oxide, or the like, or a combination thereof. The CESL 162 may be formed by CVD, PECVD, ALD, or any suitable deposition technique. In some embodiments, the CESL 162 is a conformal layer formed by the ALD process. Next, an interlayer dielectric (ILD) layer 164 is formed on the CESL 162. The materials for the ILD layer 164 may include an oxide formed from tetraethylorthosilicate (TEOS), un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 164 may be deposited by a PECVD process or other suitable deposition technique. In some embodiments, after formation of the ILD layer 164, the semiconductor device structure 100 may be subject to a thermal process to anneal the ILD layer 164.

In FIGS. 19A-19D, a planarization process, such as a CMP process, is performed until the tops of the sacrificial gate electrode layer 146 and the spacers 154 are exposed. The planarization process removes portions of the ILD layer 164 and the CESL 162 disposed on the sacrificial gate stacks 142. In some embodiments, the ILD layer 164 may be recessed to a level at the top of the sacrificial gate electrode layer 146. In such cases, a nitrogen-containing layer (not shown), such as a SiCN layer, may be formed on the recessed ILD layer 164 to protect the ILD layer 164 during subsequent etch processes.

Figures 19A, 19B:
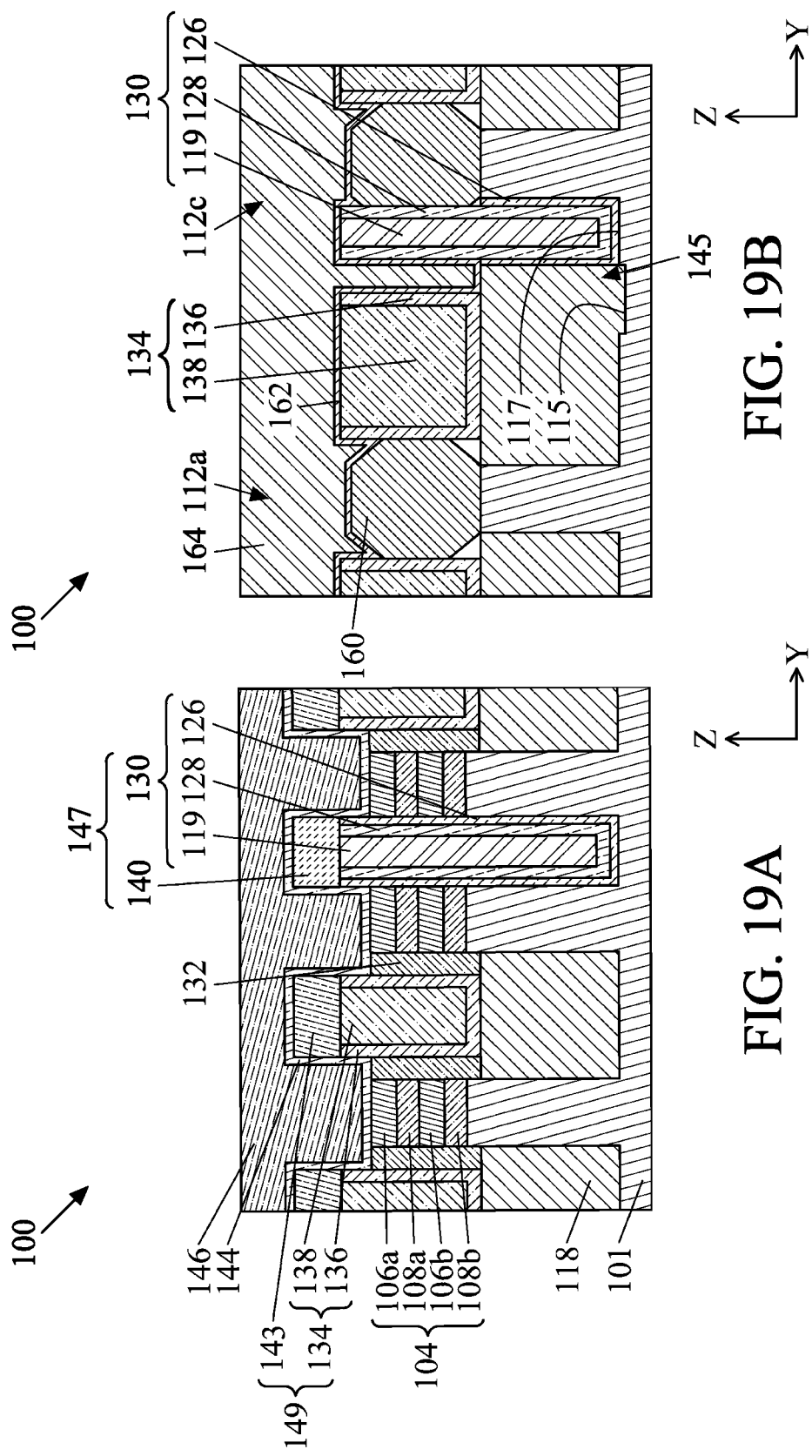
Figure 20:
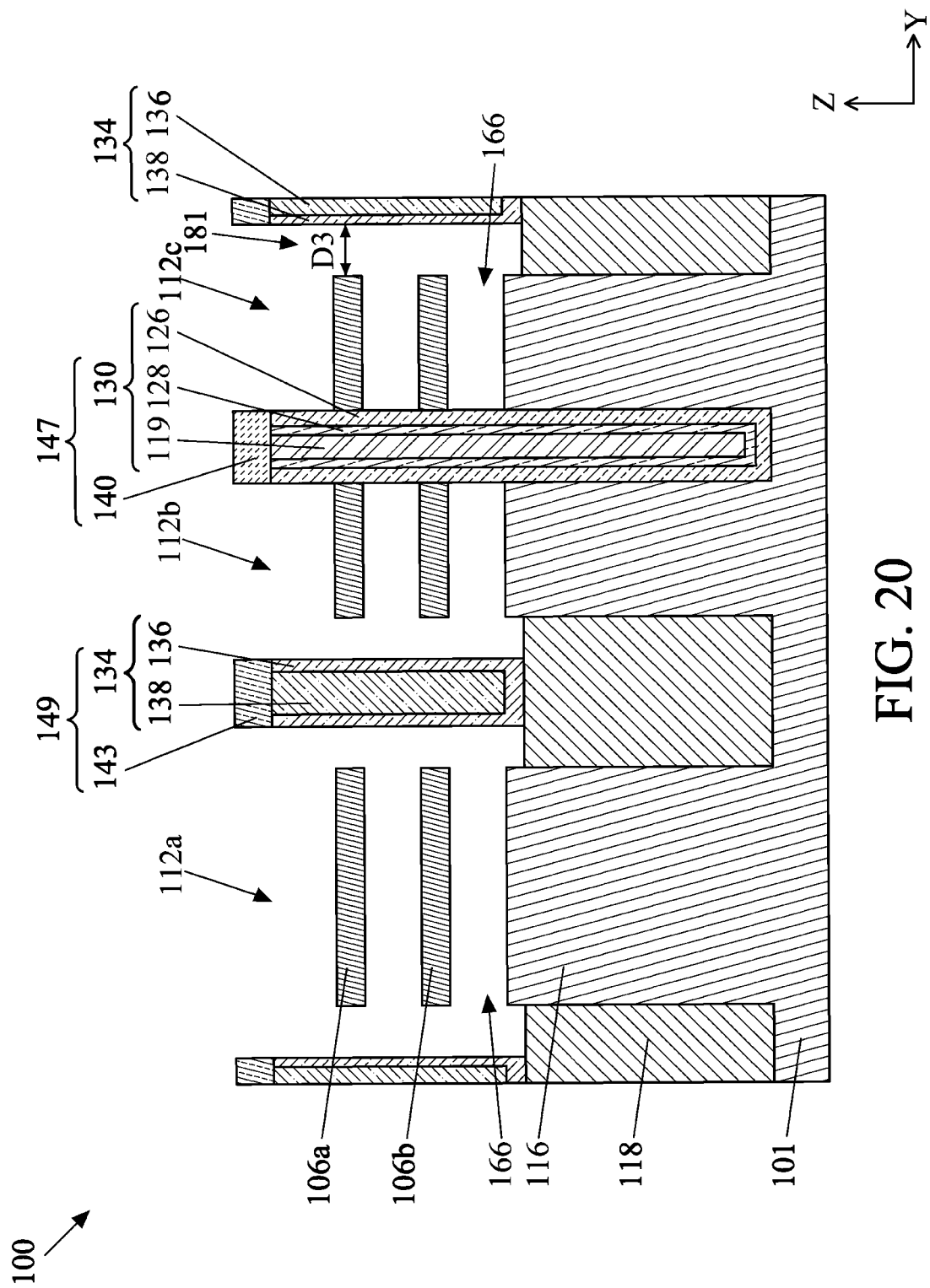
FIGS. 20-25 are cross-sectional views of various stages of manufacturing the semiconductor device structure of FIG. 19A in accordance with some embodiments.

FIGS. 20-25 are cross-sectional views of various stages of manufacturing the semiconductor device structure 100 of FIG. 19A in accordance with some embodiments. In FIG. 20, the sacrificial gate electrode layer 146 (FIGS. 19A and 19C) and the sacrificial gate dielectric layer 144 (FIGS. 19A and 19C) are removed, exposing the top surfaces of the cladding layers 132 and the stacks of semiconductor layers 104 (e.g., topmost first semiconductor layer 106a). The sacrificial gate electrode layer 146 may be first removed by any suitable process, such as dry etch, wet etch, or a combination thereof, followed by the removal of the sacrificial gate dielectric layer 144, which may be performed by any suitable process, such as dry etch, wet etch, or a combination thereof. In some embodiments, a wet etchant such as a tetramethylammonium hydroxide (TMAH) solution can be used to selectively remove the sacrificial gate electrode layer 146 but not the spacers 154, the first and second dielectric structures 147, 149, the CESL 162, and the ILD layer 164.

Next, the cladding layers 132 and the second semiconductor layers 108 are removed. The removal process exposes portions of the first and second dielectric structures 147, 149 (e.g., the first and fourth dielectric layers 126, 136, and first and second high-k dielectric layers 140, 143), the first semiconductor layers 106, and a portion of the insulating material 118. The removal process may be any suitable processes, such as dry etch, wet etch, or a combination thereof. The removal process may be a selective etch process that removes the cladding layers 132 and the second semiconductor layers 108 but not the first semiconductor layers 106, the spacers 154, the first dielectric features 130, the second dielectric features 134, and the CESL 162. In cases where the cladding layers 132 and the second semiconductor layers 108 are made of SiGe, and the first semiconductor layers 106 are made of silicon, a selective wet etching including an ammonia and hydrogen peroxide mixtures (APM) may be used. As a result of the etch process, openings 166 are formed, leaving the first semiconductor layers 106 (e.g., first semiconductor layers 106a, 106b) protruded from opposing sides of the first dielectric feature 130. Specifically, each of the first semiconductor layers 106a, 106b has a first end in contact with the first dielectric layer 126 and a second end (i.e., distal end) extending away from the first end, as shown in FIG. 20. Having the first end of the first semiconductor layers 106a, 106b directly connected to a portion of the first dielectric feature 130 saves the space for subsequent metal gate and increases the overall pattern density. The portions of the first semiconductor layers 106 not covered by the dielectric spacers 151 are exposed in the openings 166. Each first semiconductor layer 106 serves as a nanosheet channel of the nanosheet transistor/fork-like gate nanosheet transistor.

Upon removal of the cladding layers 132 and the second semiconductor layers 108, an end cap region 181 is formed between distal ends of the first semiconductor layers 106 (e.g., first semiconductor layers 106a, 106b) and sidewalls of the second dielectric features 134. In some embodiments, the end cap region 181 has a distance D3 along the Y direction ranging between about 2 nm to about 15 nm. That is, the second dielectric structure 149 is spaced apart from the distal ends of the first semiconductor layers 106 by the distance D3. The distance D3 is variable depending on the thickness of the cladding layer 132. If the spacing D3 is less than 2 nm, the subsequent IL 178 and HK dielectric layer 180 (FIG. 22) may immaturely block the end cap regions 181 at distal ends of the topmost first semiconductor layer 106a, which in turn prevents the subsequent layers (e.g., gate electrode layer 182) from getting in and forming around the first semiconductor layers 106a, 106b.

Figure 21:
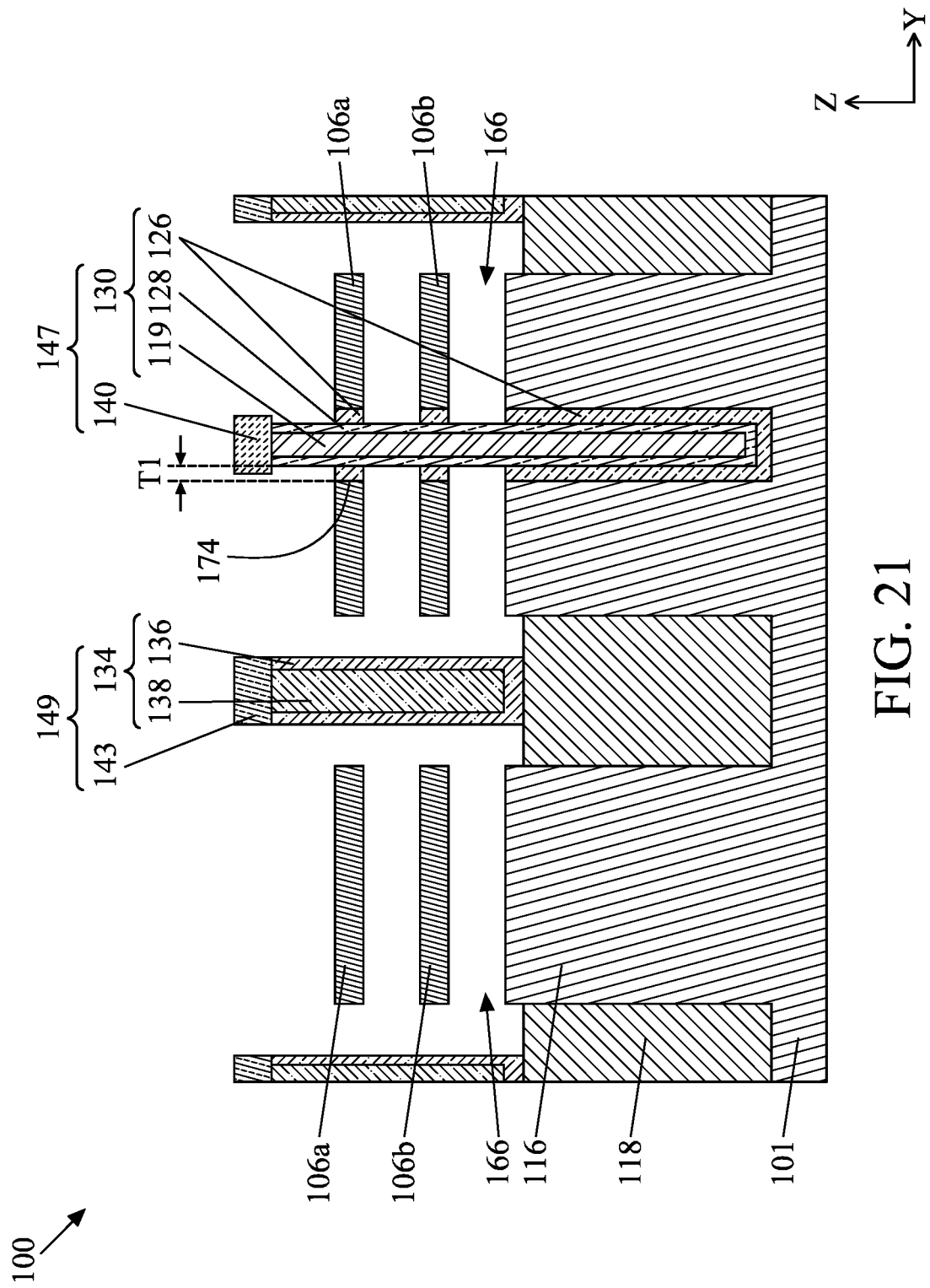

In FIG. 21, after the removal of the cladding layers 132 and the second semiconductor layers 108, portions of the first dielectric layer 126 are removed by a removal process. The removal process is a controlled isotropic process so that exposed portions of the first dielectric layer 126 (e.g., portions of the first dielectric layer 126 exposed to the opening 166) are removed, while the first dielectric layer 126 between the second dielectric layer 128 and the first semiconductor layers 106a, 106b remains substantially intact. That is, portions of the first dielectric layer 126 not in contact with the first semiconductor layers 106a, 106b are entirely removed by the removal process. The removal process may be a selective etch process that removes the first dielectric layer 126 but not the first semiconductor layers 106a, 106, the spacers 154, second dielectric layer 128 and the fourth dielectric layer 136, and the CESL 162. The removal of the exposed first dielectric layer 126 increases the surface coverage of the gate electrode layer 182 (FIG. 22) around at least three surfaces of the first semiconductor layers 106a, 106b. Particularly, the removal of the exposed first dielectric layer 126 allows the gate electrode layer 182 to extend towards the second dielectric layer 128 and over a plane defined by an interface 174 between the first dielectric layer 126 and the first semiconductor layers 106a, 106b. Since the gate electrode layer 182 provides greater surface coverage around the first semiconductor layer 106a, 106b, a better electrical control over the nanosheet channels (e.g., first semiconductor layers 106a, 106b) is achieved and thus leakage in the off state is reduced.

Figure 22:
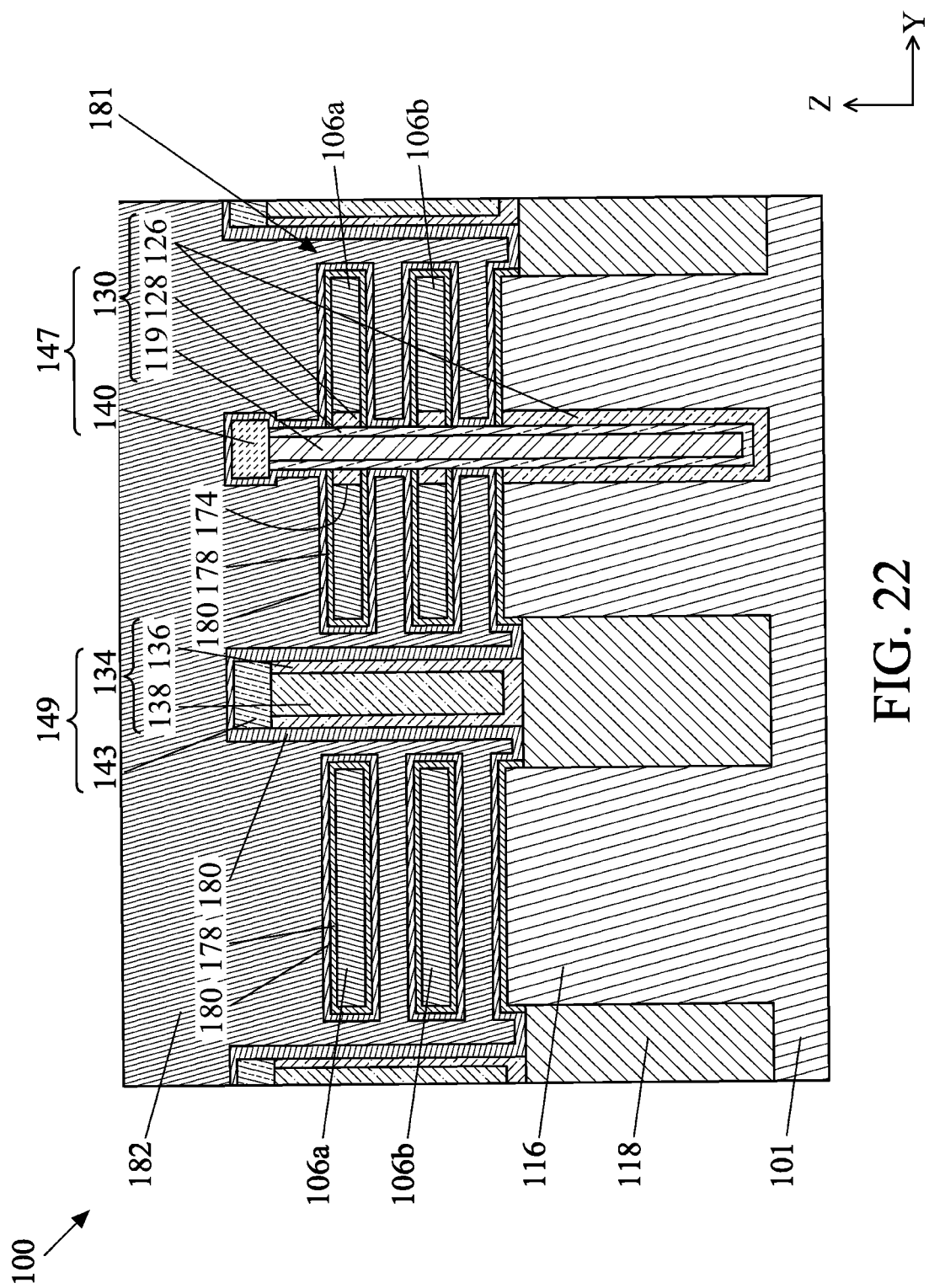

In FIG. 22, an interfacial layer (IL) 178 is formed to surround at least three surfaces (except for the surfaces being in contact with the first dielectric layer 126 and with the epitaxial S/D features 160) of the first semiconductor layers 106 (e.g., first semiconductor layers 106a, 106b). The IL 178 may also form on the exposed first dielectric layer 126 (e.g., first dielectric layer 126 disposed between the second dielectric layer 128 and the first semiconductor layers 106a, 106b) and the exposed surfaces of the well portion 116 of the substrate 101. In some embodiments, the IL 178 may form on the first semiconductor layers 106 but not on the exposed first dielectric layer 126. The IL 178 may include or be made of an oxygen-containing material or a silicon-containing material, such as silicon oxide, silicon oxynitride, oxynitride, hafnium silicate, etc. The IL 178 may be formed by CVD, ALD or any suitable conformal deposition technique. In one embodiment, the IL 178 is formed using ALD. The thickness of the IL 178 is chosen based on device performance considerations. In some embodiments, the IL 178 has a thickness ranging from about 0.5 nm to about 2 nm.

Next, a high-k (HK) dielectric layer 180 is formed on the exposed surfaces of the semiconductor device structure 100. In some embodiments, the HK dielectric layer 180 is formed on the IL 178, a portion of the insulating material 118, and on the exposed surfaces of the first and second dielectric structures 147, 149 (e.g., the second dielectric layers 128, the fourth dielectric layers 136, the first and second high-k dielectric layers 140, 143), as shown in FIG. 22. The HK dielectric layer 180 may include or be made of the same material as the first and second high-k dielectric layers 140, 143. The HK dielectric layer 180 may be a conformal layer formed by a conformal process, such as an ALD process or a CVD process. The HK dielectric layer 180 may have a thickness of about 0.5 nm to about 3 nm, which may vary depending on the application.

After formation of the IL 178 and the HK dielectric layer 180, a gate electrode layer 182 is formed in the openings 166 (FIG. 21). The gate electrode layer 182 is formed on the HK dielectric layer 180 to surround a portion of each first semiconductor layer 106a, 106b and on the HK dielectric layer 180 that is in contact with the first and second dielectric structures 147, 149 and the insulating material 118. The gate electrode layer 182 may include one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. The gate electrode layer 182 may be formed by PVD, CVD, ALD, electro-plating, or other suitable method. The gate electrode layer 182 is formed to a predetermined height above the first and second dielectric structures 147, 149, as shown in FIG. 22.

Figure 23:
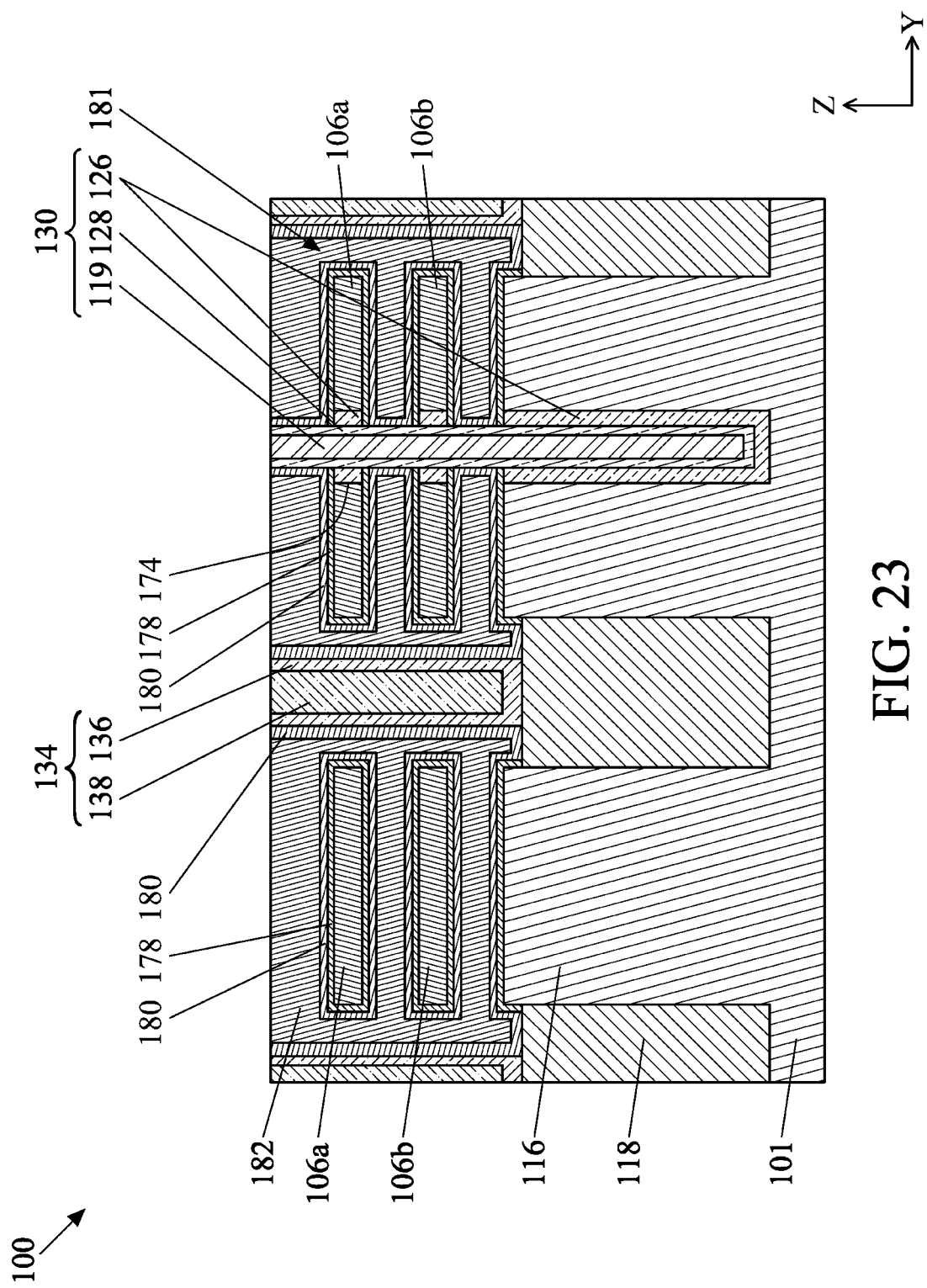

In FIG. 23, one or more metal gate etching back (MGEB) processes are performed so that the gate electrode layer 182 is recessed to the same level as the top surfaces of the first and second dielectric features 130, 134. The MGEB processes may be any suitable process, such as a dry etch, a wet etch, or a combination thereof. In some embodiments, the MGEB processes include a selective dry etch process that removes the gate electrode layer 182 but does not substantially affect the HK dielectric layer 180, the spacer 154 (FIG. 19C), and the CESL 162 (FIG. 19C), and the ILD layer 164. In some embodiments, portions of the spacers 154 may be etched back so that the top surface of the spacers 154 is higher than the top surfaces of the gate electrode layer 182 and the HK dielectric layer 180. In such cases, trenches formed above the gate electrode layer 182 as a result of the MGEB processes may be filled with a self-aligned contact (SAC) layer. The SAC layer can be formed of any dielectric material that has different etch selectivity than the CESL 162 and serves as an etch stop layer during subsequent trench and via patterning for metal contacts.

After the MGEB processes, the first and second high-k dielectric layers 140, 143, as well as a portion of the HK dielectric layer 180 formed thereon are removed. The removal process may be any suitable process, such as dry etch, wet etch, or a combination thereof. In some embodiments, the removal process is a selective etch process that removes the first and second high-k dielectric layers 140, 143, and the HK dielectric layer 180 but not the gate electrode layer 182. The removal process is performed until the top surfaces of the first and second dielectric features 130, 134 are exposed. The top surfaces of the gate electrode layer 182, the HK dielectric layer 180, and the first and second dielectric features 130, 134 are substantially coplanar after the removal process. After removal of the first and second high-k dielectric layers 140, 143, adjacent gate electrode layers 182 are separated, or cut-off, by the first and second dielectric features 130, 134, as shown in FIG. 23.

Figure 24:
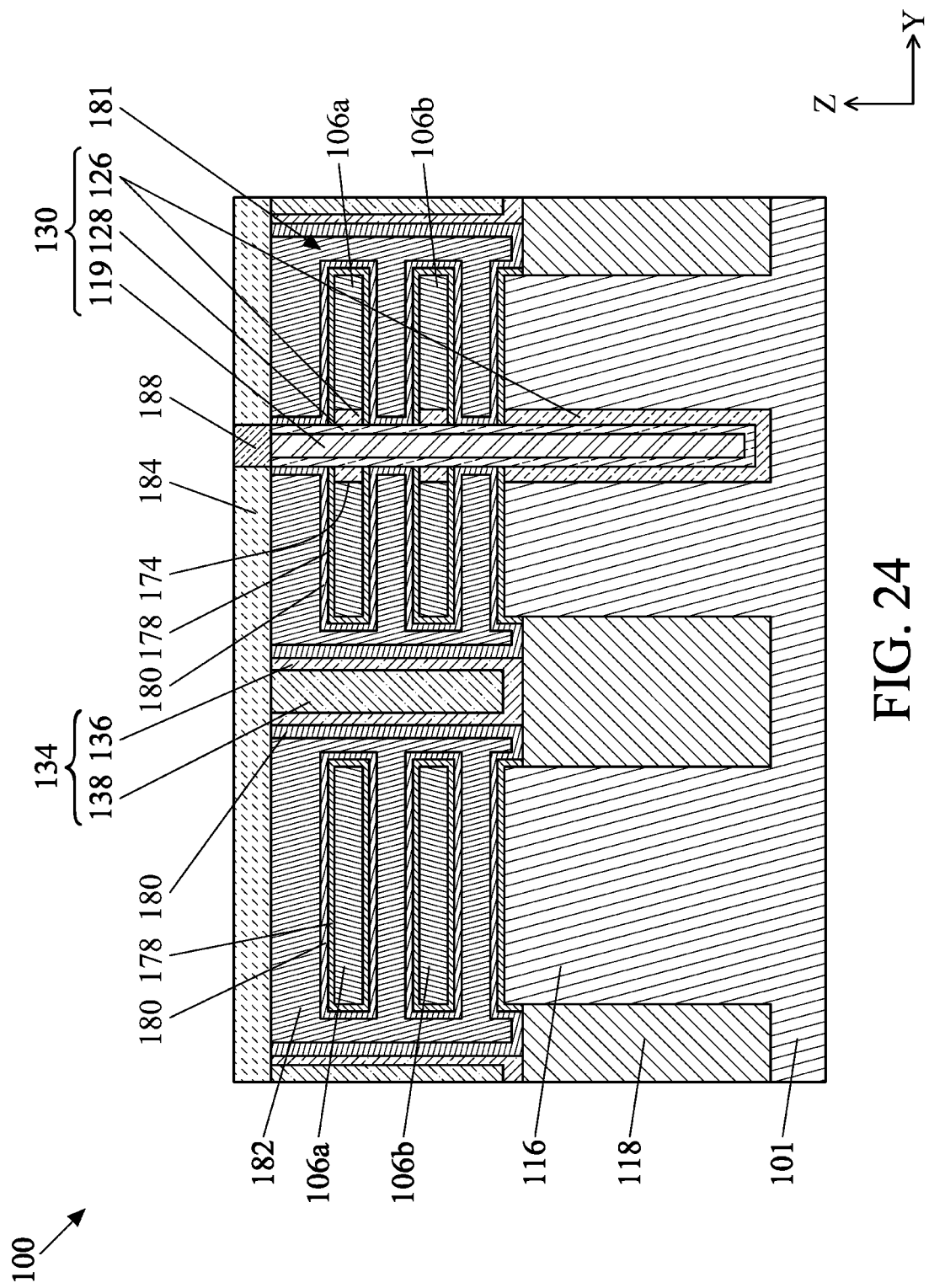

In FIG. 24, a mask 184 is formed on the exposed surfaces of the gate electrode layer 182, the first and second dielectric features 130, 134, the ILD layers 164 (FIG. 19C), the CESLs 162 (FIG. 19C), the spacers 154 (FIG. 19C), and the HK dielectric layers 180. The mask 184 may include or made of a semiconductor material, such as amorphous silicon, polysilicon, or the like, and may be formed by any suitable deposition technique, such as CVD, PECVD, MOCVD, FCVD, or MBE. In one embodiment, the mask 184 includes amorphous silicon. Next, an opening is formed in the mask 184 and a first dielectric material 188 is formed in the opening and on the mask 184. The opening exposes portions of the top surfaces of the first dielectric feature 130 (e.g., the top surfaces of the first and second dielectric layers 126, 128) and may be formed by a photolithography process and one or more etch processes. The first dielectric material 188 is in contact with (and coplanar with) top surfaces of at least the second dielectric layer 128 and the third dielectric layer 119. The first dielectric material 188 may include or be formed of a nitrogen-containing layer, such as a nitride. In some embodiments, the first dielectric material 188 includes SiN. The first dielectric material 188 formed over the mask 184 may be removed by using, for example, CMP, until a top surface of the mask 184 is exposed. While not shown, two or more openings may be formed in the mask 184 to expose top surfaces of the first dielectric features 130 disposed in other regions.

Figure 25:
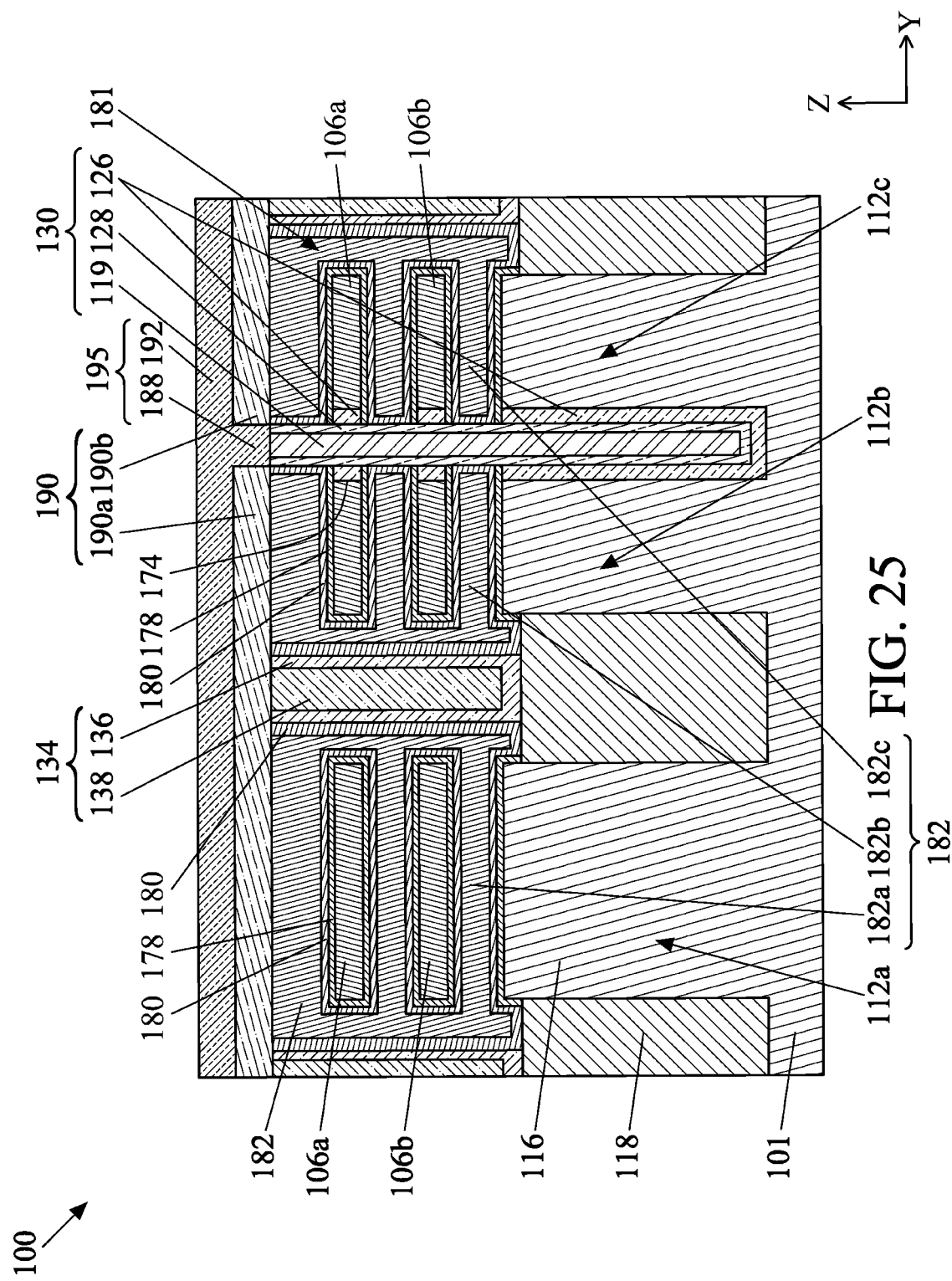

In FIG. 25, the mask 184 is removed and a conductive layer 190 is formed in the region where the mask 184 was removed. The mask 184 may be removed using any suitable process, such as a dry etch, a wet etch, or a combination thereof. In some embodiments, the removal process is a selective etch process that removes the mask 184 but does not remove the first dielectric material 188, the gate electrode layer 182, the first dielectric features 130, the second dielectric features 134, the ILD layers 164 (FIG. 19C), the CESLs 162 (FIG. 19C), the spacers 154 (FIG. 19C), and the HK dielectric layers 180. The conductive layer 190 may include or be made of a material having one or more of W, Ru, Mo, Co, Ni, Ti, Ta, Cu, Al, TiN and TaN, and may be formed by any suitable process, such as PVD, ECP, or CVD. A planarization process may then be performed until the first dielectric material 188 is exposed.

Next, a second dielectric material 192 is formed on the conductive layer 190 and the first dielectric material 188 until a desired thickness is reached. The second dielectric material 192 may include or be formed of the same material as the first dielectric material 188. In some embodiments, the second dielectric material 192 includes a nitride, such as SiN. The first dielectric material 188 and the second dielectric material 192 function as a self-aligned dielectric structure 195, as shown in FIG. 25. The conductive layer 190 may provide a signal, such as an electrical current, to the gate electrode layer 182 located therebelow. In the embodiment shown in FIG. 25, the signal can be provided to adjacent gate electrode layers 182 (e.g., gate electrode layers 182*a*, 182*b*) via the conductive layer 190. In such a case, a single signal sent to the gate electrode layer 182*a* or gate electrode layer 182*b* may control both nanosheet channel regions. Meanwhile, the self-aligned dielectric structure 195 cuts off the conductive layers 190 (i.e., conductive layers 190*a*, 190*b* are isolated from each other by the self-aligned dielectric structure 195). Since the first dielectric feature 130 also isolates the gate electrode layer 182*b* from the gate electrode layer 182*c*, a signal (e.g., an electrical current) sent to the conductive layer 190*a* and the gate electrode layers 182*a*, 182*b* in contact with the conductive layer 190*a* is not provided to or shared with the conductive layer 190*b* and the gate electrode layer 182*c* on the other side of the self-aligned dielectric structure 195.

It has been observed that when end cuts are made in fin structures before formation of a dielectric wall, the dielectric wall may be formed in a discontinuous manner and materials of sacrificial gate stacks (e.g., sacrificial gate dielectric layer and sacrificial gate electrode layer) may not properly deposit on the exposed surfaces of the semiconductor device structure due to discontinuity of the dielectric wall. As a result, small gaps or voids can be formed at regions between the sacrificial gate stacks and the discontinuous dielectric feature. When removing the cladding layers and second semiconductor layers to expose nanosheet channel, these small gaps or voids may trap portions of semiconductive materials (e.g., cladding layers 132 and second semiconductor layers 108) and become a defect source for electrical shorts. In contrast to the approach of making end cuts in the fin structures before formation of the dielectric wall, the embodiment shown in FIG. 25 proposes forming a continuous dielectric wall (e.g., first dielectric feature 130) before end cuts in the fin structures. The first dielectric feature 130 extends all the way down to the well portions 116 of the substrate 101. The first dielectric feature 130 forms one dielectric wall that isolates adjacent active fin structures (e.g., fin structures 112*b*, 112*c*), which are to be formed as a forksheet transistor in a SRAM cell. For other active fin structures (e.g., fin structures 112*a*, 112*b*), the second dielectric feature 134 is used to isolate upper part (e.g., the first semiconductor layers 106*a*, 106*b*) of the fin structures 112*a* and 112*b*, and the insulating material 118 (e.g., STI region) is used to isolate lower part (e.g., well portion 116 of the substrate 101) of the fin structures 112*a* and 112*b*. Therefore, the dielectric wall extends continuously between two fin structures for effective isolation of transistors, such as two adjacent pull-up transistors in the SRAM cell. Since the dielectric wall is formed before making end cuts on the fin structures, any defect sources for electrical shorts as discussed above are eliminated.

Figure 26:
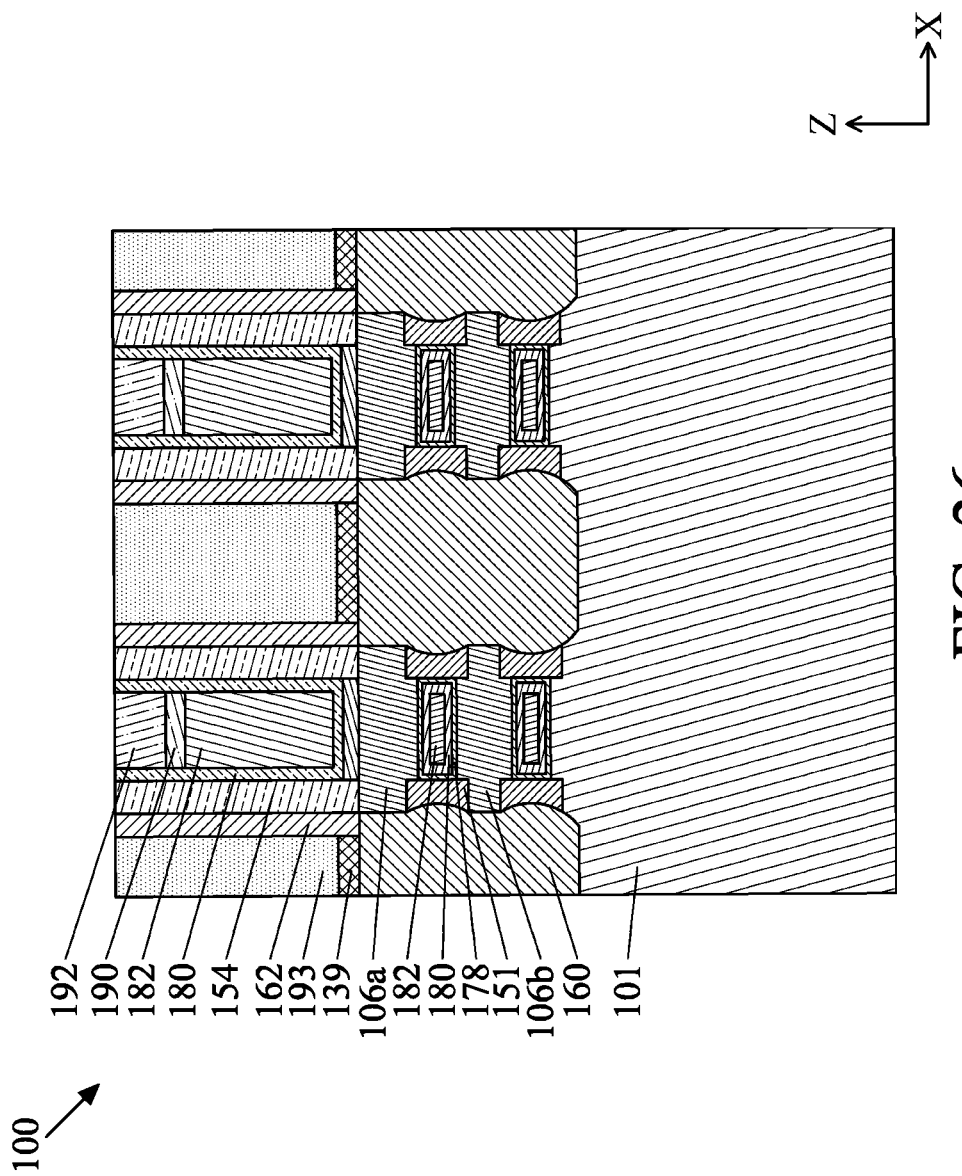
FIG. 26 is a cross-sectional side view of one of various stages of manufacturing the semiconductor device structure of FIG. 19C, in accordance with some embodiments.

FIG. 26 is a cross-sectional side view of one of various stages of manufacturing the semiconductor device structure 100 of FIG. 19C, in accordance with some embodiments. In FIG. 26, S/D contacts 193 are formed through the ILD layer 164 (FIG. 19C) and the CESL 162 (FIG. 19C) to be in contact with the epitaxial S/D features 160 via a silicide layer 139. The S/D contacts 193 may be made of a material including one or more of Ru, Mo, Co, Ni. W, Ti, Ta, Cu, Al, TiN and TaN, any suitable metal material, and can be formed by CVD, ALD, electro-plating, or other suitable deposition technique. The silicide layers 139 may be made of a metal or metal alloy silicide, and the metal includes a noble metal, a refractory metal, a rare earth metal, alloys thereof, or combinations thereof. For n-channel FETs, the silicide layers 139 may be made of a material including one or more of TiSi, CrSi, TaSi, MoSi, ZrSi, HfSi, ScSi, Ysi, HoSi, TbSI, GdSi, LuSi, DySi, ErSi, YbSi, or combinations thereof. For p-channel FETs, the silicide layers 139 may be made of a material including one or more of NiSi, CoSi, MnSi, Wsi, FeSi, RhSi, PdSi, RuSi, PtSi, IrSi, OsSi, or combinations thereof. Once the S/D contracts 193 are formed, a planarization process, such as CMP, is performed to expose the top surface of the second dielectric material 192 (or the top surface of the SAC layer if used).

Figure 27:
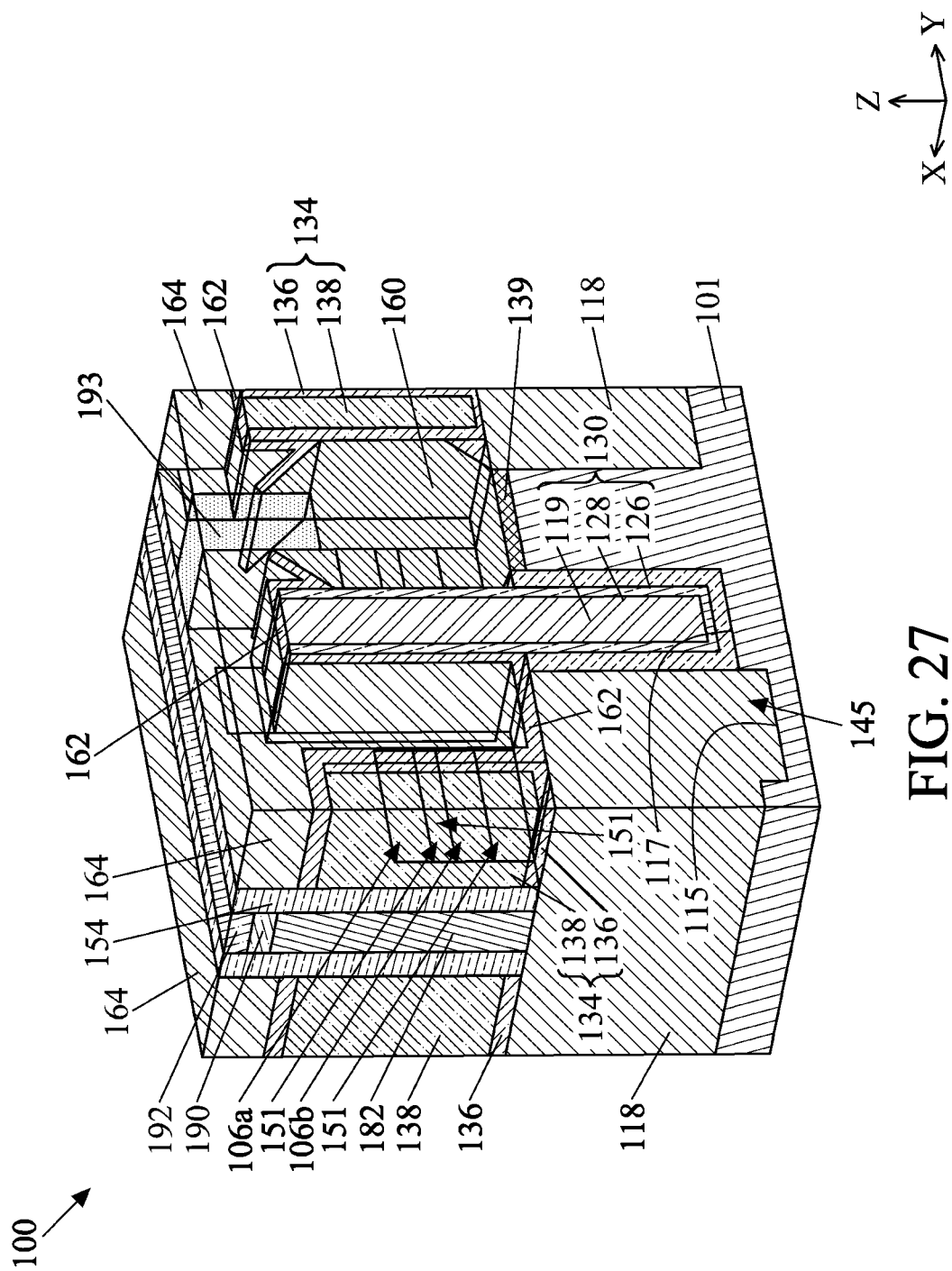
FIG. 27 is a perspective view of one of various stages of manufacturing the semiconductor device structure, in accordance with some embodiments.

FIG. 27 is a perspective view of one of the various stages of manufacturing the semiconductor device structure 100, in accordance with some embodiments. FIG. 27 shows the first semiconductor layers 106 (e.g., first semiconductor layers 106a, 106b) are in contact with at least the fourth dielectric layer 136, the fifth dielectric layer 138, the CESL 162, and the ILD layer 164 due to removal of the fin structures 112 (e.g., fin structure 112b) to form end cuts 145. In the embodiment shown in FIG. 27, the CESL 162 is in contact with the first dielectric layer 126, the second dielectric layer 128, the insulating material 118, the fourth dielectric layer 136, the fifth dielectric layer 138, the ILD layer 164, the spacer 154, and the first semiconductor layers 106 (e.g., first semiconductor layers 106a, 106b).

Figure 28:
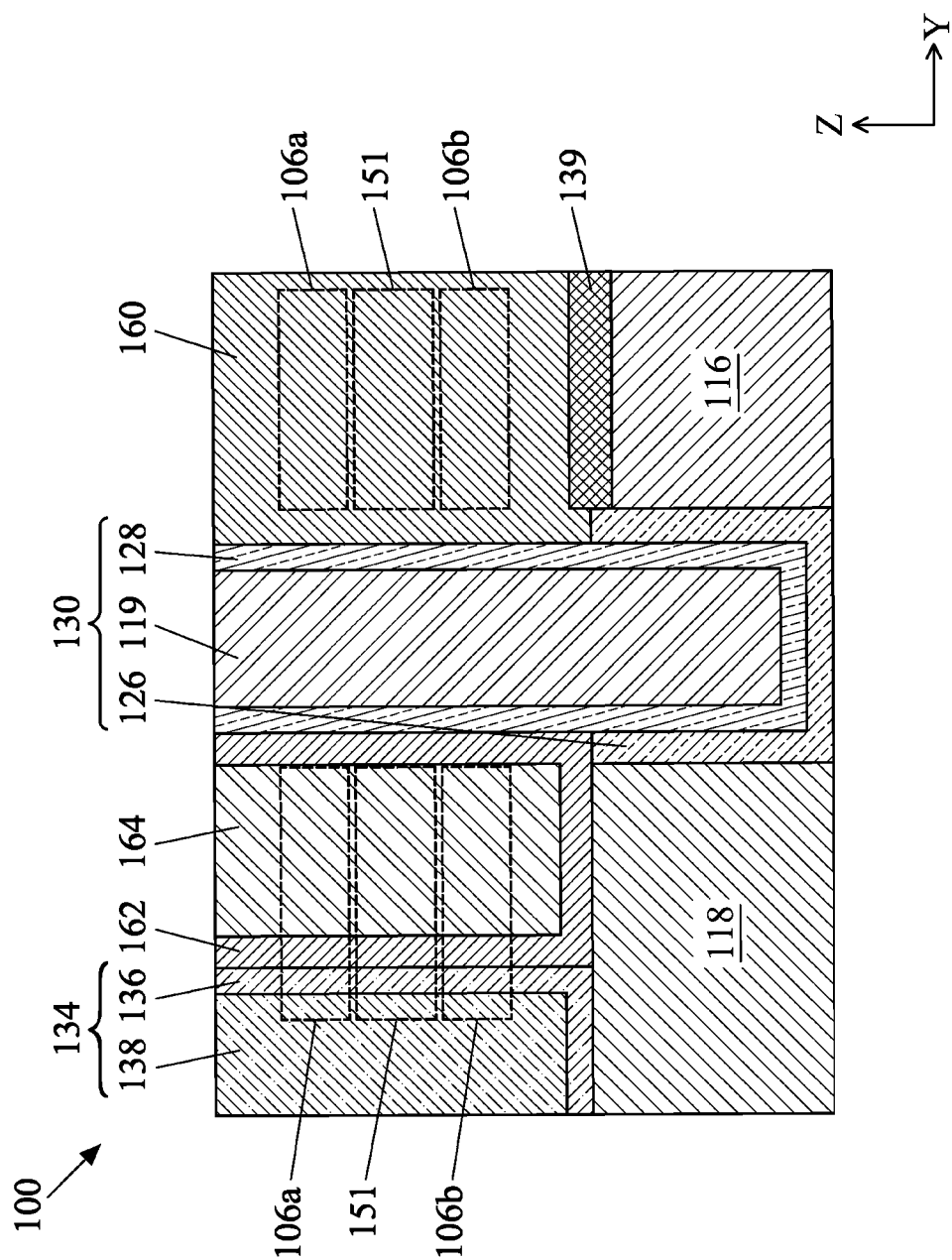
FIG. 28 is a cross-sectional side view of one of various stages of manufacturing the semiconductor device structure, in accordance with some embodiments.

FIG. 28 is a cross-sectional side view of one of various stages of manufacturing the semiconductor device structure 100, in accordance with some embodiments. FIG. 28 illustrates a portion of the semiconductor device structure 100 showing the structural relationship between the first semiconductor layers 106 and various layers exposed thereto or in contact with. Dotted lines denote the first semiconductor layers 106a, 106b hidden from view. As can be seen in the embodiment shown in FIGS. 27 and 28, at least portions of the nanosheet channels (e.g., first semiconductor layers 106a, 106b) extending from one side of the first dielectric feature 130 (e.g., the second dielectric layer 128) are in contact with four different dielectric layers, that is, the CESL 162, the ILD layer 164, the fourth dielectric layer 136, and the fifth dielectric layer 138. In addition, at least portions of the nanosheet channels (e.g., first semiconductor layers 106a, 106b) extending from opposing side of the first dielectric feature 130 are in contact with the epitaxial S/D features 160.

Figure 29:
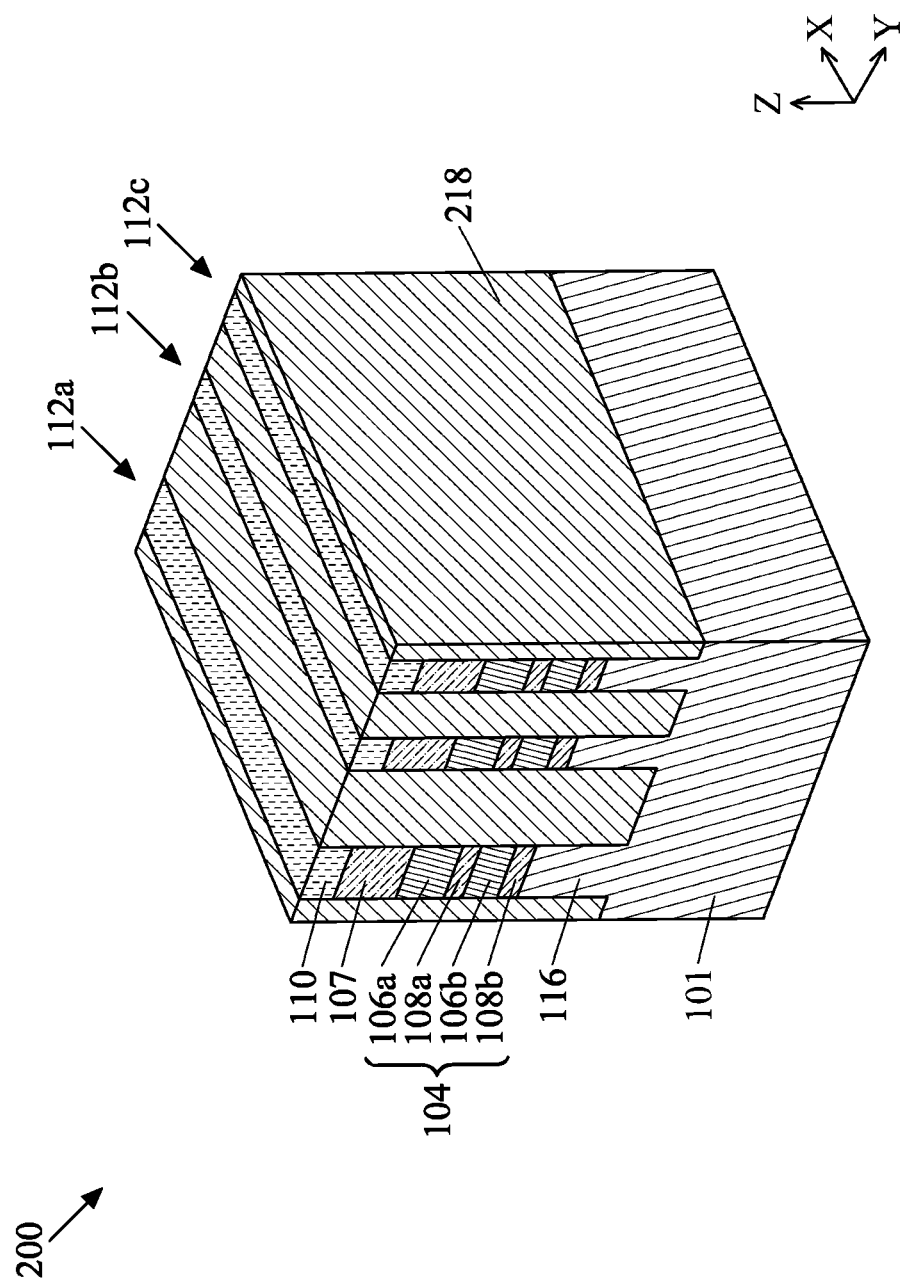
FIG. 29 is a perspective view of one of various stages of manufacturing a semiconductor device structure, in accordance with some embodiments.

FIGS. 29-50 show exemplary sequential processes for manufacturing a semiconductor device structure 200, in accordance with some alternative embodiments. It is understood that additional operations can be provided before, during, and after processes shown by FIGS. 29-50, and some of the operations described below can be replaced or eliminated, for additional embodiments of the method. The order of the operations/processes may be interchangeable. FIG. 29 is a perspective view of one of various stages of manufacturing the semiconductor device structure 200, in accordance with some embodiments. FIG. 29 illustrates a state of the semiconductor device structure 200 after the stack of semiconductor layers 104, the sacrificial layer 107, and the mask structure 110 are formed on the substrate 101 and patterned to form fin structures 112a, 112b, 112c. Next, an insulating material 218, such as the insulating material 118, is formed in the trenches 114a, 114b, 114c, 114d (FIG. 2) and over the fin structures 112a, 112b, 112c. A planarization process is then performed on the semiconductor device structure 200 to expose the tops of the fin structures 112a, 112b, 112c.

FIGS. 30C-38C are top views of the semiconductor device structure 200 of FIG. 29, which may represent a portion of the layout of active fin structures in a SRAM cell 203, such as the SRAM cell 103. In one embodiment shown in FIGS. 30C-38C, the fin structures 112b and 112c can be used to form pull-up (PU) transistors and the fin structure 112a can be used to form pull-down (PD) transistor or pass-gate (PG) transistor in a 6T SRAM cell. FIGS. 30A-38A are cross-sectional side views of various stages of manufacturing the semiconductor device structure 200 taken along line A-A of FIG. 30C, in accordance with some embodiments. FIGS. 30B-38B are cross-sectional side views of various stages of manufacturing the semiconductor device structure 200 taken along line B-B of FIG. 30C, in accordance with some embodiments.

In FIGS. 30A-30C, a resist layer 241, such as the resist layer 141, is formed on the exposed surfaces of the semiconductor device structure 200. The resist layer 241 is patterned to expose certain regions of the semiconductor device structure 200, such as regions that require an end cut 245. Like the end cut 145, the end cut 245 is formed by removing a portion of the fin structure (e.g., fin structure 112b) to isolate some of the transistors from another. The exposed portion of fin structure not covered by the resist layer 241 is removed in one or more etch processes. The etch processes remove the fin structure 112b (e.g., the stack of semiconductor layers 104 and the well portion 116) to expose a top portion of the substrate 101. In one embodiment shown in FIG. 30, the top portion of the substrate 101 is removed so that an exposed top surface 215 of the substrate 101 is at a level below or slightly below an interface 217 between the insulating material 118 and the substrate 101. The removal of the fin structure 112b forms a trench 211 at the end cut 245. The trench 211 exposes the insulating material 218 and the top surface 215 of the substrate 101.

In FIGS. 31A-31C, after formation of the end cut 245 in the fin structure 112b, the resist layer 241 is removed using any suitable removal process, such as ashing, dry etch, wet etch, or a combination thereof. Then, a dielectric fin 213 is formed in the trench 211 (FIG. 30B) and over the insulating material 218 and the mask structure 110. The dielectric fin 213 is in contact with the top surface 215 of the substrate 101 and the insulating material 218. The dielectric fin 213 may be formed of any suitable dielectric material that has different etch selectivity than the insulating material 218. In one embodiment, the dielectric fin 213 includes or is made of the same material as the second dielectric layer 128 and can be formed by the same deposition process as discussed above. Next, a planarization process, such as a CMP, is performed on the semiconductor device structure 200 until the insulating material 218 is exposed. The dielectric fin 213 is then etched back so that the top of the dielectric fin 213 is at about the same height as the sacrificial layer 107. The dielectric fin 213 has a height H1 in a range of about 20 nm to about 300 nm, which may vary depending on the original height of the fin structures 112. The etch-back process may be any suitable process, such as dry etch, wet etch, or a combination thereof. In one embodiment, the etch-back is a selective etch process that removes the dielectric fin 213 but not the insulating material 218.

In FIGS. 32A-32C, the mask structure 110 is removed and the insulating material 218 is recessed to form an isolation region (or shallow trench isolation (STI) region) 220. The recess of the insulating material 218 exposes portions of the dielectric fin 213 and the fin structures 112, such as sidewalls of the stack of semiconductor layers 104. A top surface of the insulating material 218 may be level with or slightly below a surface defined between the second semiconductor layer 108b and the well portion 116 formed from the substrate 101. The mask structure 110 and portions of the insulating material 218 may be removed using any suitable process, such as dry etch, wet etch, or a combination thereof. The trenches 114a, 114b, 114c, 114d, and a recess 221 (formed between the fin structure 112c and the dielectric fin 213) are revealed after the recess of the insulating material 218.

In FIGS. 33A-33C, a first dielectric layer 226, a second dielectric layer 228, and a third dielectric layer 219 are formed on the exposed surfaces of the semiconductor device structure 200. In one embodiment, the first, second, and third dielectric layers 226, 228, 219 are formed in the trenches 114a, 114b, 114c, 114d, and recess 221, and over the dielectric fin 213 and the fin structures 112a, 112b, 112c. The first dielectric layer 226 may include or be formed of the same material as the first dielectric layer 126. The second dielectric layer 228 may include or be formed of the same material as the second dielectric layer 128. The third dielectric layer 219 may include or be formed of the same material as the third dielectric layer 119. The first, second, and third dielectric layers 226, 228, 219 may be formed by an ALD process or any conformal deposition process. In some embodiments, the first dielectric layer 226 is optional and may be omitted. In the embodiment shown in FIGS. 33A and 33B, the first dielectric layer 226 is in contact with at least the insulating material 218, the stack of semiconductor layers 104 (e.g., first semiconductor layers 106a-b and second semiconductor layers 108a-b), the sacrificial layer 107, and the dielectric fin 213. The second and third dielectric layers 228, 219 are then sequentially formed on the first dielectric layer 226. The third dielectric layer 219 deposits in the trench 114b and recess 221 (FIGS. 32A and 32B) at a faster rate than the trenches 114a, 114c, 114d due to the small distance D2 (FIG. 2). Therefore, the third dielectric layer 219 may completely fill the trench 114b and recess 221 before the trenches 114a, 114c, 114d are filled with the third dielectric layer 219.

The first, second, and third dielectric layers 226, 228, 219 may have the same thickness as the first, second, and third dielectric layers 126, 128, 129. Likewise, exposed portions of the first dielectric layer 226 not in contact with the first semiconductor layers 106 are subsequently removed to allow a subsequent gate electrode layer to extend towards the second dielectric layer 228, which provides greater surface coverage around the first semiconductor layers 106 for a better electrical control over the nanosheet channels.

In FIGS. 34A-34C, the first, second, and third dielectric layer 226, 228, 219 are recessed using any suitable removal process, such as dry etch, wet, etch, or a combination thereof. The removal process may be selective etch processes that remove portions of the first, second, and third dielectric layer 226, 228, 219 but not the sacrificial layers 107, the first and second semiconductor layers 106, 108, the insulating material 218, and the dielectric fin 213. Because the trenches 114a, 114c, 114d are not completely filled and has a larger dimension (i.e., first distance D1, FIG. 2) in the Y direction compared to that of the trench 114b and recess 221 (FIGS. 32A and 32B), the first, second, and third dielectric layer 226, 228, 219 in the trenches 114a, 114c, 114d are etched at a faster rate than the etch rate of the first, second, and third dielectric layer 226, 228, 219 in the trench 114b and recess 221. The removal process is performed until the first, second, and third dielectric layer 226, 228, 219 in the trenches 114a, 114c, 114d are completely etched away. The first, second, and third dielectric layer 226, 228, 219 in the trench 114b (FIG. 32A) and recess 221 (FIG. 32B) are referred to as a first dielectric feature 230. The first dielectric feature 230 and the insulating material 218 isolates two adjacent fin structures (e.g., fin structures 112b, 112c).

In FIGS. 35A-35C, a cladding layer 232, such as the cladding layer 132, is formed on the sidewalls of the stack of semiconductor layers 104, the exposed surfaces of the dielectric fin 213, the sacrificial layer 107, and portions of the insulating material 218. The cladding layer 132 may be formed using the same method of forming the cladding layer 232. The cladding layer 232 may have the same thickness as the cladding layer 132.

In FIGS. 36A-36C, a second dielectric feature 234, such as the second dielectric feature 134, is formed in the trenches 114a, 114c, 114d (FIGS. 35A and 35B). The second dielectric feature 234 includes a fourth dielectric layer 236 and a fifth dielectric layer 238 formed on the fourth dielectric layer 236. The fourth dielectric layer 236 may include the same material as the fourth dielectric layer 136. The fifth dielectric layer 238 may include the same material as the fifth dielectric layer 138. The fourth dielectric layer 236 may be formed on portions of the insulating material 218, the cladding layer 232, the dielectric fin 213, the top of the first dielectric feature 230, and the sacrificial layer 107 by a conformal process, such as an ALD process. The fifth dielectric layer 238 is then formed on the fourth dielectric layer 236 in the trenches 114a, 114c, 114d, and over the fin structures 112a, 112b, 112c, the dielectric fin 213, the top of the first dielectric feature 230 and the sacrificial layer 107, by a flowable process, such as an FCVD process. Next, a planarization process, such as a CMP process, is performed until the sacrificial layer 107 is exposed.

The fourth dielectric layer 236 may have substantially the same thickness as the fourth dielectric layer 136, such as about 1 nm to about 12 nm. As will be discussed below with respect to FIG. 46, an end cap region 281 is formed between distal ends of the first semiconductor layers 106 and the fourth dielectric layer 236 after removal of the cladding layers 232. Thus, if the thickness of the fourth dielectric layer 136 is greater than 12 nm, the end cap region 281 may become narrow so that subsequent layers (e.g., IL 278 and HK dielectric layer 280) may immaturely block the end cap region 281 and prevent the subsequent layers (e.g., gate electrode layer 282) from getting in and forming around the first semiconductor layers 106. On the other hand, if the thickness of the fourth dielectric layer 236 is less than 1 nm, it may not provide enough protection for the fifth dielectric layer 238 during various etch processes and therefore, the purpose of the second dielectric feature 234 is compromised.

In FIGS. 37A-37C, portions of the second dielectric feature 234 are removed using the same removal process as those used to remove the second dielectric feature 134 discussed above. The removal process is performed so that the tops of the fourth and fifth dielectric layers 136, 138 are at or slightly above the top surface of the topmost first semiconductor layer 106a. Next, a high-k dielectric layer 243, such as the second high-k dielectric layer 143, is formed in each recess formed as a result of removal of the portions of the fourth and fifth dielectric layers 136, 138. The high-k dielectric layer 243 may be formed by the same method for forming the second high-k dielectric layer 143. The high-k dielectric layer 243 and the first dielectric feature 230 together may be referred to as a first dielectric structure 247. Likewise, the high-k dielectric layer 243 and the second dielectric feature 234 together may be referred to as a second dielectric structure 249.

In FIGS. 38A-38C, the sacrificial layers 107 and portions of the cladding layers 232 are removed. The removal process may be the same as the etch-back process used for removing the cladding layers 132 discussed above, and can be controlled so that the remaining cladding layers 232 are at the same level as the top surface of the topmost first semiconductor layer 106a in the stack of semiconductor layers 104. The top of the cladding layer 232 above the end cut 245 and between the dielectric fin 213 and the second dielectric structure 249 may be at a level higher than the tops of the remaining cladding layers 232 due to the narrower spacing. The removal of the sacrificial layers 107 and the cladding layer 232 exposes the top surfaces of the fin structures 112a, 112*b*, 112*c*, portions of the first and fourth dielectric layers 226, 236, and the dielectric fin 213.

Figure 39:
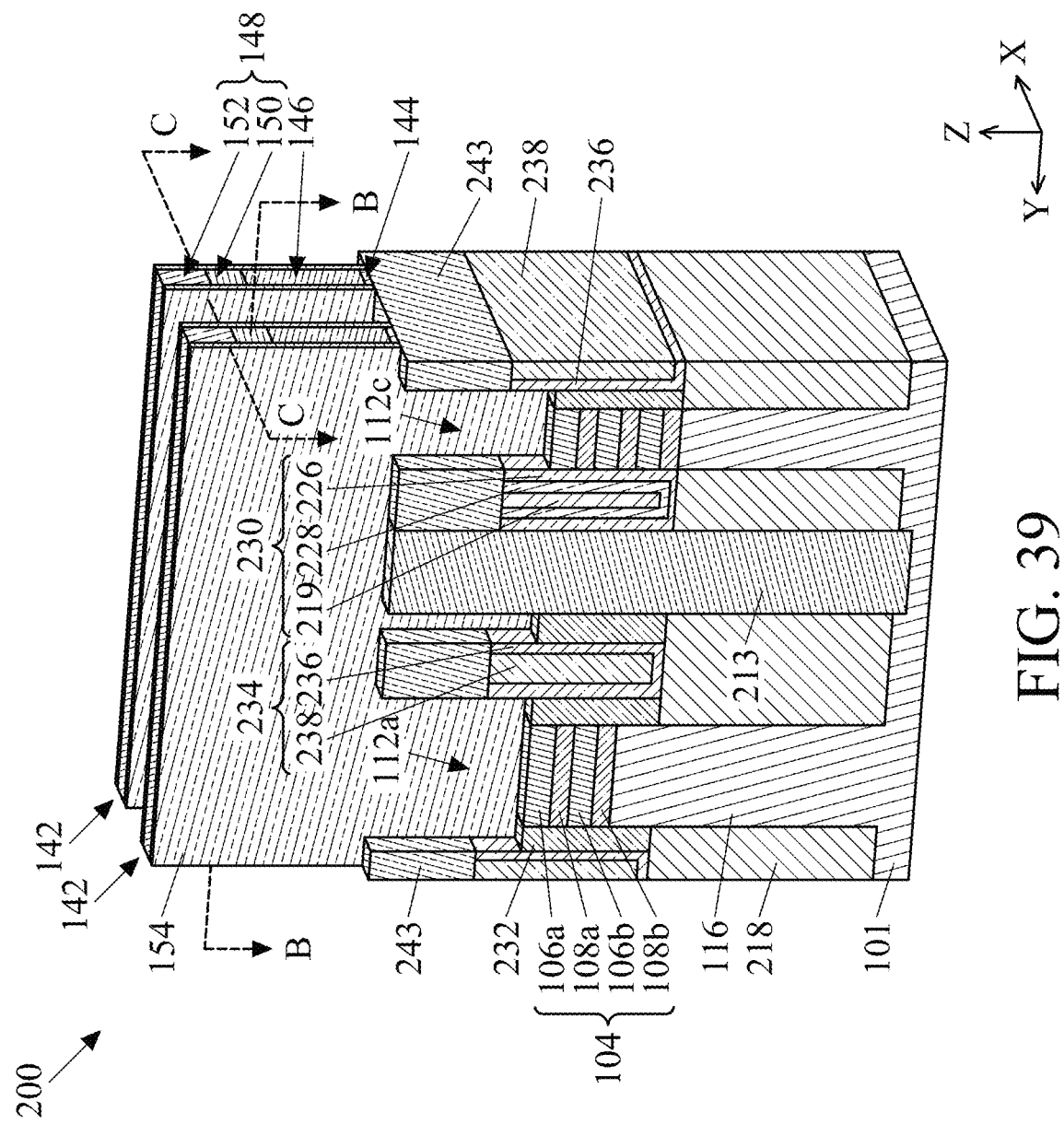
FIG. 39 is a perspective view of one of various stages of manufacturing the semiconductor device structure, in accordance with some embodiments.
Figures 40C, 40D:
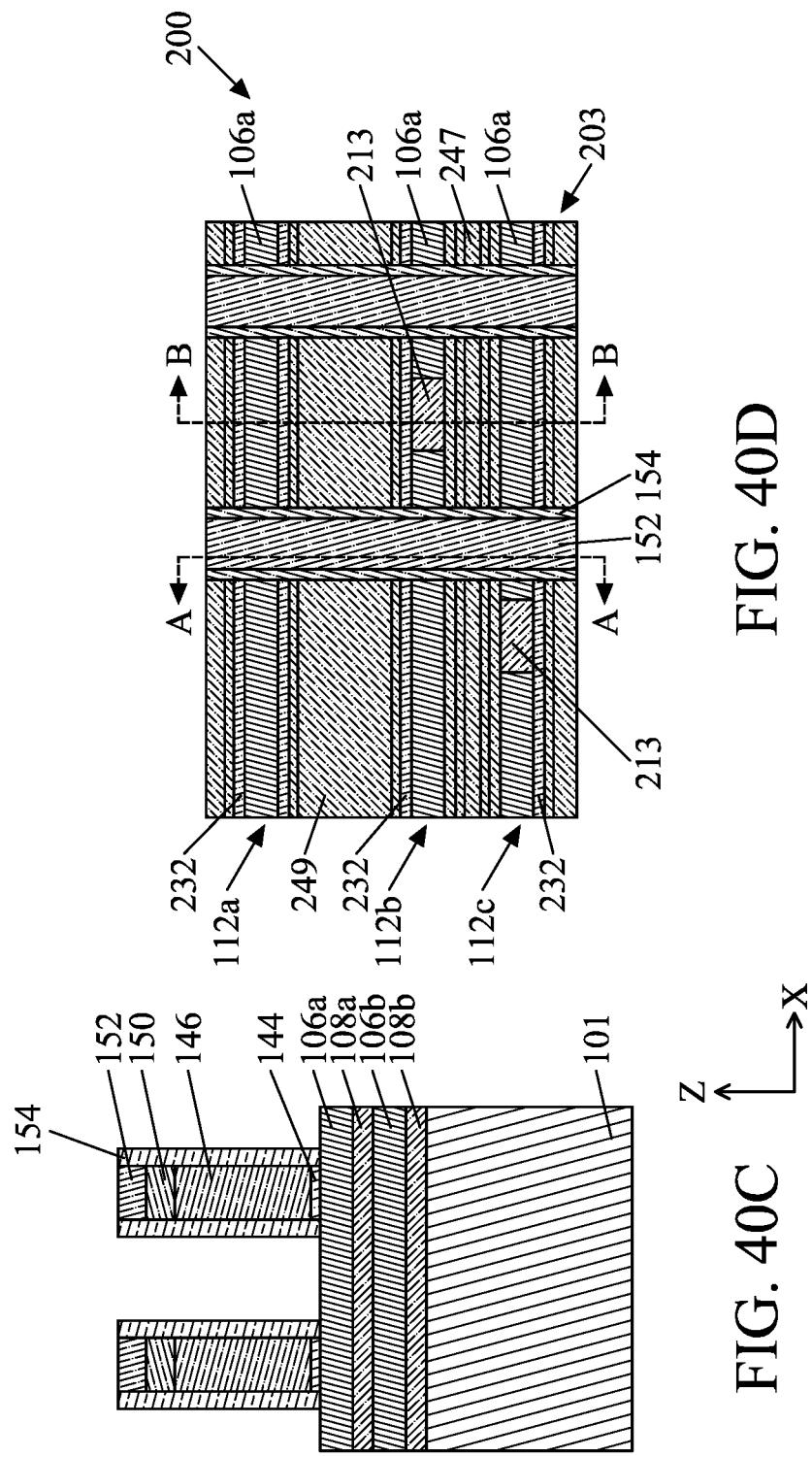

FIG. 39 is a perspective view of one of various stages of manufacturing the semiconductor device structure 200, in accordance with some embodiments. FIGS. 40D-45D are top views of the semiconductor device structure 200 of FIG. 39, which may represent a portion of the layout of fin structures in the SRAM cell 203. FIGS. 40A-45A are cross-sectional side views of various stages of manufacturing the semiconductor device structure 200 taken along line A-A of FIG. 40D and line A-A of FIG. 39, in accordance with some embodiments. FIGS. 40B-45B are cross-sectional side views of various stages of manufacturing the semiconductor device structure 200 taken along line B-B of FIG. 40D, in accordance with some embodiments. FIGS. 40C-45C are cross-sectional side views of various stages of manufacturing the semiconductor device structure 200 taken along line C-C of FIG. 39.

As shown in FIGS. 39 and 40A, one or more sacrificial gate stacks 142, as shown and discussed above with respect to FIG. 13, are formed on the semiconductor device structure 200. The one or more sacrificial gate stacks 142 may be formed using the same processes as those discussed above with respect to FIG. 13.

Figures 41C, 41D:
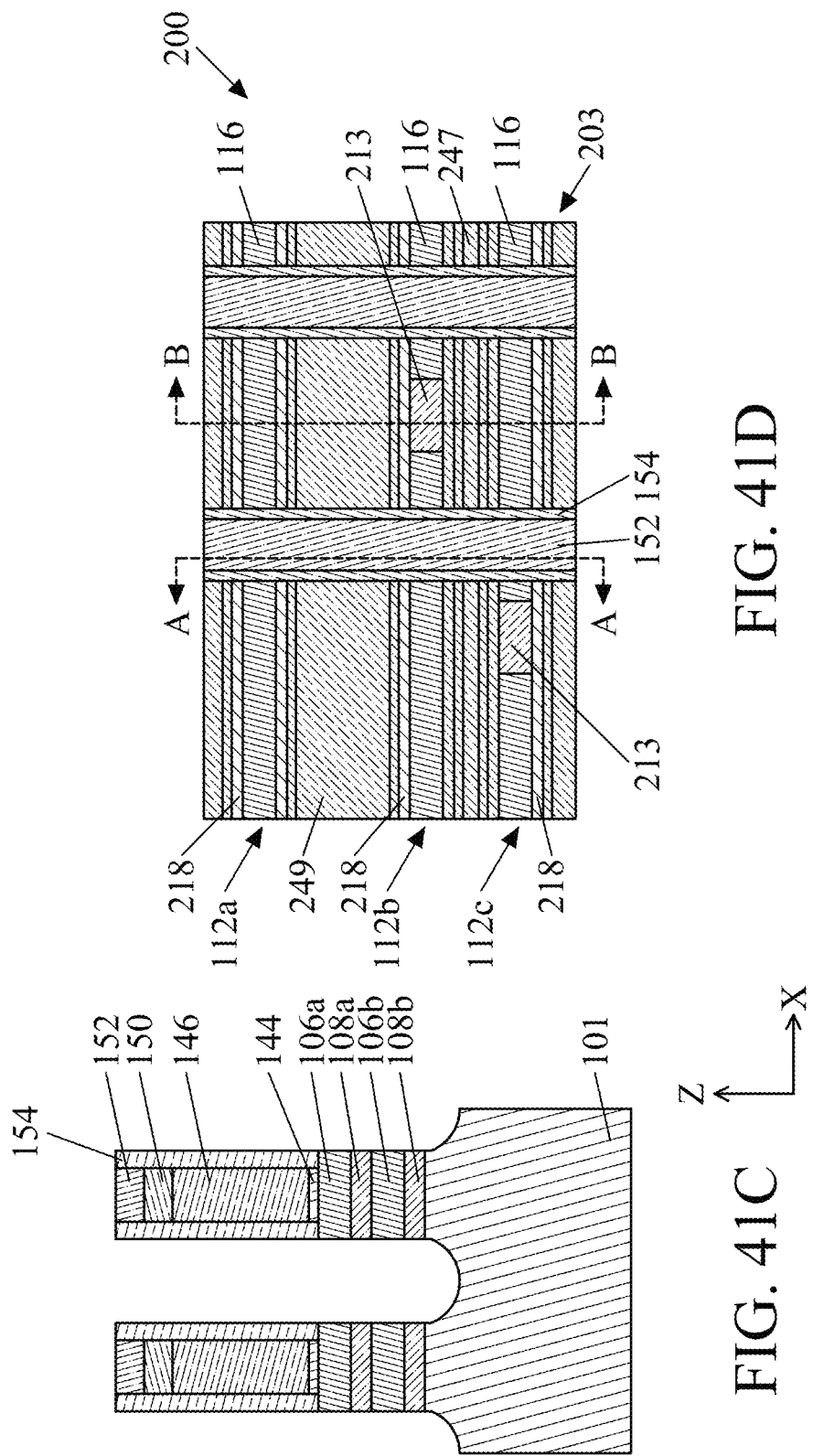
Figures 42A, 42B:
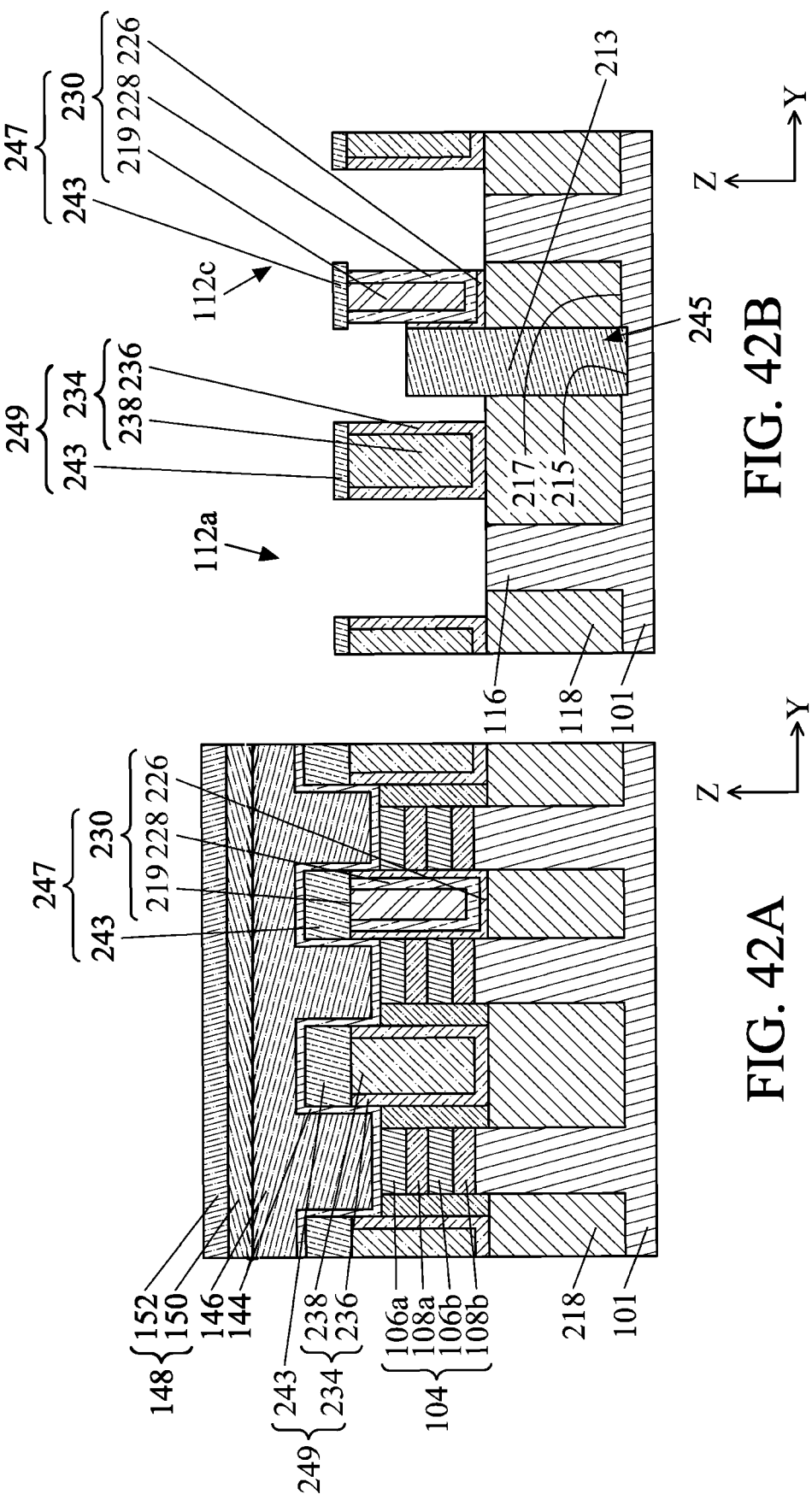
Figures 42C, 42D:
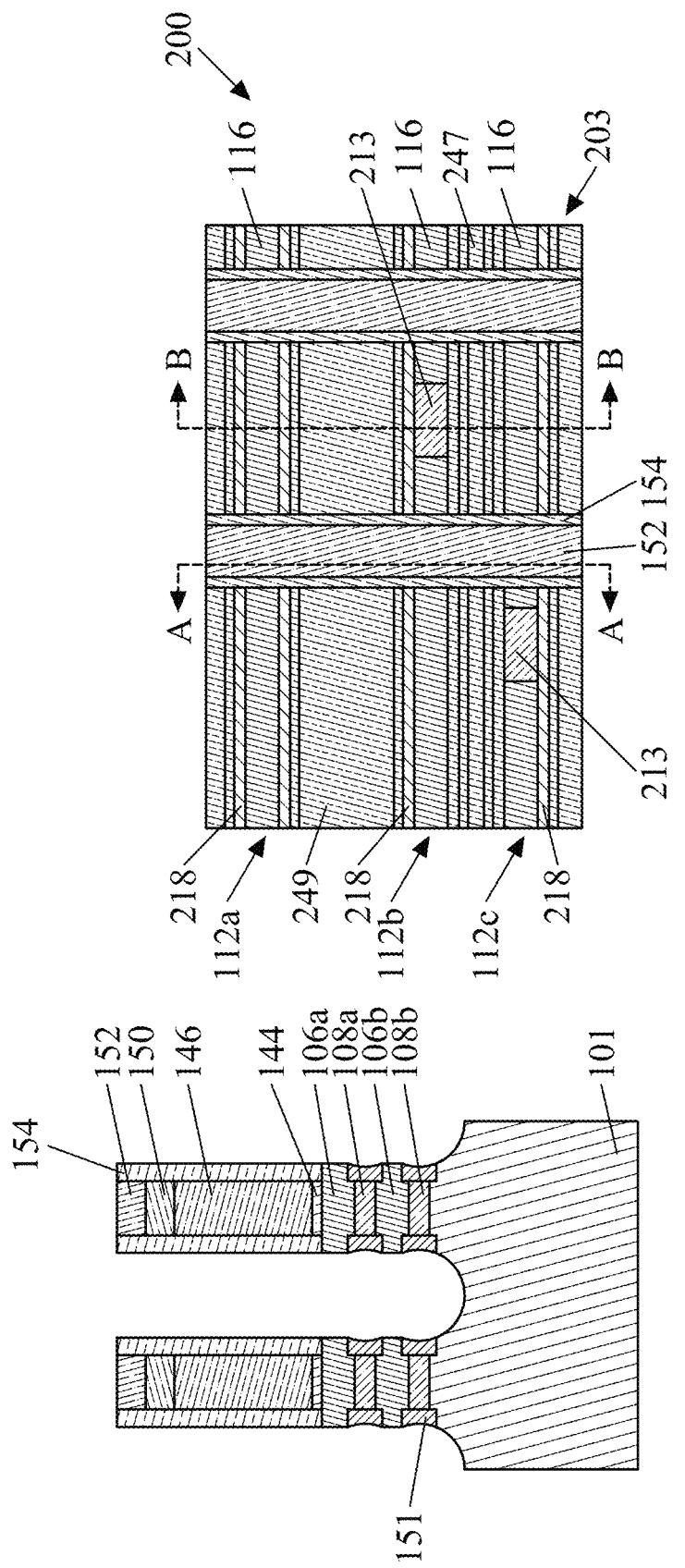
Figures 43C, 43D:
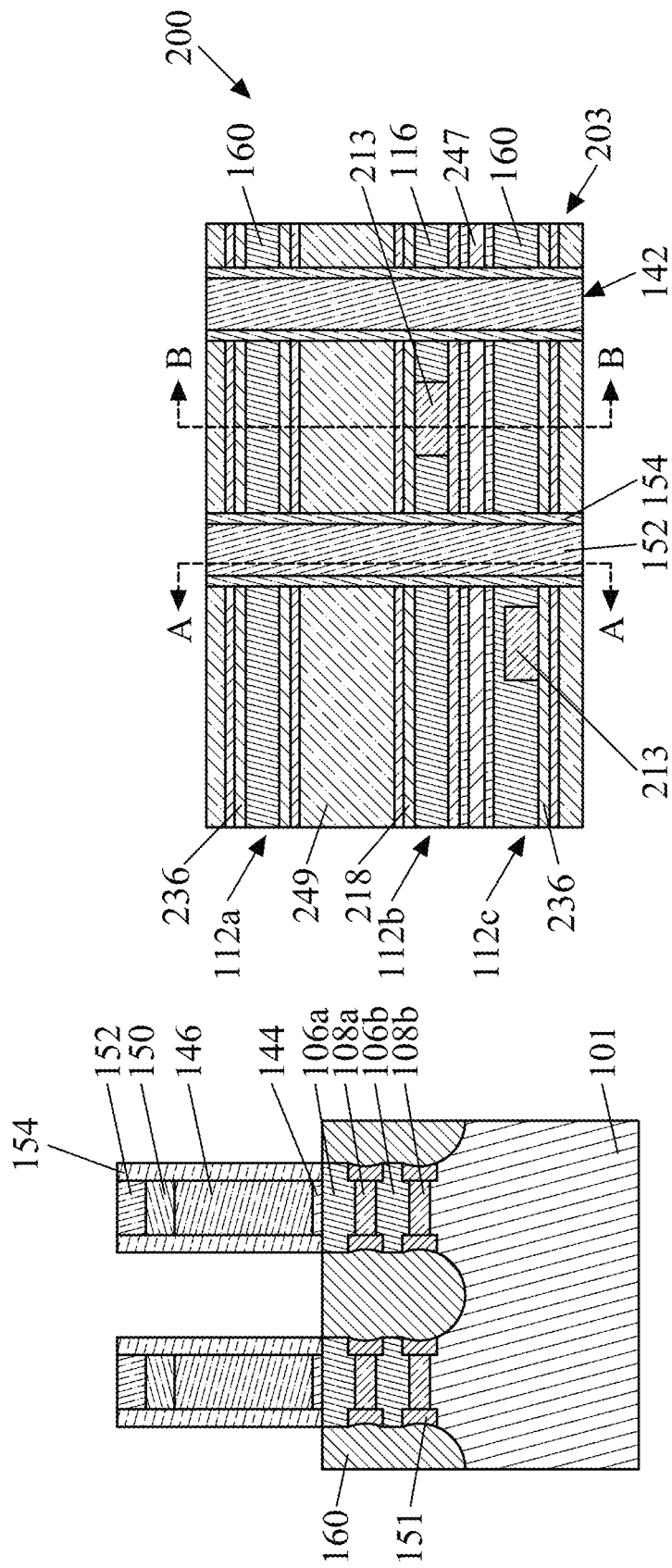
Figures 44A, 44B:
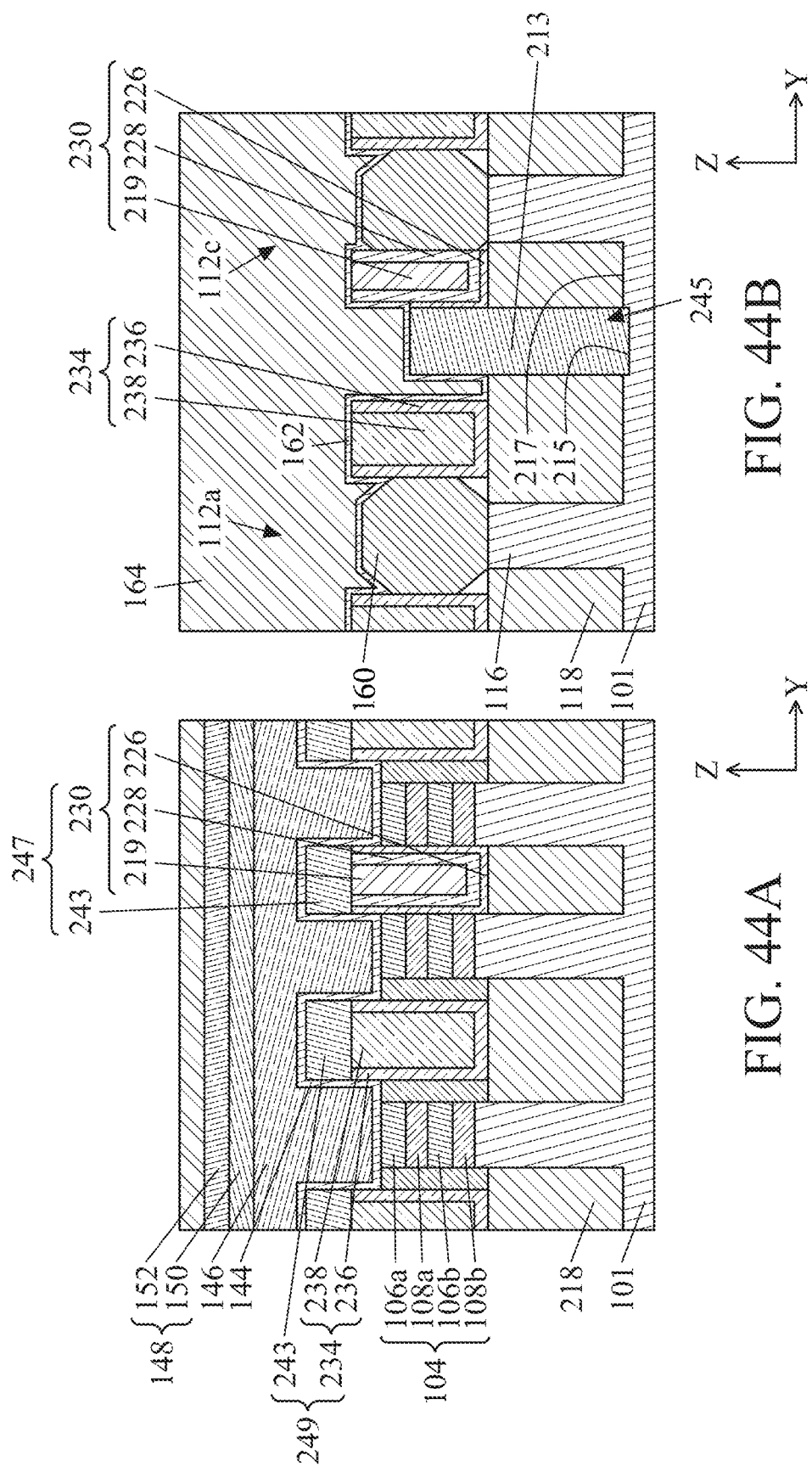
Figures 44C, 44D:
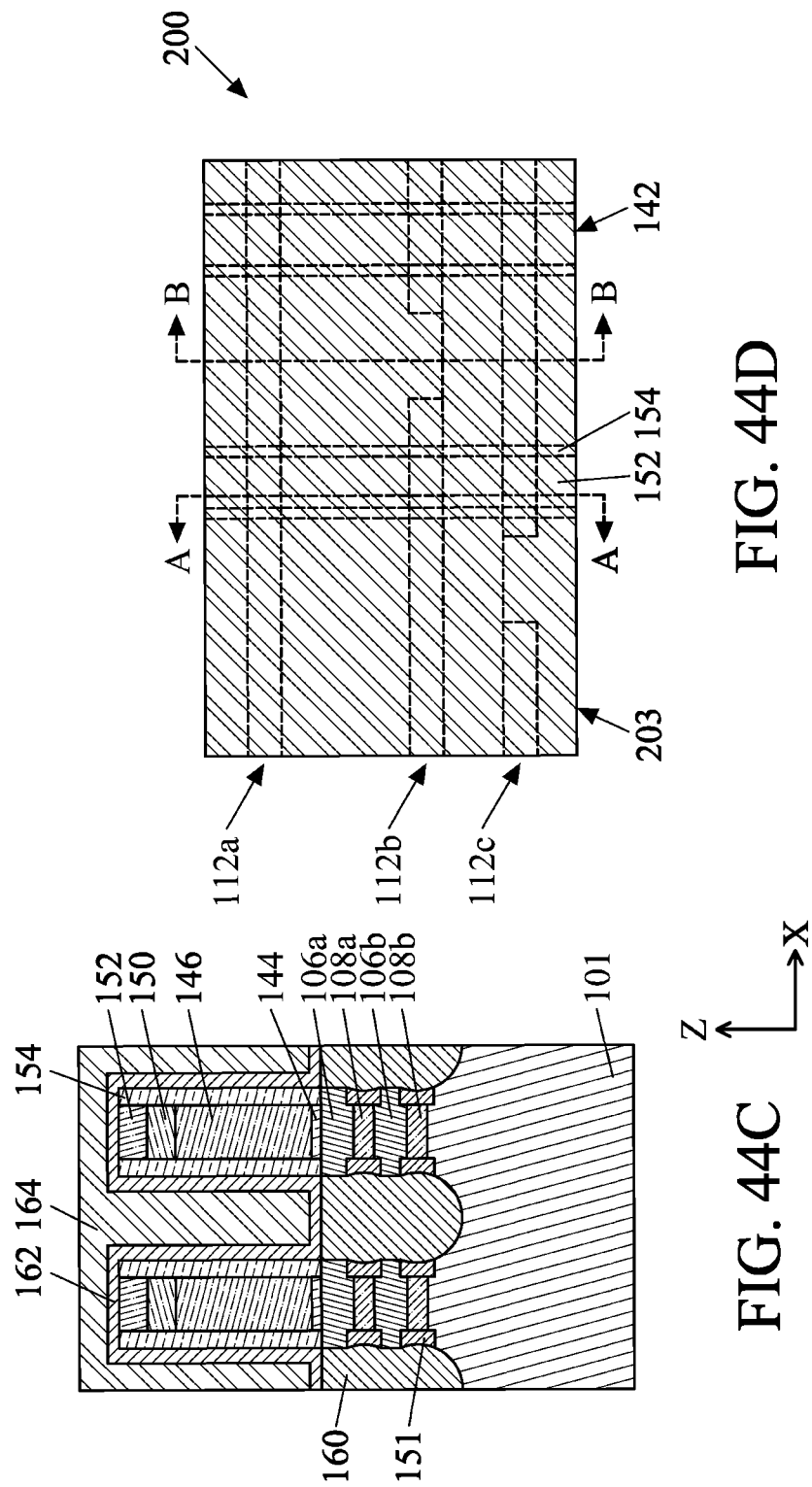

In FIGS. 41A-41D, exposed portions of the fin structures 112, exposed portions of the cladding layers 232, and exposed portions of the first and second dielectric structures 247, 249 not covered by the sacrificial gate stacks 142 and the spacers 154 are selectively recessed by using one or more suitable etch processes, in a similar fashion as those discussed above with respect to FIGS. 15A-15D. In some embodiments, portions of the stacks of semiconductor layers 104 of the fin structures 112 are removed to expose portions of the well portions 116, as shown in FIG. 41B. In some embodiments, the etchant used for removal of the stacks of the semiconductor layers 104 and the cladding layers 232 may also remove a portion of the dielectric fin 213. Therefore, the dielectric fin 213 is recessed to have a height H2 that is shorter than the height H1 (FIG. 31B). The etchant may etch the stacks of semiconductor layers 104/cladding layers 232 and the dielectric fin 213 at a rate of about 2:1 (stacks of semiconductor layers 104/cladding layers 232: dielectric fin 213). In some embodiments, the dielectric fin 213 is recessed so that a top surface 223 of the dielectric fin 213 is at or below the top of the first and second dielectric structures 247, 249. In some embodiments, the dielectric fin 213 is recessed so that a top surface 223 of the dielectric fin 213 is at or below the top of the first and second dielectric features 230, 234. In some embodiments, the dielectric fin 213 is recessed so that a top surface 223 of the dielectric fin 213 is at a level about 40% to about 75% height of the first and second dielectric features 230, 234, for example about 50% height of the first and second dielectric features 230, 234.

In FIGS. 42A-42D, edge portions of each second semiconductor layer 108 (e.g., 108*a*, 108*b*) of the stack of semiconductor layers 104 are removed and replaced with the dielectric spacers 151. The remaining second semiconductor layers 108 (e.g., 108*a*, 108*b*) are capped between the dielectric spacers 151 along the X direction. The dielectric spacers 151 may be formed in a similar fashion as those discussed above with respect to FIGS. 16A-16D.

In FIGS. 43A-43D, the epitaxial S/D features 160 are formed on the well portions 116 of the fin structures 112*a*, 112*b*, 112*c*. The epitaxial S/D features 160 may be formed in a similar fashion as those discussed above with respect to FIGS. 17A-17D. After the formation of the epitaxial S/D features 160, the high-k dielectric layers 243 are removed to reduce the overall K value of the semiconductor device structure 200. The removal of the high-k dielectric layers 243 exposes the tops of the second, third, fourth, and fifth dielectric layers 228, 219, 236, 238.

In FIGS. 44A-44D, the CESL 162 is formed on the epitaxial S/D features 160, the tops of the second, third, fourth, and fifth dielectric layers 228, 219, 236, 238, and the nitrogen-containing layer 152 of the mask structure 148. The CESL 162 is also formed on a portion of the insulating material 218 and the first dielectric layer 226 adjacent the end cut 245. Next, the ILD layer 164 is formed on the CESL 162. The CESL 162 and the ILD layer 164 may be formed in a similar fashion as those discussed above with respect to FIGS. 18A-18D.

Figures 45A, 45B:
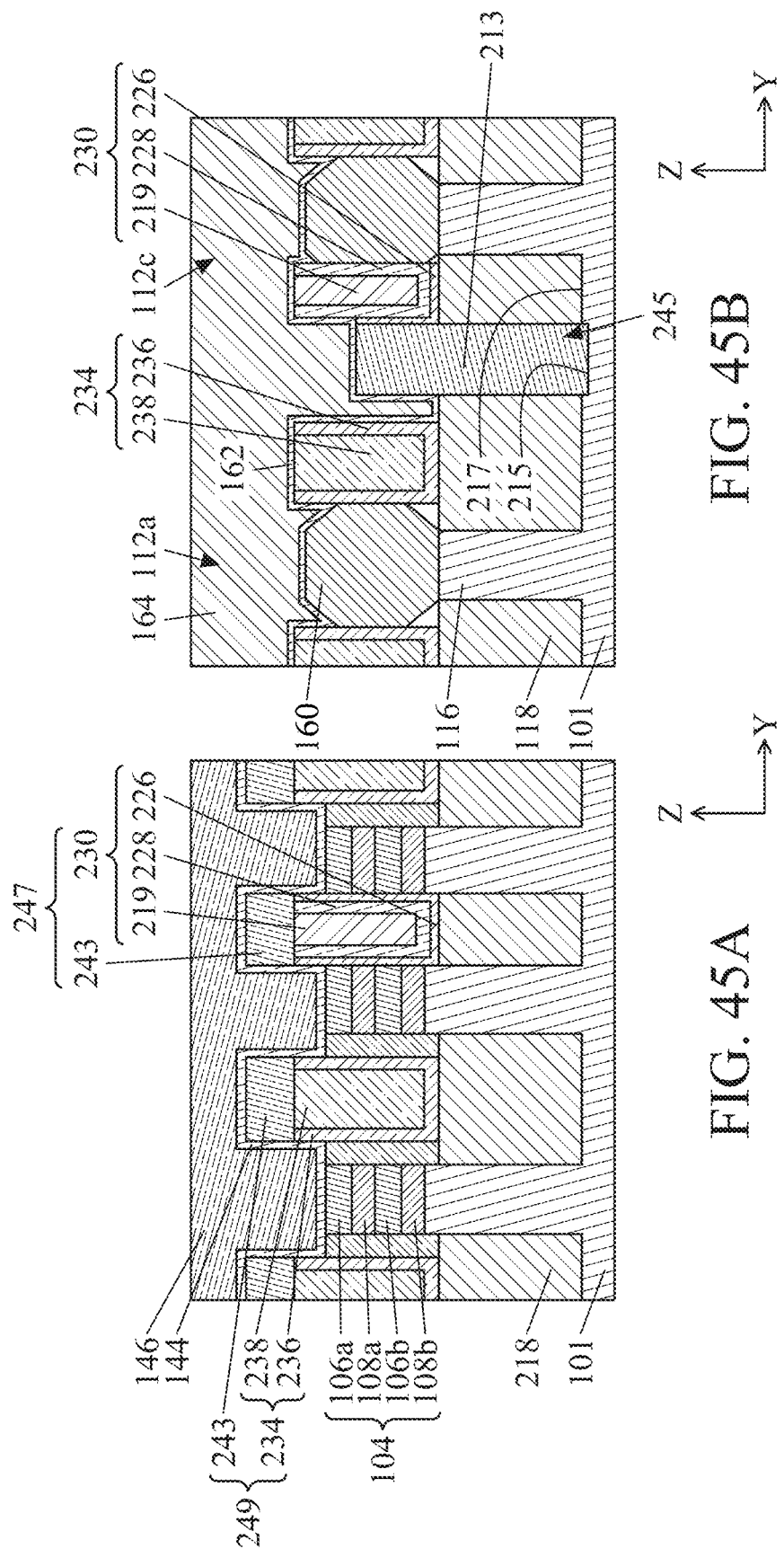

In FIGS. 45A-45D, a planarization process, such as a CMP process, is performed until the tops of the sacrificial gate electrode layer 146 and the spacers 154 are exposed. As can be seen in FIG. 45B, the epitaxial S/D features 160 of adjacent fin structures 112 (e.g., fin structures 112*a* and 112*c*) are isolated from each other by at least the dielectric fin 213 extending upwardly from the substrate 101 and the ILD layer 164, as well as the first and second dielectric features 230, 234, and the insulating material 218 and the ILD layer 164 extending below and above of the first and second dielectric features 230, 234.

Figures 45C, 45D:
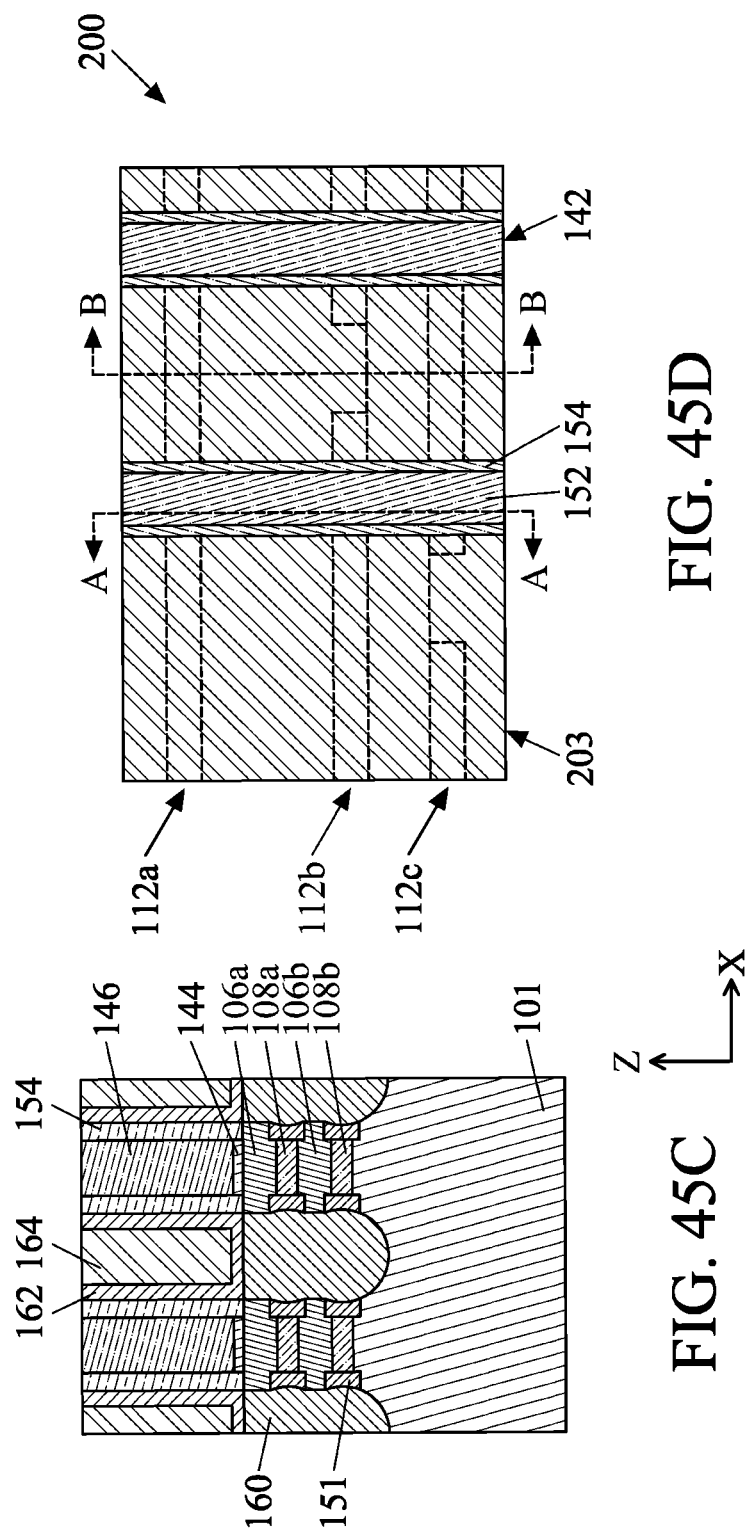
Figure 46:
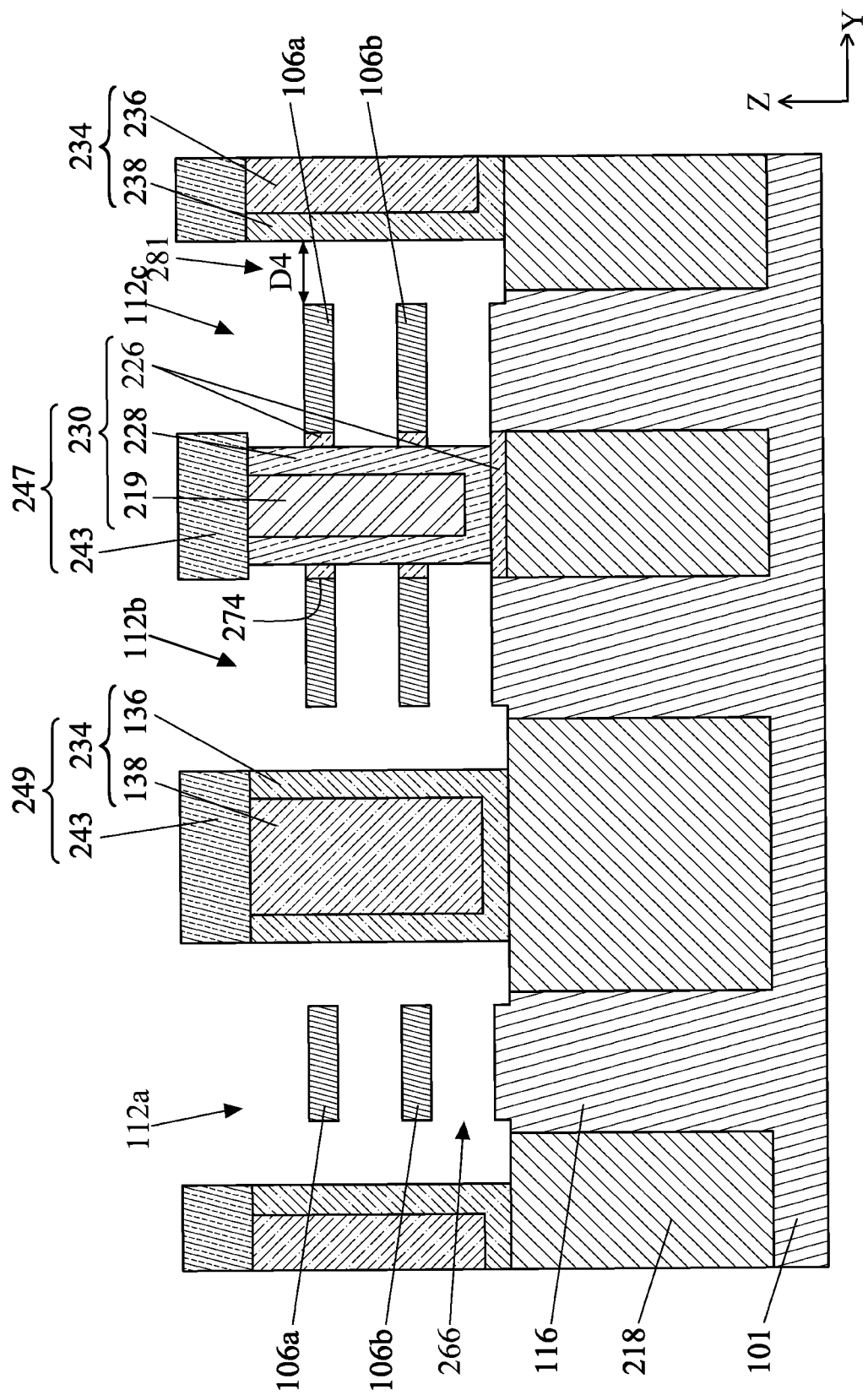
FIGS. 46-48 are cross-sectional views of various stages of manufacturing the semiconductor device structure of FIG. 45A in accordance with some embodiments.
Figure 47:
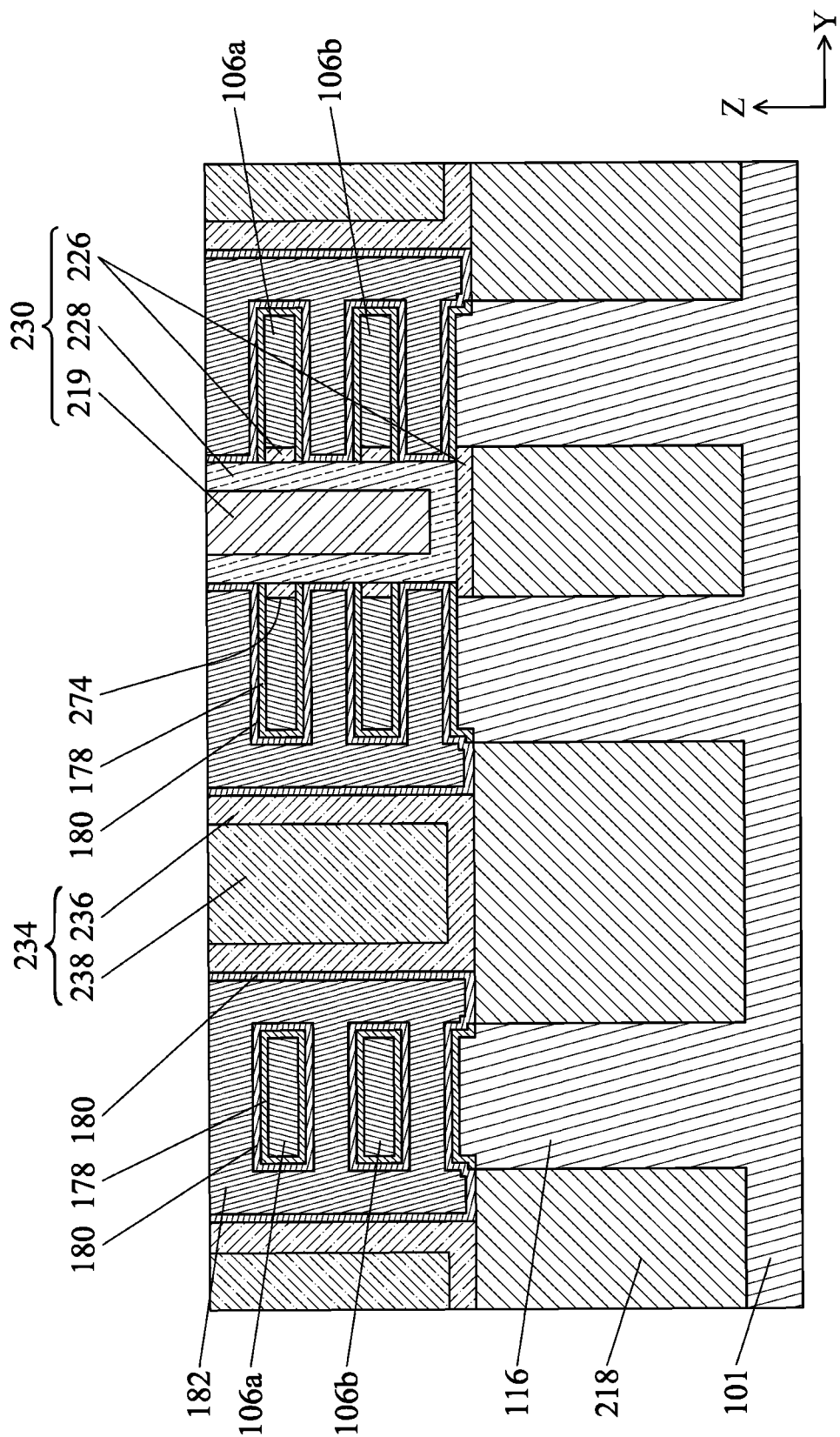
Figure 48:
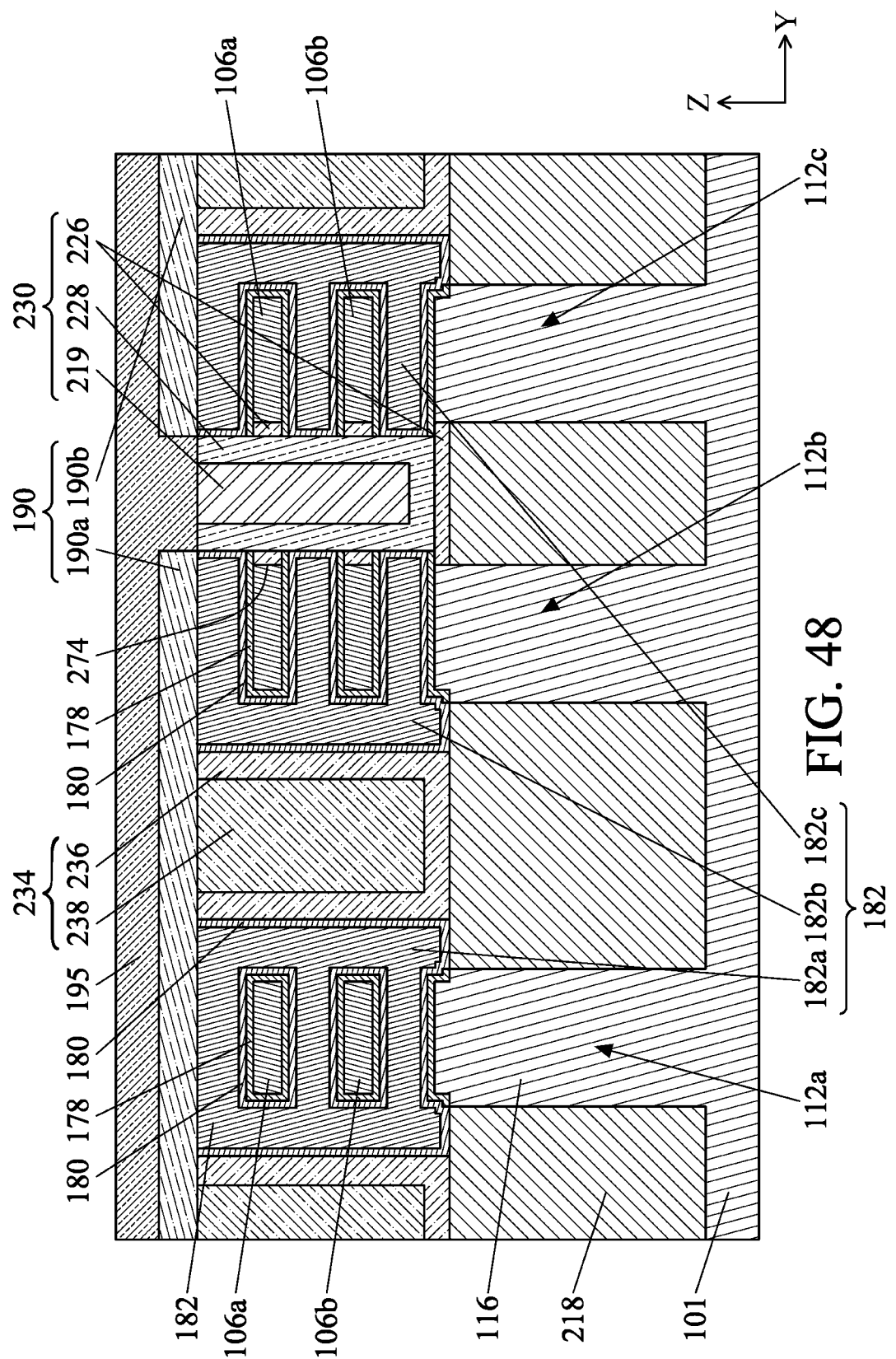

FIGS. 46-48 are cross-sectional views of one of various stages of manufacturing the semiconductor device structure 200 of FIG. 45A in accordance with some embodiments. In FIG. 46, the sacrificial gate electrode layer 146 (FIGS. 45A and 45C), the sacrificial gate dielectric layer 144 (FIGS. 45A and 45C), and the cladding layers 232 are removed, exposing the top surfaces of the cladding layers 232 and the stacks of semiconductor layers 104 (e.g., topmost first semiconductor layer 106*a*). The sacrificial gate electrode layer 146, the sacrificial gate dielectric layer 144, and the cladding layers 232 are removed in a similar fashion as those discussed above with respect to FIG. 20. Openings 266 are formed as a result of removal of the sacrificial gate electrode layer 146, the sacrificial gate dielectric layer 144, and the cladding layers 232, leaving the first semiconductor layers 106 (e.g., first semiconductor layers 106*a*, 106*b*) protruded from opposing sides of the first dielectric feature 230. Specifically, each of the first semiconductor layers 106*a*, 106*b* has a first end in contact with the first dielectric layer 226 and a second end (i.e., distal end) extending away from the first end, as shown in FIG. 46. The portions of the first semiconductor layers 106 not covered by the dielectric spacers 151 are exposed in the openings 266. Each first semiconductor layer 106*a*, 106*b* serves as a nanosheet channel of the nanosheet transistor/fork-like gate nanosheet transistor.

Likewise, upon removal of the cladding layers 232 and the second semiconductor layers 108, an end cap region 281 is formed between distal ends of the first semiconductor layers 106 (e.g., first semiconductor layers 106*a*, 106*b*) and sidewalls of the second dielectric features 234. In some embodiments, the end cap region 281 has a distance D4 along the Y direction ranging between about 2 nm to about 15 nm. The distance D4 is variable depending on the thickness of the fourth dielectric layer 236. If the spacing D4 is less than 2 nm, the subsequent IL 178 and HK dielectric layer 180 (FIG. 47) may immaturely block the end cap regions 281 at distal ends of the topmost first semiconductor layer 106*a*, which in turn prevents the subsequent layers (e.g., gate electrode layer 182) from getting in and forming around the first semiconductor layers 106*a*, 106*b*.

Next, exposed portions of the first dielectric layer 226 are removed by a removal process, such as a controlled isotropic process as those discussed above with respect to FIG. 21. The first dielectric layer 226 between the second dielectric layer 228 and the first semiconductor layers 106a, 106b remains substantially intact. Likewise, the removal of the exposed first dielectric layer 226 allows the subsequent gate electrode layer 182 to extend towards the second dielectric layer 228 and over a plane defined by an interface 274 between the first dielectric layer 226 and the first semiconductor layers 106a, 106b, thereby providing a better electrical control over the nanosheet channels (e.g., first semiconductor layers 106a, 106b).

In FIG. 47, the IL 178 is formed to surround at least three surfaces (except for the surface being in contact with the first dielectric layer 226) of the first semiconductor layers 106 (e.g., first semiconductor layers 106a, 106b). The IL 178 may also form on the exposed surfaces of the first dielectric layer 226 (e.g., first dielectric layer 126 disposed between the second dielectric layer 228 and the first semiconductor layers 106a, 106b) and the exposed surfaces of the well portion 116 of the substrate 101. The HK dielectric layer 180 is then formed on the IL 178, a portion of the insulating material 218, and on the exposed surfaces of the first and second dielectric features 230, 234 (e.g., the second dielectric layers 228, the fourth dielectric layers 236). Then, the gate electrode layer 182 is formed in the openings 266 (FIG. 46). The IL 178, the HK dielectric layer 180, and the gate electrode layer 182 may be formed in a similar fashion as those discussed above with respect to FIG. 22.

One or more metal gate etching back (MGEB) processes are then performed, in a similar fashion as those discussed above with respect to FIG. 23, so that the gate electrode layer 182 is recessed to the same level as the top surfaces of the first and second dielectric features 230, 234. After the MGEB processes, the high-k dielectric layers 243 and a portion of the HK dielectric layer 180 formed thereon are removed. The top surfaces of the gate electrode layer 182, the HK dielectric layer 180, and the first and second dielectric features 230, 234 are substantially co-planar after the removal process. After removal of the high-k dielectric layers 243, adjacent gate electrode layers 182 are separated, or cut-off, by the first and second dielectric features 230, 234, as shown in FIG. 47.

In FIG. 48, the conductive layer 190 and the self-aligned dielectric structure 195 are formed on the exposed surfaces of the gate electrode layer 182, the first and second dielectric features 230, 234, the ILD layers 164 (FIG. 45C), the CESLs 162 (FIG. 45C), the spacers 154 (FIG. 45C), and the HK dielectric layers 180. The conductive layer 190 includes conductive layers 190a, 190b which are isolated from each other by the self-aligned dielectric structure 195. The conductive layer 190 and the self-aligned dielectric structure 195 may be formed in a similar fashion as those discussed above with respect to FIGS. 24 and 25. The conductive layer 190 may provide a signal, such as an electrical current, to the gate electrode layer 182 located therebelow.

In the embodiment shown in FIG. 48, a signal, such as an electrical current, can be provided to adjacent gate electrode layers 182 (e.g., gate electrode layers 182a, 182b) via the conductive layer 190. In such a case, a single signal sent to the gate electrode layer 182a or gate electrode layer 182b may control both nanosheet channel regions. Since the first dielectric feature 230 also isolates the gate electrode layer 182b from the gate electrode layer 182c, a signal sent to the conductive layer 190a and the gate electrode layers 182a, 182b in contact with the conductive layer 190a is not provided to or shared with the conductive layer 190b and the gate electrode layer 182c on the other side of the self-aligned dielectric structure 195.

As can be seen in FIG. 48, the dielectric structure 195, and the proposed first dielectric feature 230 extending all the way to the well portions 116 of the substrate 101 forms a continuous dielectric wall that can effectively isolate two immediately adjacent fin structures 112 (e.g., fin structures 112b, 112c). In addition, the upper parts (e.g., the first semiconductor layers 106a, 106b) of the fin structures 112a and 112b are isolated by the second dielectric feature 234, while the lower part (e.g., well portion 116 of the substrate 101) of the fin structures 112a and 112b are isolated by the insulating material 218 (e.g., STI region). The use of the proposed first dielectric feature 230, the second dielectric feature 234, and the insulating material 218 forms continuous dielectric wall between two adjacent fin structures 112 and can eliminate any source for electrical shorts when comparing to the conventional device structure using the discontinuous dielectric feature, as discussed above with respect to FIG. 25).

Figure 49:
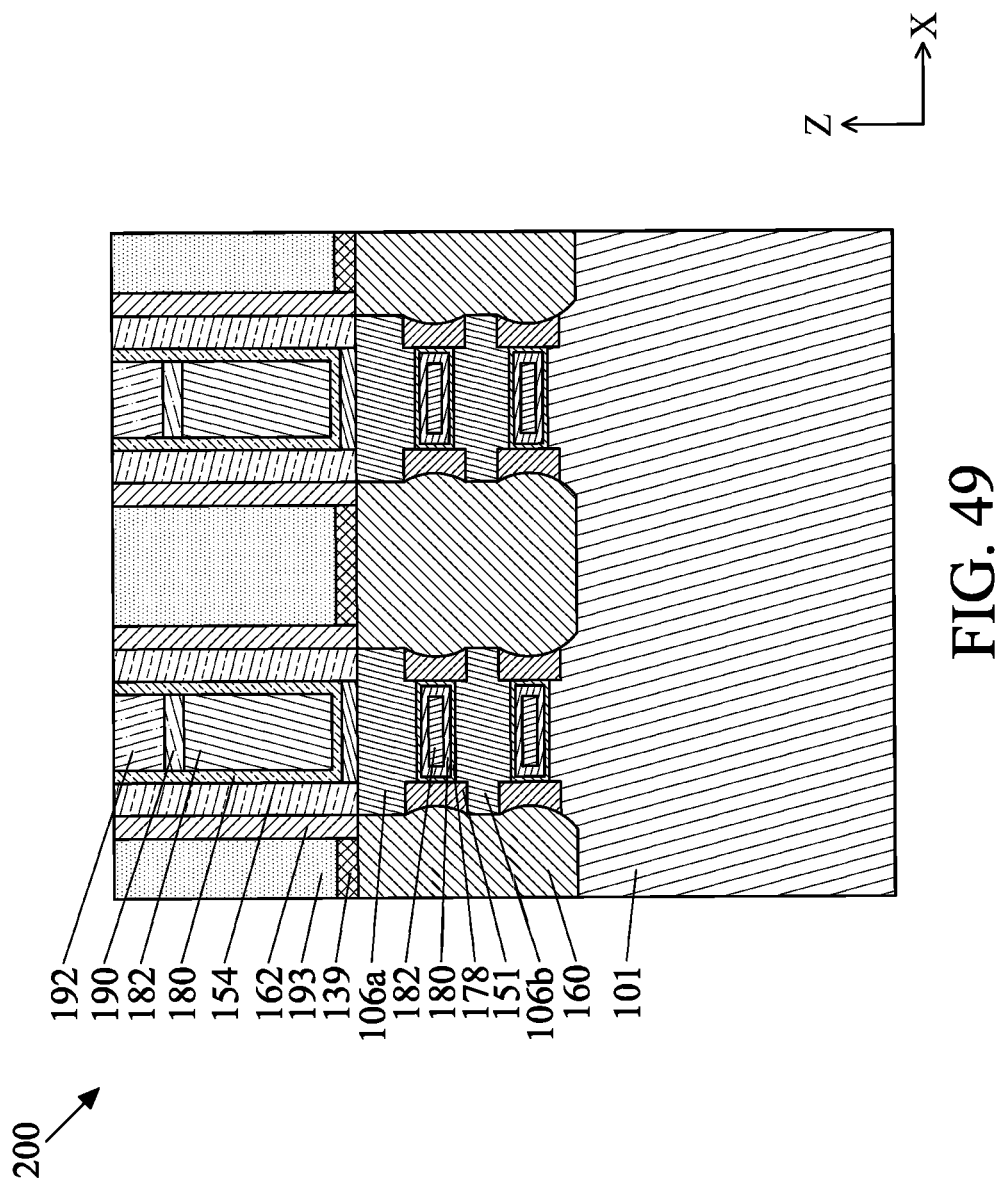
FIG. 49 is a cross-sectional side view of one of various stages of manufacturing the semiconductor device structure of FIG. 45C, in accordance with some embodiments.

FIG. 49 is a cross-sectional side view of one of various stages of manufacturing the semiconductor device structure 200 of FIG. 45C, in accordance with some embodiments. In FIG. 49, S/D contacts 193 are formed through the ILD layer 164 (FIG. 45C) and the CESL 162 (FIG. 45C) and in contact with the epitaxial S/D features 160 via a silicide layer 139. The S/D contacts 193 and the silicide layer 139 may be formed in a similar fashion as those discussed above with respect to FIG. 26. Once the S/D contracts 193 are formed, a planarization process is performed to expose the top surface of the second dielectric material 192 (or the top surface of the SAC layer if used).

Figure 50:
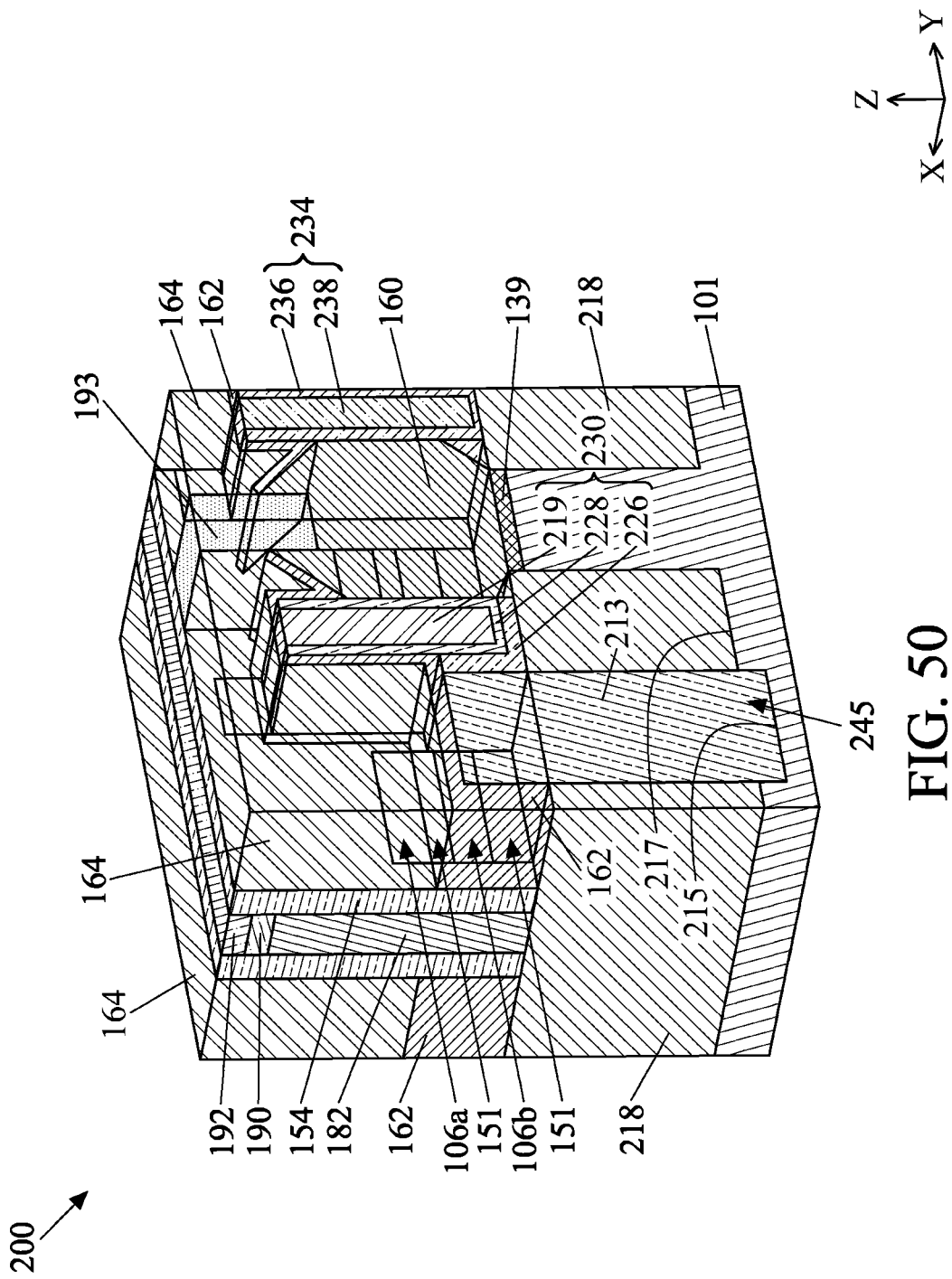
FIG. 50 is a perspective view of one of various stages of manufacturing the semiconductor device structure, in accordance with some embodiments.

FIG. 50 is a perspective view of one of various stages of manufacturing the semiconductor device structure 200, in accordance with some embodiments. FIG. 50 shows that the dielectric fin 213 is provided at the end cut 245 formed as a result of removal of the fin structure 112 (e.g., fin structure 112b in FIG. 29). The dielectric fin 213 is formed to have a height that is at a level between the two adjacent first semiconductor layers 106a, 106b. Therefore, upper portions of the first semiconductor layers 106 (e.g., first semiconductor layers 106a) are in contact with the ILD layer 164, while lower portions of the first semiconductor layers 106 (e.g., first semiconductor layers 106b) are in contact with the dielectric fin 213.

Figure 51:
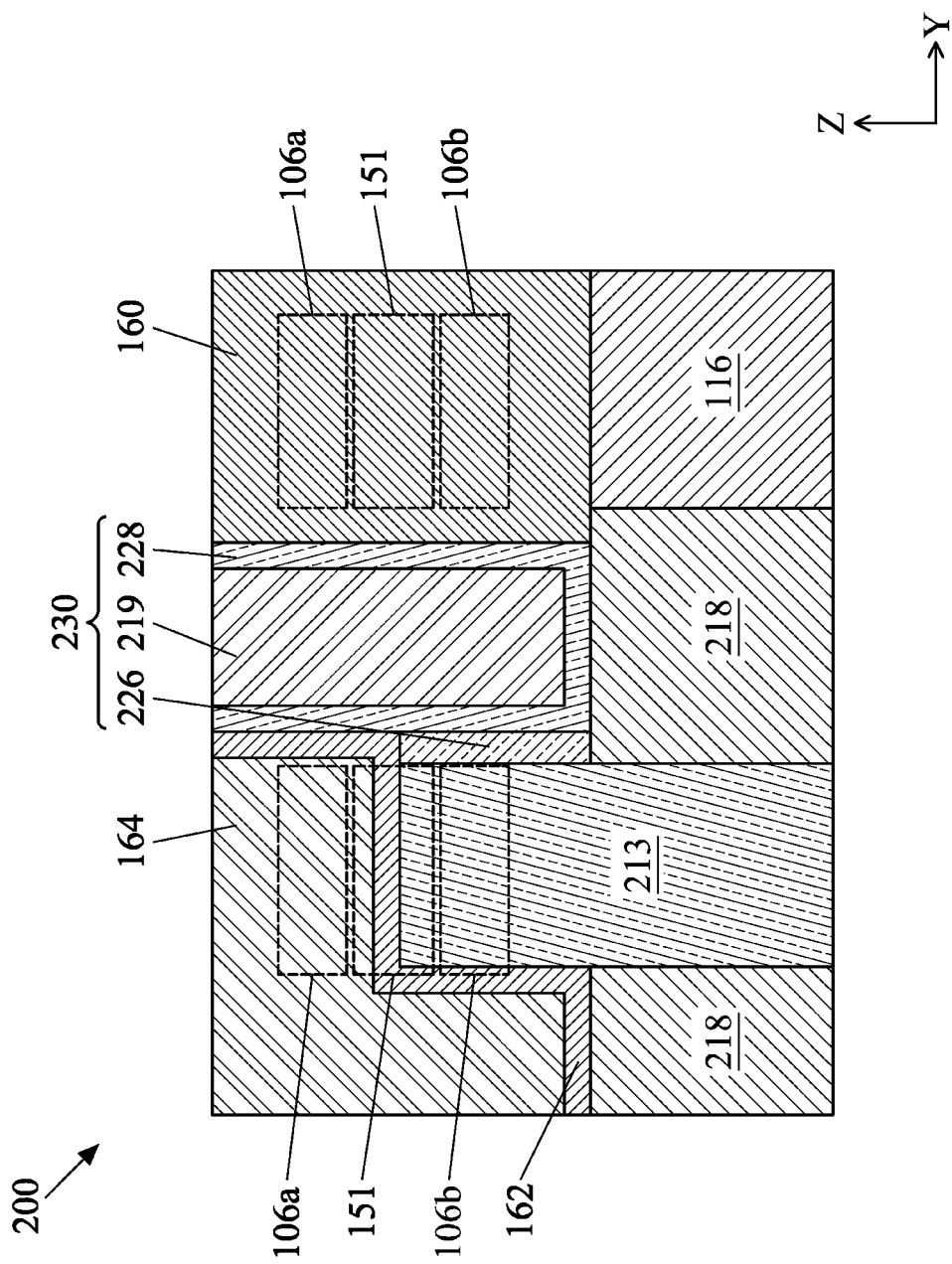
FIG. 51 is a cross-sectional side view of one of various stages of manufacturing the semiconductor device structure, in accordance with some embodiments.

FIG. 51 is a cross-sectional side view of one of various stages of manufacturing the semiconductor device structure 200, in accordance with some embodiments. FIG. 51 illustrates a portion of the semiconductor device structure 200 showing the structural relationship between the first semiconductor layers 106 (represented by dotted lines) and various layers exposed thereto or in contact with. In one embodiment shown in FIG. 51, at least portions of the nanosheet channels (e.g., first semiconductor layer 106a) extending from one side of the first dielectric feature 230 are in contact with the ILD layer 164, at least portions of the nanosheet channels (e.g., first semiconductor layer 106b) extending from one side of the first dielectric feature 230 are in contact with the dielectric fin 213. In other words, semiconductor layers in the stack of semiconductor layers 104 are in contact with different dielectric layers. In addition, at least portions of the nanosheet channels (e.g., first semiconductor layers 106a, 106b) extending from opposing side of the first dielectric feature 230 are in contact with the epitaxial S/D features 160.

It is understood that the semiconductor device structures 100, 200 may undergo further complementary metal oxide semiconductor (CMOS) and/or back-end-of-line (BEOL) processes to form various features such as transistors, contacts/vias, interconnect metal layers, dielectric layers, passivation layers, etc. The semiconductor device structures 100, 200 may also include backside contacts (not shown) on the backside of the substrate 101 by flipping over the semiconductor device structure 100, removing the substrate 101, and selectively connecting source or drain feature/terminal of the epitaxial S/D features 160 to a backside power rail (e.g., positive voltage VDD or negative voltage VSS) through the backside contacts. Depending on the application, the source or drain feature/terminal of the epitaxial S/D features 160 and the gate electrode layers 182 may be connected to a frontside power source.

Various embodiments described herein offer multiple advantages over the state-of-art technology. According to embodiments of the present disclosure, at least one dielectric feature having a structure of low-k/oxide/low-k is formed on a substrate and continuously extended between two active fin structures before making end cuts on the fin structures. The dielectric feature can be one dielectric structure having its bottom in contact with the substrate. Alternatively, the dielectric feature can include an upper portion formed of the dielectric structure and a lower portion formed of an insulating material (e.g., STI region). Additionally or alternatively, the dielectric feature can be formed by filling an end cut of active fin structures with a dielectric fin. In any case, the dielectric feature avoids electrical shorts at transistors, such as two adjacent pull-up transistors in the SRAM cell. In addition, portions of a high-k dielectric layer on the dielectric feature are laterally recessed to allow a subsequent gate electrode layer to form around the nanosheet channels with greater surface coverage. As a result, a better electrical control over the nanosheet channels is achieved.

An embodiment is a semiconductor device structure. The structure includes a first dielectric feature extending along a first direction, the first dielectric feature having a first side and a second side opposing the first side. The structure includes a first semiconductor layer disposed adjacent the first side of the first dielectric feature, the first semiconductor layer extending along a second direction perpendicular to the first direction. The structure includes a CESL in contact with the first dielectric feature and a portion of the first semiconductor layer, an ILD layer in contact with the CESL and a portion of the first semiconductor layer. The structure further includes a second dielectric feature extending along the first direction, the second dielectric feature comprising a first dielectric layer in contact with the CESL and a portion of the first semiconductor layer, and a second dielectric layer in contact with the first dielectric layer and a portion of the first semiconductor layer.

Another embodiment is a semiconductor device structure. The structure includes a first dielectric feature extending along a first direction, the first dielectric feature having a first side and a second side opposing the first side. The structure includes a first semiconductor layer disposed adjacent the first side of the first dielectric feature, the first semiconductor layer extending along a second direction perpendicular to the first direction. The structure includes an interlayer dielectric (ILD) layer in contact with a portion of the first semiconductor layer, a second semiconductor layer disposed adjacent the first side of the first dielectric feature, the second semiconductor layer being parallel to the first semiconductor layer. The structure further includes a dielectric fin extending along the first direction and in contact with the second semiconductor layer.

A further embodiment is a method. The method includes forming first, second, and third fin structures from a substrate, wherein the first fin structure includes a first plurality of semiconductor layers, the second fin structure includes a second plurality of semiconductor layers, and the third fin structure includes a third plurality of semiconductor layers, and wherein each of the first, second, and third plurality of semiconductor layers comprises first semiconductor layers and second semiconductor layers. The method includes forming an insulating material between the first, second, and third fin structures, forming an end cut in the second fin structure, the end cut exposing an upper portion of the substrate, forming a dielectric fin in the end cut, forming a first dielectric feature on the insulating material and between the first fin structure and the dielectric fin, forming a second dielectric feature on the insulating material and between the dielectric fin structure and the third fin structure, forming a sacrificial gate stack on a portion of the first fin structure, the second fin structure, the third fin structure, the first dielectric feature, and the second dielectric feature, removing a portion of the first fin structure, the third fin structure, and the dielectric fin not covered by the sacrificial gate stack, removing the sacrificial gate stack to expose portions of the first, second, and third fin structures, removing the second semiconductor layers of the first, second, and third plurality of semiconductor layers. The method further includes forming a gate electrode layer to surround at least three surfaces of the first semiconductor layers of the first, second, and third plurality of semiconductor layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A semiconductor device structure, comprising:
   a first dielectric feature extending along a first direction, the first dielectric feature having a first side and a second side opposing the first side;
   a first semiconductor layer disposed adjacent the first side of the first dielectric feature, the first semiconductor layer extending along a second direction perpendicular to the first direction;
   a contact etch stop layer (CESL) in direct contact with the first dielectric feature and a portion of the first semiconductor layer;
   an interlayer dielectric (ILD) layer in contact with the CESL and the portion of the first semiconductor layer; and
   a second dielectric feature extending along the first direction, the second dielectric feature comprising:
      a first dielectric layer in contact with the CESL and the portion of the first semiconductor layer; and
      a second dielectric layer in contact with the first dielectric layer and the portion of the first semiconductor layer.

2. The semiconductor device structure of claim 1, wherein the first dielectric feature further comprises:
a third dielectric layer in contact with a portion of the CESL;
a fourth dielectric layer in contact with the third dielectric layer of the first dielectric feature and the portion of the CESL; and
a fifth dielectric layer in contact with the fourth dielectric layer.

3. The semiconductor device structure of claim 2, wherein the third dielectric layer of the first dielectric feature is disposed between and in contact with a shallow trench isolation (STI) and the fourth dielectric layer of the first dielectric feature.

4. The semiconductor device structure of claim 2, further comprising:
an additional first semiconductor layer disposed adjacent the second side of the first dielectric feature, wherein the additional first semiconductor layer is extended along the second direction.

5. The semiconductor device structure of claim 4, further comprising:
a source/drain feature in contact with the additional first semiconductor layer and the fourth dielectric layer of the first dielectric feature.

6. The semiconductor device structure of claim 4, further comprising:
a gate electrode layer surrounding at least three surfaces of the first semiconductor layer.

7. The semiconductor device structure of claim 1, further comprising:
an insulating material in contact with the third dielectric layer of the first dielectric feature, the CESL, and the first dielectric layer of the second dielectric feature.

8. A semiconductor device structure, comprising:
a fin structure formed from a substrate;
a source/drain (S/D) feature disposed over a well portion of the fin structure;
a first dielectric feature in contact with the fin structure;
a shallow trench isolation having a sidewall in contact with the first dielectric feature;
a second dielectric feature disposed over and in contact with a portion of a top surface of the shallow trench isolation;
a contact etch stop layer (CESL) disposed between the first dielectric feature and the second dielectric feature, wherein the CESL is in direct contact with the portion of the top surface of the shallow trench isolation; and
an interlayer dielectric (ILD) layer disposed on the CESL.

9. The semiconductor device structure of claim 8, further comprising:
a first one of a plurality of first semiconductor layers disposed on a first side of the first dielectric feature; and
a second one of the plurality of first semiconductor layers vertically and parallelly disposed below the first one of the first semiconductor layers, wherein the first one of the first semiconductor layers and the second one of the first semiconductor layers are in contact with the second dielectric feature, the CESL, and the ILD layer.

10. The semiconductor device structure of claim 9, further comprising:
a third one of the plurality of first semiconductor layers disposed on a second side of the first dielectric feature; and
a fourth one of the plurality of first semiconductor layers vertically and parallelly disposed below the third one of the first semiconductor layers, wherein the S/D feature is in contact with the third one of the first semiconductor layers, the fourth one of the first semiconductor layers, and the first dielectric feature.

11. The semiconductor device structure of claim 8, wherein the first dielectric feature comprises:
a first dielectric layer; and
a second dielectric layer in contact with sidewalls and a bottom surface of the first dielectric layer.

12. The semiconductor device structure of claim 11, further comprising:
a third dielectric layer in contact with a portion of sidewalls of the second dielectric layer and a bottom surface of the second dielectric layer.

13. The semiconductor device structure of claim 12, wherein the CESL is in contact with the sidewall of the second dielectric layer.

14. The semiconductor device structure of claim 12, wherein the CESL is in contact with the third dielectric layer.

15. The semiconductor device structure of claim 14, wherein the S/D feature is in contact with the third dielectric layer.

16. The semiconductor device structure of claim 12, wherein the third dielectric layer is in contact with the shallow trench isolation.

17. A semiconductor device structure, comprising:
a fin structure formed from a substrate;
a shallow trench isolation formed on the substrate;
a first dielectric feature disposed between and in contact with the fin structure and the shallow trench isolation;
a contact etch stop layer (CESL) in direct contact with a top surface of the shallow trench isolation and a first sidewall of the first dielectric feature; and
an interlayer dielectric (ILD) layer disposed on the CESL.

18. The semiconductor device structure of claim 17, wherein the CELS is in further contact with a top surface of the first dielectric feature.

19. The semiconductor device structure of claim 18, further comprising:
a second dielectric feature disposed above the shallow trench isolation, wherein a sidewall of the second dielectric feature is in contact with the CESL.

20. The semiconductor device structure of claim 18, further comprising:
a source/drain (S/D) feature disposed over a well portion of the fin structure and in contact with a second sidewall of the first dielectric feature.

* * * * *